(12) United States Patent
Seo et al.

(10) Patent No.: US 11,472,901 B2
(45) Date of Patent: Oct. 18, 2022

(54) POLYMER, COATING COMPOSITION COMPRISING SAME, AND ORGANIC LIGHT-EMITTING DEVICE USING SAME

(71) Applicant: LG Chem, Ltd., Seoul (KR)

(72) Inventors: Minseob Seo, Daejeon (KR); Esder Kang, Daejeon (KR); Jaesoon Bae, Daejeon (KR); Jiyeon Shin, Daejeon (KR); Sejin Jung, Daejeon (KR); Hyungil Park, Daejeon (KR); Jaechol Lee, Daejeon (KR)

(73) Assignee: LG Chem, Ltd.

( * ) Notice: Subject to any disclaimer, the term of this patent is extended or adjusted under 35 U.S.C. 154(b) by 342 days.

(21) Appl. No.: 16/652,294

(22) PCT Filed: Jan. 21, 2019

(86) PCT No.: PCT/KR2019/000841
§ 371 (c)(1),
(2) Date: Mar. 30, 2020

(87) PCT Pub. No.: WO2019/146978
PCT Pub. Date: Aug. 1, 2019

(65) Prior Publication Data
US 2020/0239610 A1    Jul. 30, 2020

(30) Foreign Application Priority Data

Jan. 24, 2018 (KR) .................. 10-2018-0008801

(51) Int. Cl.
*H01L 51/50* (2006.01)
*C08F 212/14* (2006.01)
(Continued)

(52) U.S. Cl.
CPC .......... *C08F 212/22* (2020.02); *C08F 212/24* (2020.02); *C08F 212/26* (2020.02);
(Continued)

(58) Field of Classification Search
None
See application file for complete search history.

(56) References Cited

U.S. PATENT DOCUMENTS 9,263,680 B2 * 2/2016 Caille ................. H01L 51/0061
2007/0031699 A1 2/2007 Yamada et al.
(Continued)

FOREIGN PATENT DOCUMENTS

CN 101689613 A 3/2010
CN 102449799 A 5/2012
(Continued)

OTHER PUBLICATIONS

Cho, M. et al., "Photoreactive hole-transporting polymer bearing oxetane moieties and its application to green polymer light-emitting diodes", Synthetic Metals, Dec. 2008, pp. 785-789, vol. 158, Nos. 21-24.
(Continued)

*Primary Examiner* — Gregory D Clark
(74) *Attorney, Agent, or Firm* — Lerner, David, Littenberg, Krumholz & Mentlik, LLP

(57) ABSTRACT

The present disclosure relates to a polymer including a unit represented by Chemical Formula 1 and a unit represented by Chemical Formula 2, a coating composition including the polymer, and an organic light emitting device formed using the same.

20 Claims, 4 Drawing Sheets

(51) Int. Cl.
  *H01L 51/00* (2006.01)
  *C09K 11/06* (2006.01)
(52) U.S. Cl.
  CPC .......... *C09K 11/06* (2013.01); *H01L 51/0039* (2013.01); *C09K 2211/1433* (2013.01); *H01L 51/506* (2013.01); *H01L 51/5092* (2013.01)

(56) References Cited

U.S. PATENT DOCUMENTS

| | | |
|---|---|---|
| 2010/0201258 A1 | 8/2010 | Toba |
| 2012/0326094 A1 | 12/2012 | Huh et al. |
| 2014/0008624 A1 | 1/2014 | Niina et al. |
| 2015/0094437 A1 | 4/2015 | Caille et al. |
| 2015/0263288 A1 | 9/2015 | Funyuu et al. |
| 2016/0372676 A1 | 12/2016 | Iida et al. |
| 2017/0062724 A1 | 3/2017 | Shibata et al. |
| 2018/0230264 A1 | 8/2018 | Shiratori et al. |

FOREIGN PATENT DOCUMENTS

| | | |
|---|---|---|
| CN | 102686675 A | 9/2012 |
| CN | 103403045 A | 11/2013 |
| CN | 104144909 A | 11/2014 |
| CN | 107556297 A | 1/2018 |
| EP | 3085693 A1 | 10/2016 |
| EP | 3727370 A1 | 10/2020 |
| JP | 2000087027 A | 3/2000 |
| JP | 2004303490 A | 10/2004 |
| JP | 2017048290 A | 3/2017 |
| KR | 20060118449 A | 11/2006 |
| KR | 20070054890 A | 5/2007 |
| KR | 20140107594 A | 9/2014 |
| KR | 20160129009 A | 11/2016 |
| KR | 20170077775 A | 7/2017 |
| WO | 2007020881 A1 | 2/2007 |
| WO | 2014132636 A1 | 9/2014 |
| WO | 2017047644 A1 | 3/2017 |
| WO | 2017107117 A1 | 6/2017 |
| WO | 2018005318 A1 | 1/2018 |
| WO | 2019126548 A1 | 6/2019 |

OTHER PUBLICATIONS

International Search Report for Application No. PCT/KR2019/000841 dated May 2, 2019, 4 pages.
Ma, et al., "New Thermally Cross-Linkable Polymer and Its Application as a Hole-Transporting Layer for Solution Processed Multilayer Organic Light Emitting Diodes," Chemistry of Materials, Sep. 1, 2007, pp. 4827-4832, vol. 19, No. 9.
Taiwan Search Report for Application No. 108102456 dated Jan. 7, 2020, 1 page.
European Search Report for Application No. 19743508.4, dated Dec. 1, 2020, 5 pages.
Search Report dated Jun. 15, 2022 from Office Action for Chinese Application No. 201980005151.7 dated Jun. 22, 2022. 4 pgs.

* cited by examiner

【FIG. 1】
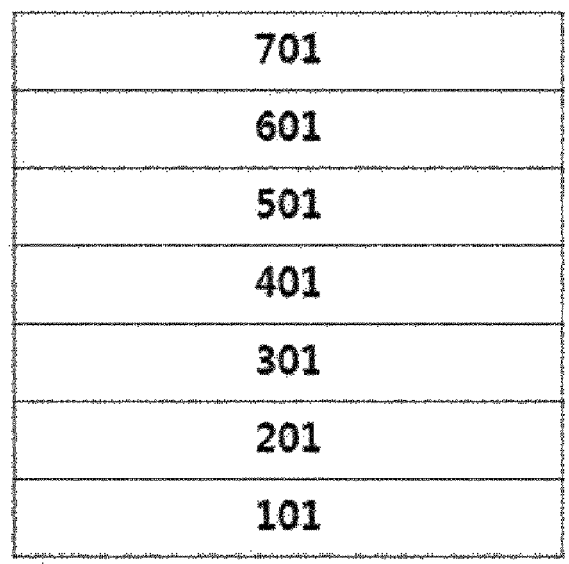

[FIG. 2]
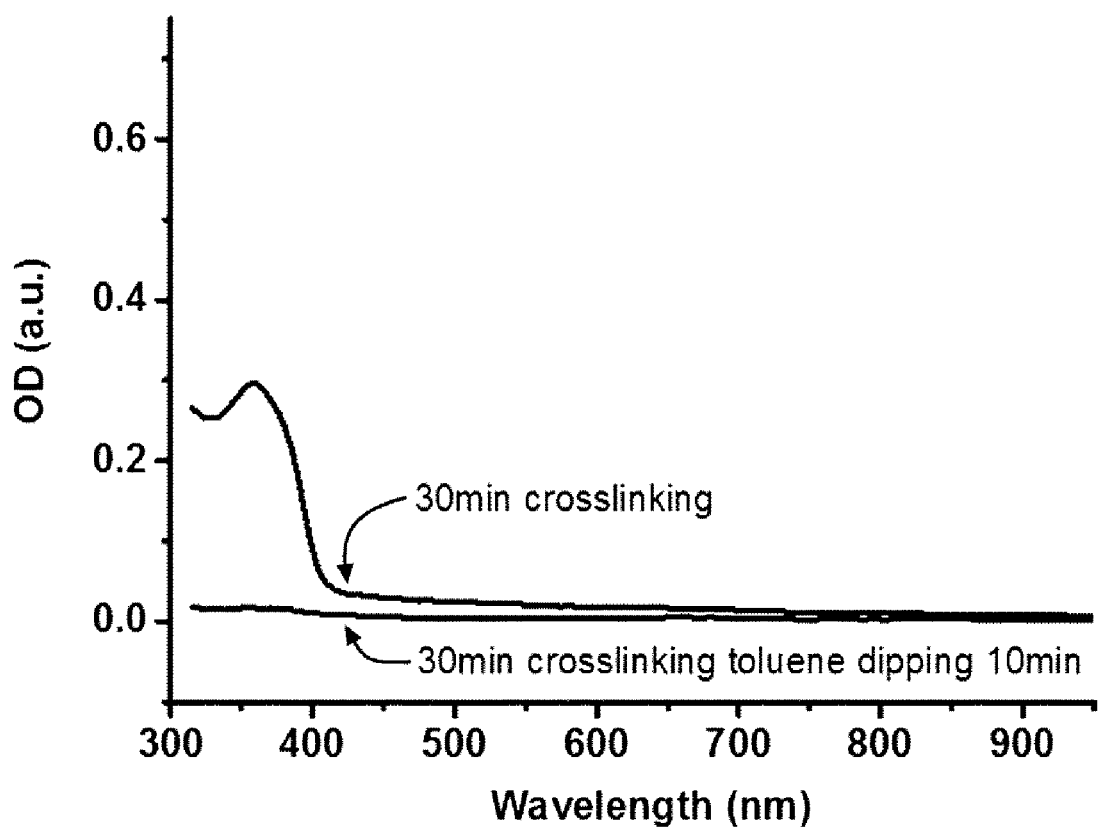

[FIG. 3]
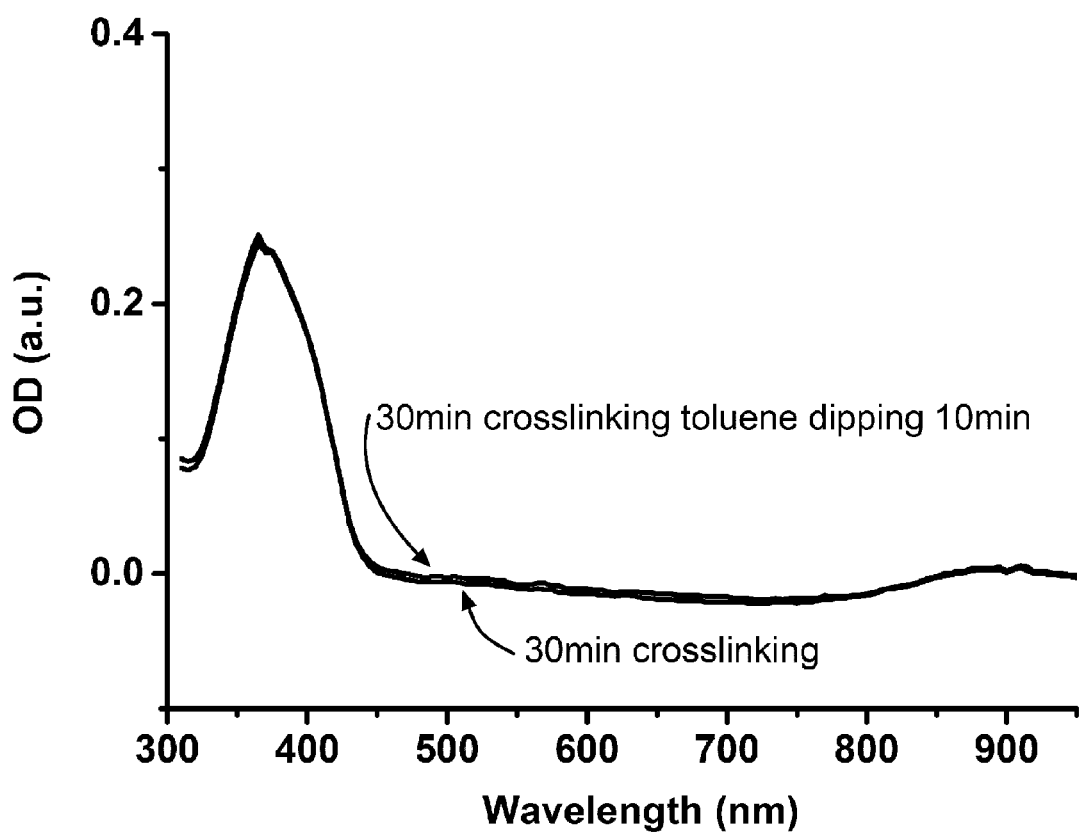

[FIG. 4]
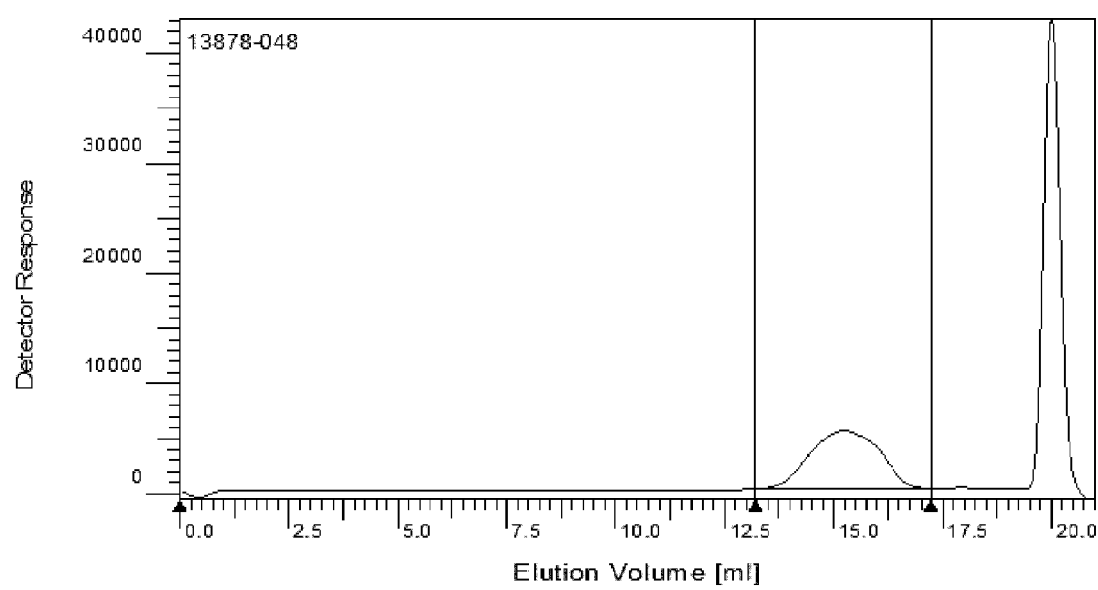

POLYMER, COATING COMPOSITION COMPRISING SAME, AND ORGANIC LIGHT-EMITTING DEVICE USING SAME

CROSS-REFERENCE TO RELATED APPLICATIONS

This application is a national phase entry under 35 U.S.C. § 371 of International Application No. PCT/KR2019/000841 filed Jan. 21, 2019, which claims priority from Korean Patent Application No. 10-2018-0008801 filed Jan. 24, 2018, all of which are incorporated herein by reference.

TECHNICAL FIELD

The present specification relates to a polymer, a coating composition including the polymer, and an organic light emitting device formed using the same.

This application claims priority to and the benefits of Korean Patent Application No. 10-2018-0008801, filed with the Korean Intellectual Property Office on Jan. 24, 2018, the entire contents of which are incorporated herein by reference.

BACKGROUND ART

An organic light emission phenomenon is one of examples converting a current to visible light by an internal process of specific organic molecules. A principle of an organic light emission phenomenon is as follows. When an organic material layer is placed between an anode and a cathode and a current is applied between the two electrodes, electrons and holes are injected to the organic material layer from the cathode and the anode, respectively. The holes and the electrons injected to the organic material layer recombine to form excitons, and light emits when these excitons fall back to the ground state. An organic light emitting device using such a principle may be generally formed with a cathode, an anode, and an organic material layer placed therebetween, for example, an organic material layer including a hole injection layer, a hole transfer layer, a light emitting layer and an electron transfer layer.

Materials used in an organic light emitting device are mostly pure organic materials or complex compounds in which organic materials and metals form complexes, and may be divided into hole injection materials, hole transfer materials, light emitting materials, electron transfer materials, electron injection materials and the like depending on the application. Herein, as the hole injection material or the hole transfer material, organic materials having a p-type property, that is, organic materials readily oxidized and having an electrochemically stable state when oxidized, are generally used. Meanwhile, as the electron injection material or the electron transfer material, organic materials having an n-type property, that is, organic materials readily reduced and having an electrochemically stable state when reduced, are generally used. As the light emitting layer material, materials having both a p-type property and an n-type property, that is, materials having a stable form in both oxidized and reduced states, are preferred, and materials having high light emission efficiency converting, when excitons are formed, the excitons to light are preferred.

In addition to the properties described above, it is preferred that materials used in an organic light emitting device additionally have properties as follows.

First, materials used in an organic light emitting device preferably have excellent thermal stability. This is due to joule heat produced by charge migration in the organic light emitting device. N,N'-di(1-naphthyl)-N,N'-diphenyl-(1,1'-biphenyl)-4,4'-diamine (NPB) normally used as a hole transfer layer material currently has a glass transition temperature of 100° C. or lower, and has a problem in that it is difficult to use in organic light emitting devices requiring a high current.

Second, in order to obtain a highly efficient organic light emitting device capable of low voltage driving, holes or electrons injected into the organic light emitting device need to be smoothly transferred to a light emitting layer, and at the same time, the injected holes and electrons need to be kept from escaping out of the light emitting layer. For this, materials used in the organic light emitting device need to have a proper band gap and a highest occupied molecular orbital (HOMO) or lowest unoccupied molecular orbital (LUMO) energy level. Poly(3,4-ethylenedioxythiophene):poly(styrenesulfonate) (PEDOT:PSS) currently used as a hole transfer material in an organic light emitting device manufactured using a solution coating method has a lower LUMO energy level compared to a LUMO energy level of organic materials used as a light emitting layer material, and therefore, has a problem in manufacturing an organic light emitting device with high efficiency and long lifetime.

In addition thereto, materials used in an organic light emitting device need to have excellent chemical stability, charge mobility, and interface property with electrodes or adjacent layers. In other words, materials used in an organic light emitting device need to undergo less material deformation caused by moisture or oxygen. In addition, by having proper hole or electron mobility, the materials need to maximize exciton formation through balancing hole and electron density in a light emitting layer of the organic light emitting device. For device stability, the materials also need to improve an interface with electrodes including metals or metal oxides.

In addition to the properties described above, materials used in an organic light emitting device for a solution process additionally need to have properties as follows.

First, a storable homogeneous solution needs to be formed. Commercialized materials for a deposition process have favorable crystallinity, and are not well-dissolved in a solution, or crystals are readily caught when forming a solution. Therefore, a concentration gradient of the solution may change depending on the storage time or possibility of forming a defective device is high.

Second, layers going through a solution process need to have solvent and material tolerance for other layers. For this, materials capable of forming a self-crosslinked polymer on a substrate through heat treatment or ultraviolet (UV) irradiation after introducing a curing group and solution coating such as N4,N4'-di(naphthalen-1-yl)-N4,N4'-bis(4-vinylphenyl)biphenyl-4,4'-diamine (VNPB) or forming a polymer having sufficient tolerance for a next process are preferred, and materials capable of having solvent tolerance by itself such as hexaazatriphenylene hexacarbonitrile (HATCN) are also preferred. Arylamine-based monomers generally used in an organic light emitting device (OLED) do not have tolerance for a solvent of a next process by themselves, and therefore, arylamine-based monomer compounds usable in an OLED device for a solution process need to have a curing group introduced thereto.

Accordingly, development of organic materials fulfilling such requirements has been required in the art.

DISCLOSURE

Technical Problem

The present specification is directed to providing a polymer usable in an organic light emitting device for a solution process, a coating composition including the same, and an organic light emitting device formed using the same.

Technical Solution

One embodiment of the present specification provides a polymer including a unit represented by the following Chemical Formula 1; and a unit represented by the following Chemical Formula 2.

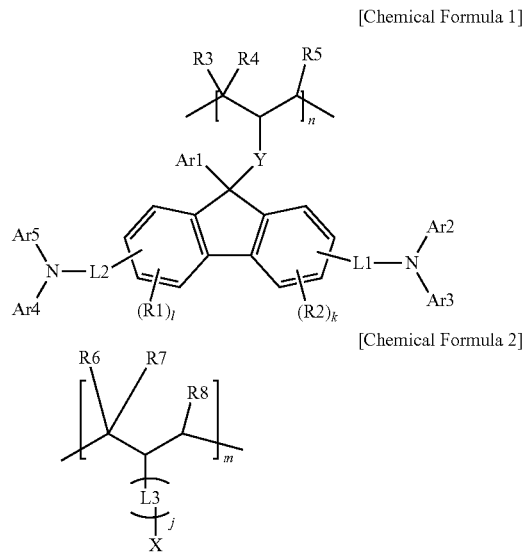

[Chemical Formula 1]

[Chemical Formula 2]

In Chemical Formulae 1 and 2,

Ar1 to Ar5 are the same as or different from each other, and each independently a substituted or unsubstituted aryl group, Ar2 and Ar3 may bond to each other to form a substituted or unsubstituted heteroring, Ar4 and Ar5 may bond to each other to form a substituted or unsubstituted heteroring, L1 and L2 are the same as or different from each other, and each independently a direct bond; or a substituted or unsubstituted arylene group, Y is —Y1- or —(Y2)$_i$-Y3-, and Y1 and Y3 are the same as or different from each other, and each independently a substituted or unsubstituted arylene group; or a substituted or unsubstituted alkylene group, Y2 is a substituted or unsubstituted arylene group; a substituted or unsubstituted alkylene group; or —O—, i is an integer of 1 to 8, and when i is 2 or greater, Y2s are the same as or different from each other, Y2 bonding to Y3 is different from Y3, and when there are two or more Y2s, adjacent Y2s are different from each other, R1 to R8 are the same as or different from each other, and each independently hydrogen, or a substituted or unsubstituted alkyl group, L3 is a direct bond; a substituted or unsubstituted arylene group; a substituted or unsubstituted alkylene group; a substituted or unsubstituted alkyleneoxy group; or a substituted or unsubstituted divalent arylamine group, l and k are each an integer of 0 to 3, and when l is 2 or greater, R1s are the same as or different from each other, and when k is 2 or greater, R2s are the same as or different from each other, j is an integer of 1 to 3, and when j is 2 or greater, L3s are the same as or different from each other, X is a curing group, n and m mean a molar ratio in the polymer, and 0<n<1, 0<m<1, and m+n≤1.

Another embodiment of the present specification provides a coating composition including the polymer described above.

Still another embodiment of the present specification provides an organic light emitting device including a first electrode; a second electrode provided opposite to the first electrode; and one or more organic material layers provided between the first electrode and the second electrode, wherein one or more layers of the organic material layers include a cured material of the coating composition described above.

Advantageous Effects

A polymer according to one embodiment of the present specification includes a functional group polymerized by heat or light, and when providing sufficient heat or light after forming a film, tolerance for a solvent for a process is developed, and the compound according to one embodiment of the present specification is not washed away or film properties are not changed, and a reproducible organic light emitting device can be manufactured.

An aryl group (Ar1) directly attached to number 9 carbon of fluorene and a proper spacer between a curing group and the fluorene are capable of controlling a glass transition temperature, a melting point and solubility by inhibiting interactions between molecules, and therefore, this derivative can be used as a material of an organic material layer of an organic light emitting device, and is capable of providing low driving voltage, high light emission efficiency and long lifetime properties. In addition, by using the fluorene derivative, solubility increases leading to advantages of widening a range of solvent selection when manufacturing an ink of a solution process, and lowering a melting point and a curing temperature.

DESCRIPTION OF DRAWINGS

FIG. 1 illustrates an example of an organic light emitting device according to one embodiment of the present specification.

FIG. 2 is a graph showing experimental results on the film retention rate of Comparative Compound E.

FIG. 3 is a graph showing experimental results on the film retention rate of Compound B.

FIG. 4 shows polymer material molecular weight analyzer (GPC) data of Compound A.

REFERENCE NUMERAL

101: Substrate
201: Anode
301: Hole Injection Layer
401: Hole Transfer Layer
501: Light Emitting Layer
601: Electron Injection and Transfer Layer
701: Cathode

Mode for Disclosure

Hereinafter, the present specification will be described in more detail.

In the present specification, a description of a certain member being placed "on" another member includes not only a case of the one member adjoining the another member but a case of still another member being present between the two members.

In the present specification, a description of a certain part "including" certain constituents means capable of further including other constituents, and does not exclude other constituents unless particularly stated on the contrary.

Throughout the specification of the present application, the term "combination thereof" included in a Markush-type expression means a mixture or a combination of one or more selected from the group consisting of constituents described in the Markush-type expression, and means including one or more selected from the group consisting of the constituents.

One embodiment of the present specification provides a polymer including a unit represented by Chemical Formula 1 and a unit represented by Chemical Formula 2.

As the polymer including the unit represented by Chemical Formula 1 and the unit represented by Chemical Formula 2 in one embodiment of the present specification, compounds having solubility for proper organic solvents are preferred.

In one embodiment of the present specification, the unit represented by Chemical Formula 1 is a unit derived from a compound in which an amine group bonds to both side benzene rings of the fluorene, and a vinyl group bonds to the number 9 position. Y of Chemical Formula 1 represents a long branch-type linker, and in this case, excellent solubility for an organic solvent is obtained. When using the polymer including the unit represented by Chemical Formula 1 in a hole transfer layer or a hole injection layer of an organic light emitting device, a solution process is readily applied, and the prepared hole transfer layer or hole injection layer has excellent uniformity and surface properties, and therefore, the manufactured device is excellent in terms of performance and lifetime.

In addition, the unit represented by Chemical Formula 1 is a unit in which the compound at the number 9 position of the fluorene is asymmetric, and compared to a symmetric unit, is capable of reducing a problem of crystal precipitation during a solution process by reducing interactions between molecules, and is effective in preparing various derivatives.

In addition, the polymer according to one embodiment of the present specification has the main chain and the arylamine part separated due to vinyl condensation, and therefore, performance of a reproducible device may be identified. Since a polymer that does not go through vinyl condensation and has an arylamine group as the main chain is a completely conjugated polymer, electron or hole flow may be too high or balanced charge transfer may not be suitable. In addition, the content of the arylamine in the main chain varies depending on the polymer length, and therefore, the molecular weight may not be reproducibly controlled causing a problem of significantly changing device performance.

In one embodiment of the present specification, the unit represented by Chemical Formula 2 is a unit derived from a compound having a curing group and a vinyl group. A polymer that does not include an additional curing group like Chemical Formula 2 may not exhibit sufficient solvent tolerance, however, the polymer of the present disclosure may form crosslinkage through heat treatment due to the additional curing group included in Chemical Formula 2, and is effective in exhibiting sufficient solvent tolerance.

In the present specification, a "curing group" may mean a reactive substituent crosslinking compounds by being exposed to heat and/or light. The crosslinkage may be produced while linking radicals produced by decomposing carbon-carbon multiple 5 bonds or cyclic structures through heat treatment or light irradiation.

In one embodiment of the present specification, the curing group is any one of the following structures.

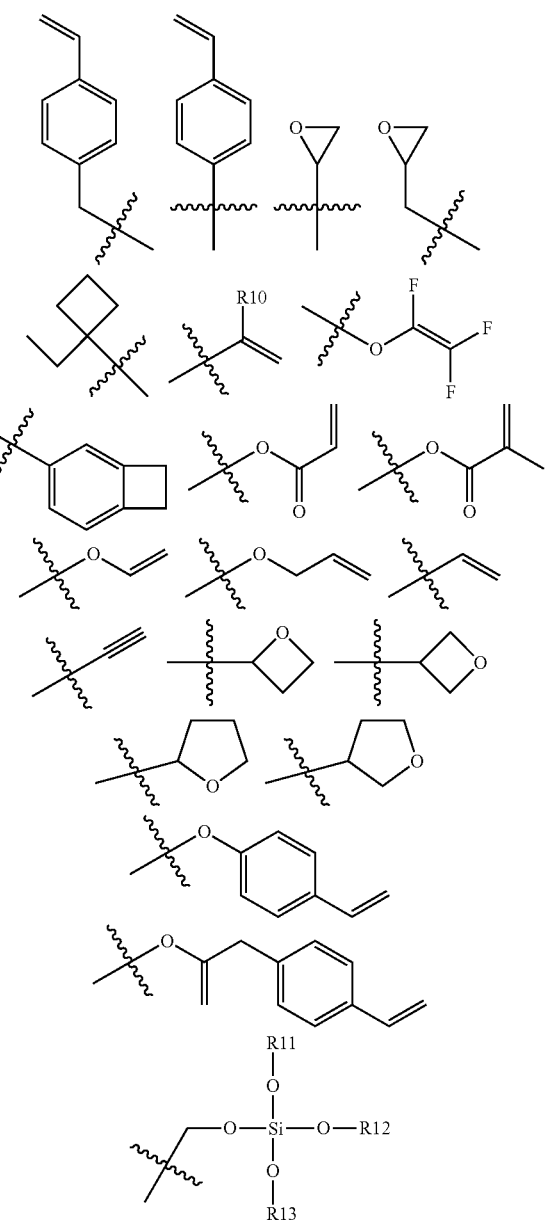

In the structural formulae, R10 to R13 are the same as or different from each other and each independently hydrogen, or a substituted or unsubstituted alkyl group, and a wave mark means a site bonding to L3.

Hereinafter, substituents of the present specification will be described in detail, however, the substituents are not limited thereto.

In the present specification,

means a site bonding to other substituents or bonding sites.

The term "substitution" in the present specification means a hydrogen atom bonding to a carbon atom of a compound is changed to another substituent. The position of substitution is not limited as long as it is a position at which the hydrogen atom is substituted, that is, a position at which a substituent can substitute, and when two or more substituents substitute, the two or more substituents may be the same as or different from each other.

The term "substituted or unsubstituted" in the present specification means being substituted with one or more substituents selected from the group consisting of hydrogen; deuterium; a halogen group; an alkyl group; a cycloalkyl group; an alkoxy group; an aryl group; an amine group; and an arylamine group or being unsubstituted, or being substituted with a substituent linking two or more substituents among the substituents illustrated above or being unsubstituted.

In the present specification, examples of the halogen group may include fluorine, chlorine, bromine or iodine.

In the present specification, the alkyl group may be linear, branched or cyclic, and although not particularly limited thereto, the number of carbon atoms is preferably from 1 to 50. Specific examples thereof may include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl and the like, but are not limited thereto.

The alkyl group may be substituted with an aryl group or a heteroaryl group to function as an arylalkyl group or a heteroarylalkyl group. The aryl group and the heterocyclic group may be selected from among examples of an aryl group or a heterocyclic group to describe later.

In the present specification, the length of the alkyl group does not affect a conjugation length of the compound, and may affect the use of the compound in an organic light emitting device, for example, the use of a vacuum deposition method or a solution coating method.

In the present specification, the cycloalkyl group is not particularly limited, but preferably has 3 to 60 carbon atoms, and specific examples thereof may include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl and the like, but are not limited thereto.

In the present specification, the alkoxy group may be linear, branched or cyclic. The number of carbon atoms of the alkoxy group is not particularly limited, but is preferably from 1 to 30. Specific examples thereof may include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy and the like, but are not limited thereto.

When the aryl group is a monocyclic aryl group in the present specification, the number of carbon atoms is not particularly limited, but is preferably from 6 to 25. Specific examples of the monocyclic aryl group may include a phenyl group, a biphenyl group, a terphenyl group, a quaterphenyl group and the like, but are not limited thereto.

When the aryl group is a polycyclic aryl group, the number of carbon atoms is not particularly limited, but is preferably from 10 to 30. Specific examples of the polycyclic aryl group may include a naphthyl group, an anthracenyl group, a phenanthryl group, a pyrenyl group, a perylenyl group, a chrysenyl group, a fluorenyl group and the like, but are not limited thereto.

In the present specification, the fluorene group may be substituted, and adjacent substituents may bond to each other to form a ring.

When the fluorenyl group is substituted,

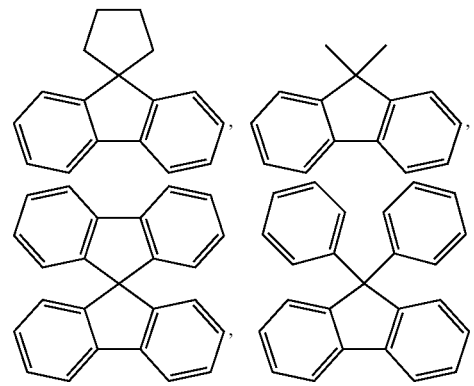

and the like may be included. However, the structure is not limited thereto.

The aryl group may be substituted with an alkyl group to function as an arylalkyl group. The alkyl group may be selected from among the examples described above.

In the present specification, the number of carbon atoms of the amine group is not particularly limited, but is preferably from 1 to 30. The amine group may be substituted with the above-described alkyl group, aryl group, heterocyclic group, alkenyl group, cycloalkyl group, a combination thereof and the like, and specific examples of the amine group may include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, a phenylnaphthylamine group, a ditolylamine group, a phenyltolylamine group, a triphenylamine group and the like, but are not limited thereto.

In the present specification, examples of the arylamine group include a substituted or unsubstituted monoarylamine group, a substituted or unsubstituted diarylamine group, or a substituted or unsubstituted triarylamine group. The aryl group in the arylamine group may be a monocyclic aryl group or a polycyclic aryl group. The arylamine group including two or more aryl groups may include monocyclic aryl groups, polycyclic aryl groups, or both monocyclic aryl groups and polycyclic aryl groups. For example, the aryl group in the arylamine group may be selected from among the examples of the aryl group described above. Specific examples of the arylamine group may include phenylamine, naphthylamine, biphenylamine, anthracenylamine, 3-methyl-phenylamine, 4-methyl-naphthylamine, 2-methyl-biphenylamine, 9-methyl-anthracenylamine, a diphenylamine group, a phenylnaphthylamine group, a ditolylamine group, a phenyltolylamine group, carbazole, a triphenylamine group and the like, but are not limited thereto.

In the present specification, the alkylene group means an alkyl group having two bonding sites, that is, a divalent group. Descriptions on the alkyl group provided above may be applied thereto except for those that are each divalent.

In the present specification, the alkyleneoxy group means alkylene-O—, and herein, the alkylene is the same as the alkylene group described above.

In the present specification, the arylene group means an aryl group having two bonding sites, that is, a divalent group. Descriptions on the aryl group provided above may be applied thereto except for those that are each divalent.

In the present specification, an "adjacent" group may mean a substituent substituting an atom directly linked to an atom substituted by the corresponding substituent, a substituent sterically most closely positioned to the corresponding substituent, or another substituent substituting an atom substituted by the corresponding substituent. For example, two substituents substituting ortho positions in a benzene ring, and two substituents substituting the same carbon in an aliphatic ring may be interpreted as groups "adjacent" to each other.

In one embodiment of the present specification, Ar1 to Ar5 are the same as or different from each other, and each independently a substituted or unsubstituted phenyl group; a substituted or unsubstituted biphenyl group; or a substituted or unsubstituted fluorene group.

In one embodiment of the present specification, Ar1 to Ar5 are the same as or different from each other, and each independently a phenyl group unsubstituted or substituted with an arylamine group; a biphenyl group unsubstituted or substituted with an arylamine group; or a fluorene group unsubstituted or substituted with an alkyl group.

In one embodiment of the present specification, Ar1 is a substituted or unsubstituted phenyl group; or a substituted or unsubstituted biphenyl group.

In one embodiment of the present specification, Ar1 is a phenyl group unsubstituted or substituted with a halogen group or an alkyl group.

In one embodiment of the present specification, Ar1 is a phenyl group unsubstituted or substituted with F, a methyl group, a butyl group or a hexyl group.

In one embodiment of the present specification, Ar1 is a phenyl group unsubstituted or substituted with F, a methyl group, a tert-butyl group or a hexyl group.

In one embodiment of the present specification, Ar2 to Ar5 are the same as or different from each other, and each independently a substituted or unsubstituted phenyl group; a substituted or unsubstituted biphenyl group; or a substituted or unsubstituted fluorene group, or Ar2 and Ar3 bond to form a substituted or unsubstituted carbazole ring, and Ar4 and Ar5 bond to form a substituted or unsubstituted carbazole group.

In one embodiment of the present specification, Ar2 to Ar5 are the same as or different from each other, and each independently a phenyl group unsubstituted or substituted with an arylamine group; a biphenyl group unsubstituted or substituted with an arylamine group; or a fluorene group unsubstituted or substituted with an alkyl group, or Ar2 and Ar3 bond to form a carbazole ring, and Ar4 and Ar5 bond to form a carbazole group.

In one embodiment of the present specification, Ar2 to Ar5 are the same as or different from each other, and each independently a phenyl group unsubstituted or substituted with a diphenylamine group; a biphenyl group unsubstituted or substituted with a diphenylamine group; or a fluorene group unsubstituted or substituted with a methyl group, or Ar2 and Ar3 bond to form a carbazole ring, and Ar4 and Ar5 bond to form a carbazole group.

In one embodiment of the present specification, Ar2 to Ar5 are the same as or different from each other, and each independently a phenyl group unsubstituted or substituted with a diphenylamine group; a biphenyl group unsubstituted or substituted with a diphenylamine group; or a fluorene group substituted with a methyl group, or Ar2 and Ar3 bond to form a carbazole ring, and Ar4 and Ar5 bond to form a carbazole group.

In one embodiment of the present specification, L1 and L2 are the same as or different from each other, and each independently a direct bond; a substituted or unsubstituted phenylene group; or a substituted or unsubstituted biphenylylene group.

In one embodiment of the present specification, L1 and L2 are the same as or different from each other, and each independently a direct bond; or a substituted or unsubstituted phenylene group.

In one embodiment of the present specification, L1 and L2 are the same as or different from each other, and each independently a direct bond; or a phenylene group.

In one embodiment of the present specification, L1 and L2 are the same as each other, and are a direct bond; or a phenylene group.

In one embodiment of the present specification, L1 and L2 are a phenylene group.

In one embodiment of the present specification, when L1 and L2 is a linker (phenylene), solubility may be controlled, and since a resonance structure becomes larger compared to when L1 and L2 are a direct bond, the HOMO level may be controlled.

In one embodiment of the present specification, Y1 and Y3 are the same as or different from each other, and each independently a substituted or unsubstituted propylene group; a substituted or unsubstituted phenylene group; or a substituted or unsubstituted biphenylylene group, and Y2s are the same as or different from each other, and each independently a substituted or unsubstituted phenylene group; a substituted or unsubstituted biphenylylene group; a substituted or unsubstituted methylene group; a substituted or unsubstituted ethylene group; a substituted or unsubstituted propylene group; a substituted or unsubstituted butylene group; a substituted or unsubstituted pentylene group; a substituted or unsubstituted hexylene group; or —O—, and Y2s bonding to each other among the two or more Y2s are different from each other.

In one embodiment of the present specification, Y is selected from among the following structural formulae.

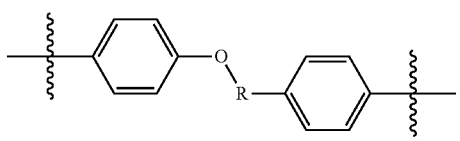

-continued

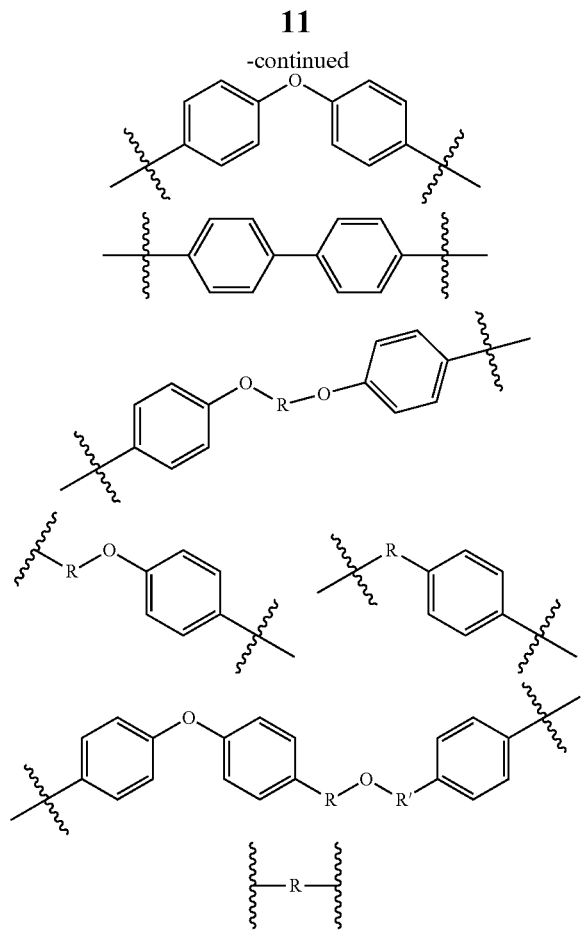

In the structural formulae, R and R' are the same as or different from each other, and each independently a substituted or unsubstituted alkylene group.

In one embodiment of the present specification, R and R' are the same as or different from each other, and each independently an alkylene group.

In one embodiment of the present specification, R and R' are the same as or different from each other, and each independently an alkylene group having 1 to 6 carbon atoms.

In one embodiment of the present specification, R and R' are the same as or different from each other, and each independently a methylene group; an ethylene group; a propylene group; a butylene group; a pentylene group; or a hexylene group.

In one embodiment of the present specification, Y is selected from among the following structural formulae.

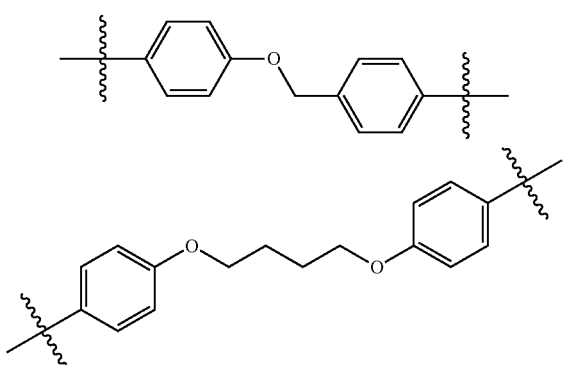

-continued

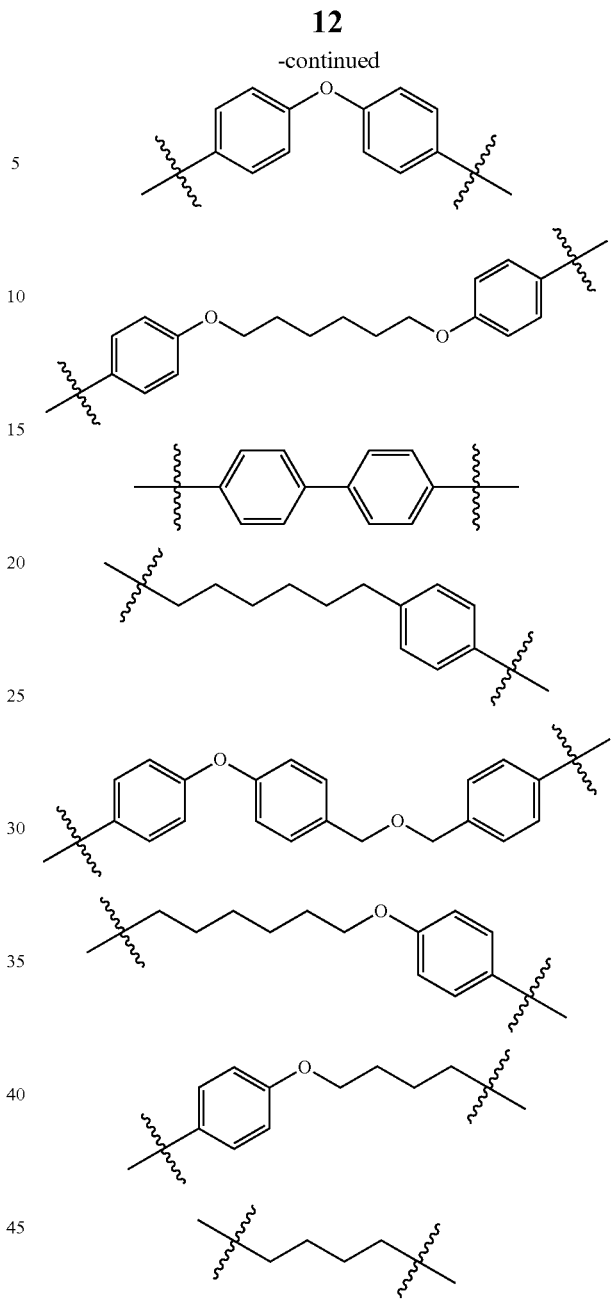

In one embodiment of the present specification, L3 is a direct bond; a phenylene group unsubstituted or substituted with one, two or more substituents selected from the group consisting of an alkyl group, an alkoxy group and an arylamine group; or a divalent arylamine group.

In one embodiment of the present specification, L3 is a direct bond; a phenylene group unsubstituted or substituted with one, two or more substituents selected from the group consisting of a methyl group, an ethyl group, a propyl group, a butyl group, a butoxy group, a methoxy group, a hexyloxy group and a phenylamine group; or a divalent diphenylamine group.

In one embodiment of the present specification, the curing group is selected from among the following structural formulae.

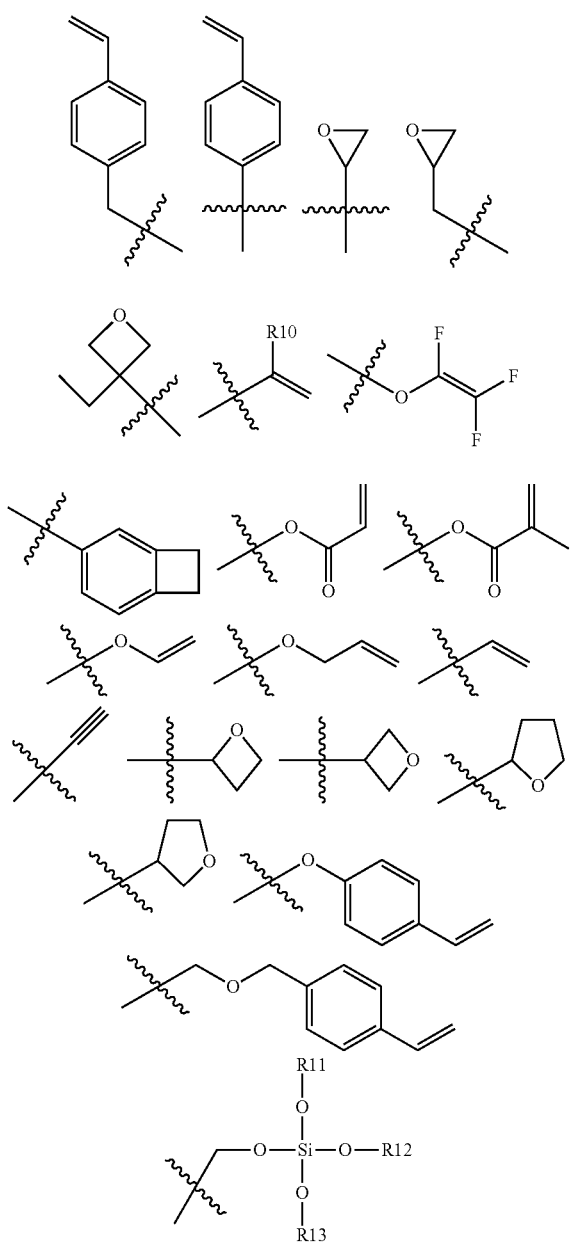

In the structural formulae, R10 to R13 are the same as or different from each other and each independently hydrogen, or a substituted or unsubstituted alkyl group, a wave mark means a site bonding to L3.

In one embodiment of the present specification, the curing group is 1,2-dihydrocyclobutabenzene; or oxetane unsubstituted or substituted with an alkyl group.

In one embodiment of the present specification, the curing group is

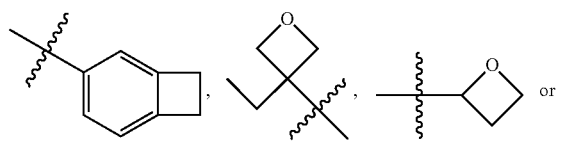

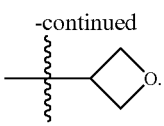

Particularly, wen the curing group is cyclobutabenzene or oxetane, the structure is not damaged during a vinyl polymerization process (radical initiation reaction using azobisisobutyronitrile (AIBN)), and there is an advantage in that a crosslinked polymer may be formed by starting curing when applying heat afterward, and the polymer is advantageous for a solution produces due to high tolerance.

In addition, when introducing a curing group that is not a curing group initiated by a radical initiator such as vinyl in addition to the cyclobutabenzene or the oxetane, the vinyl group may be introduced through post modification after polymerizing the unit of Chemical Formula 1 and the unit of Chemical Formula 2.

In one embodiment of the present specification, R1 and R2 are hydrogen.

In one embodiment of the present specification, R3 to R8 are the same as or different from each other, and each independently hydrogen; a substituted or unsubstituted ethyl group; a substituted or unsubstituted propyl group; or a substituted or unsubstituted butyl group.

In one embodiment of the present specification, R3 to R8 are hydrogen.

In one embodiment of the present specification, the compound including the unit represented by Chemical Formula 1 and the unit represented by Chemical Formula 2 may have a number average molecular weight of 1,000 g/mol to 300,000 g/mol. Specifically, the number average molecular weight may be from 2,000 g/mol to 10,0000 g/mol.

In the present specification, the molecular weight is analyzed using a GPC apparatus. As the column, PL mixed Bx2 is used, and as the solvent, tetrahydrofuran (THF) (filtered with 0.45 mm when used). A flow rate of 1.0 mL/min and a sample concentration of 1 mg/mL are used in the measurement. 100 mL of the sample is injected, and the column temperature is set at 40° C. As the detector, an Agilent RI detector is used, and the standard is set using polystyrene (PS). Data processing is conducted through the ChemStation program.

In one embodiment of the present specification, n is $0.65 \leq n < 1$, m is $0 < m \leq 0.4$, and preferably, n is 0.8, and m is 0.2. When n is 0.6 or greater, a ratio of a portion exhibiting device properties increases, which is effective in decreasing a driving voltage of the device, and in increasing efficiency and lifetime.

In one embodiment of the present specification, n is 0.8, and m is 0.2.

In one embodiment of the present specification, the unit represented by Chemical Formula 1 and the unit represented by Chemical Formula 2 are a random polymer or a block polymer.

In one embodiment of the present specification, the polymer including the unit represented by Chemical Formula 1 and the unit represented by Chemical Formula 2 is selected from among the following structural formulae.

15
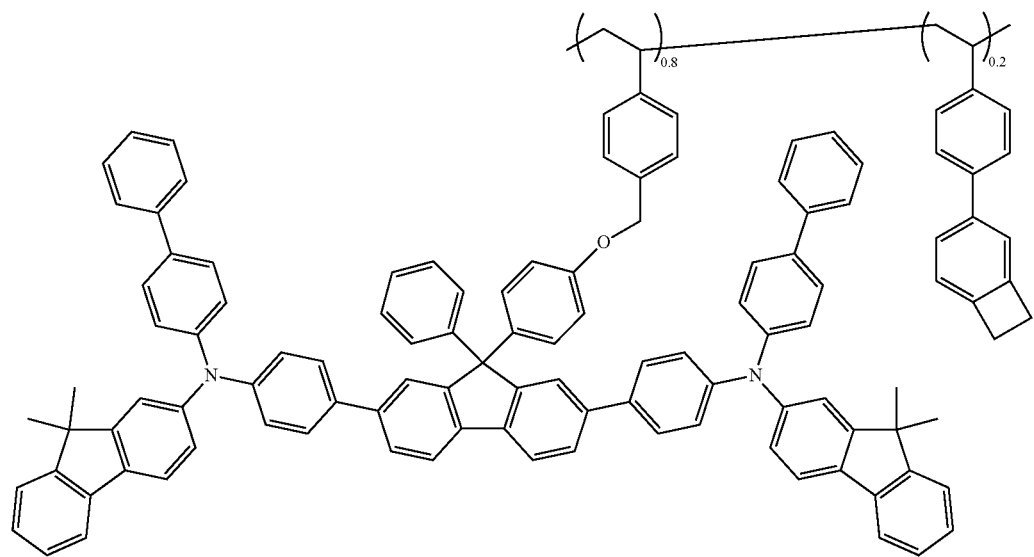
16
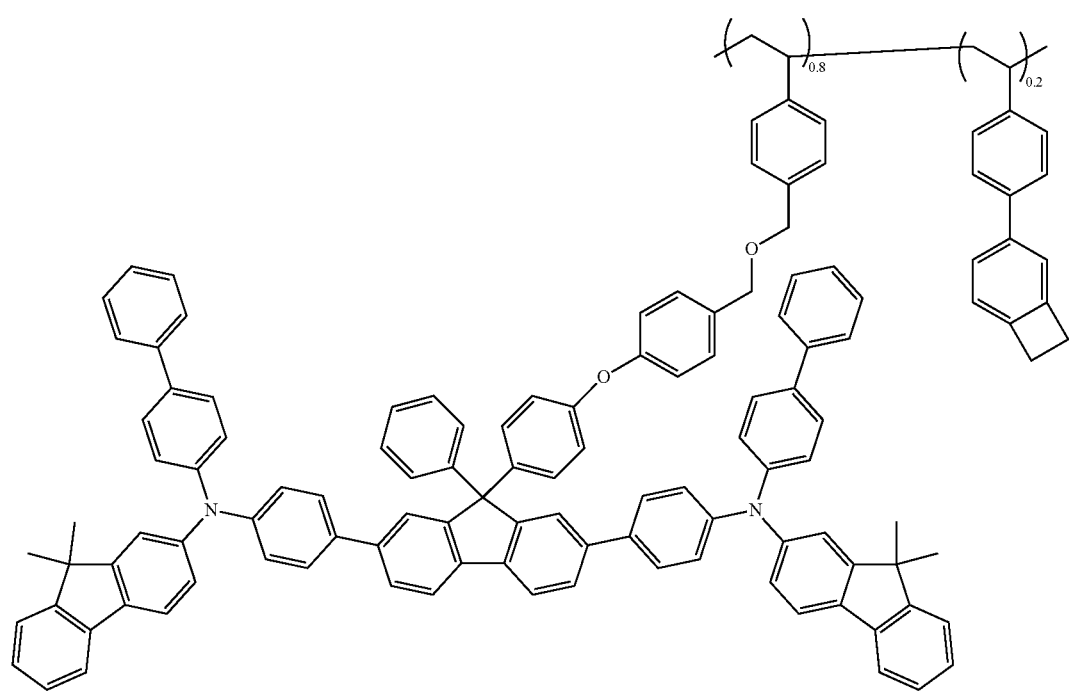

-continued
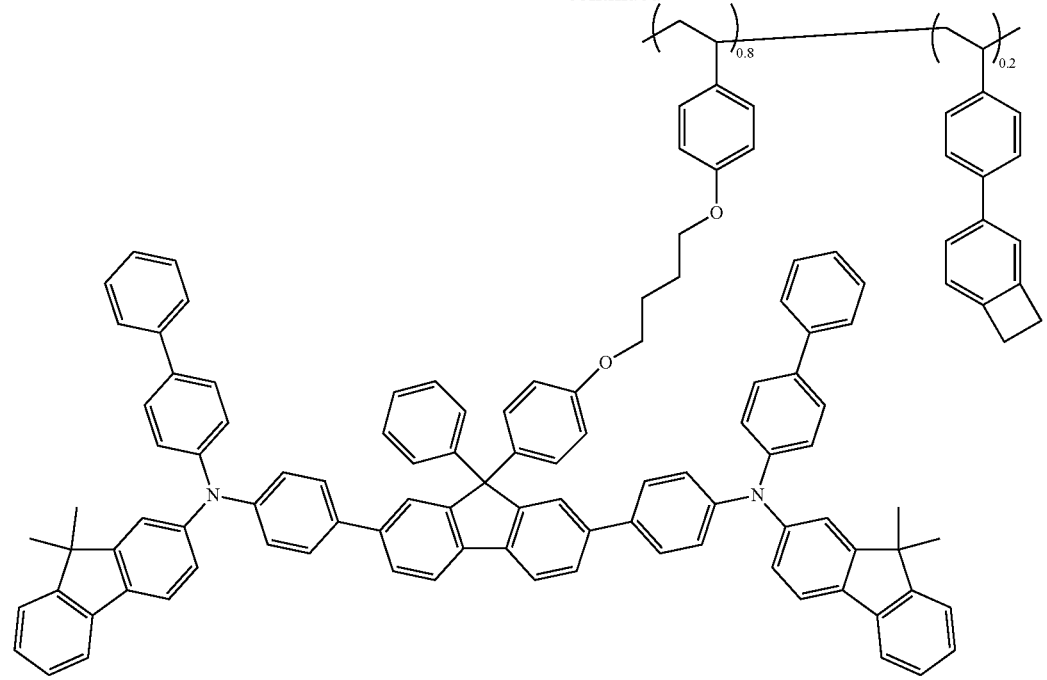
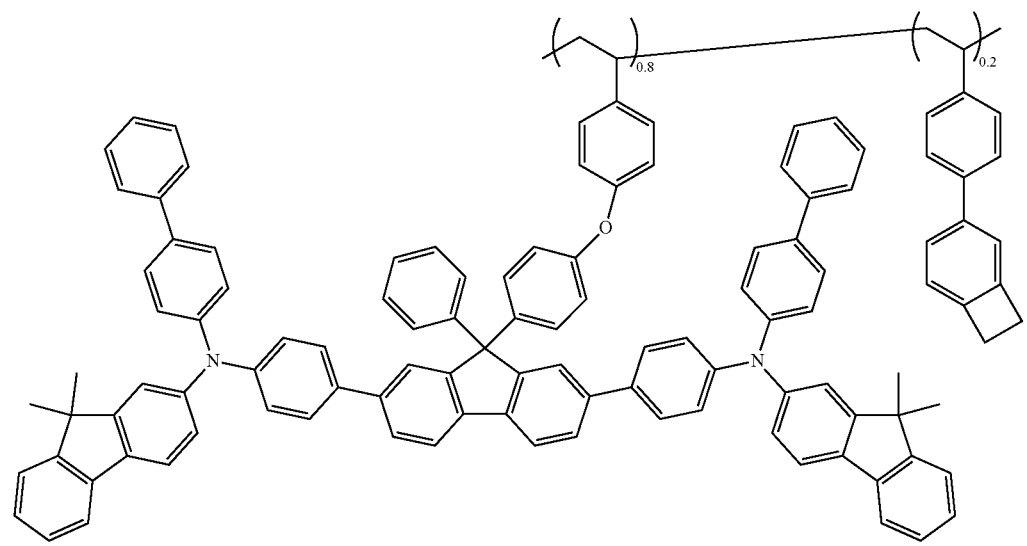

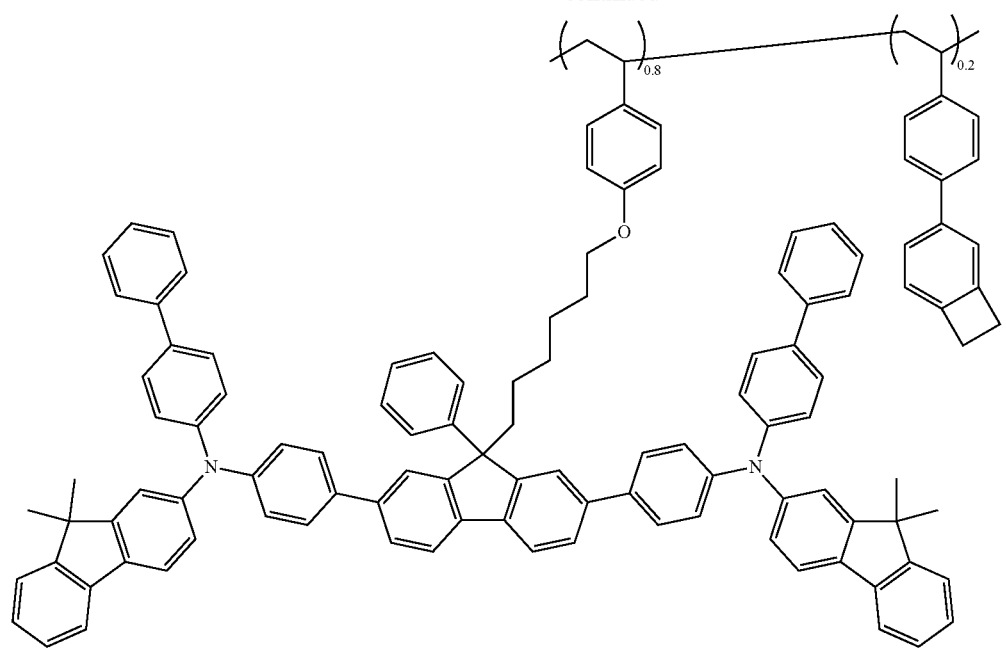
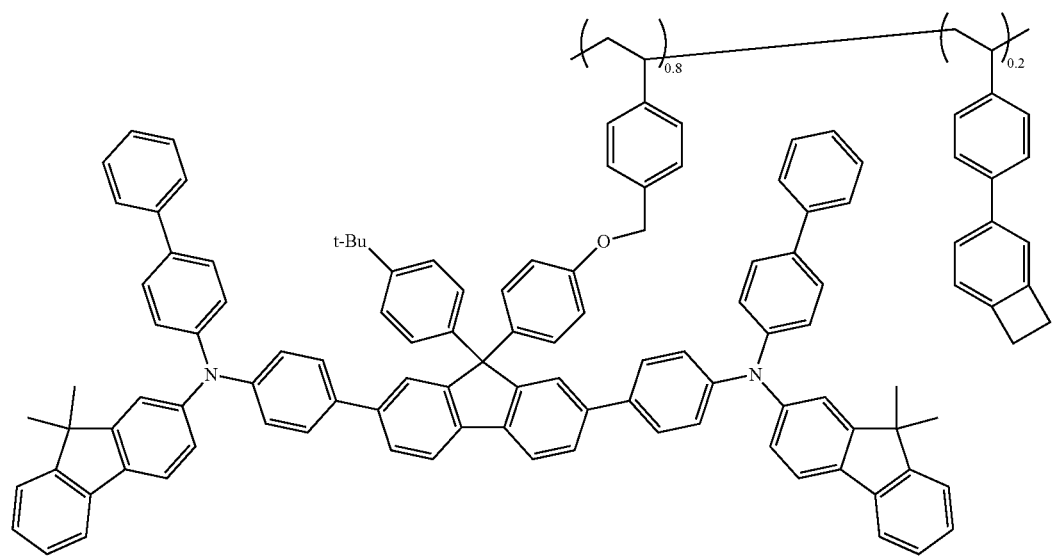

-continued
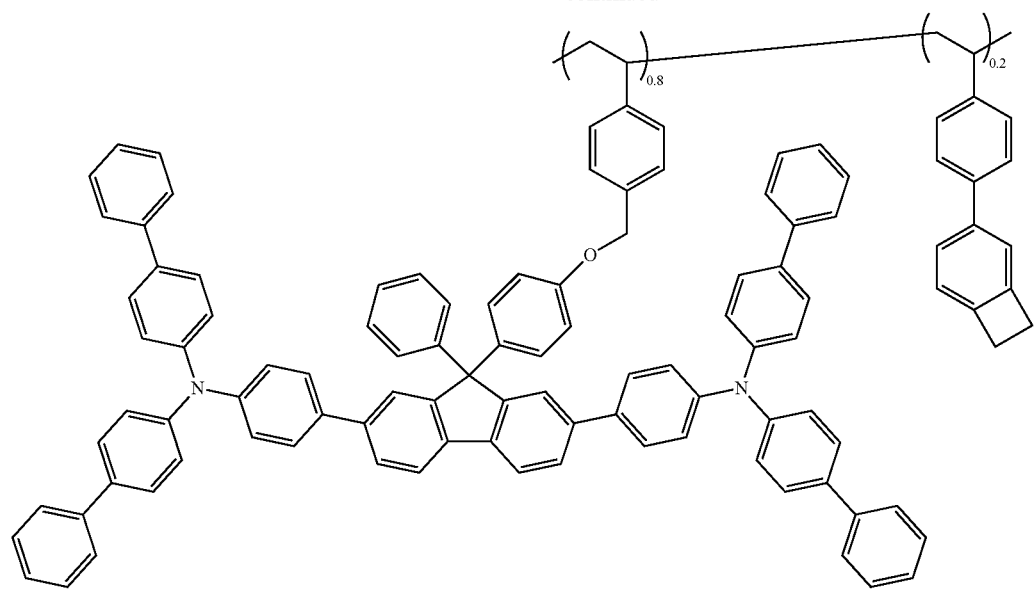
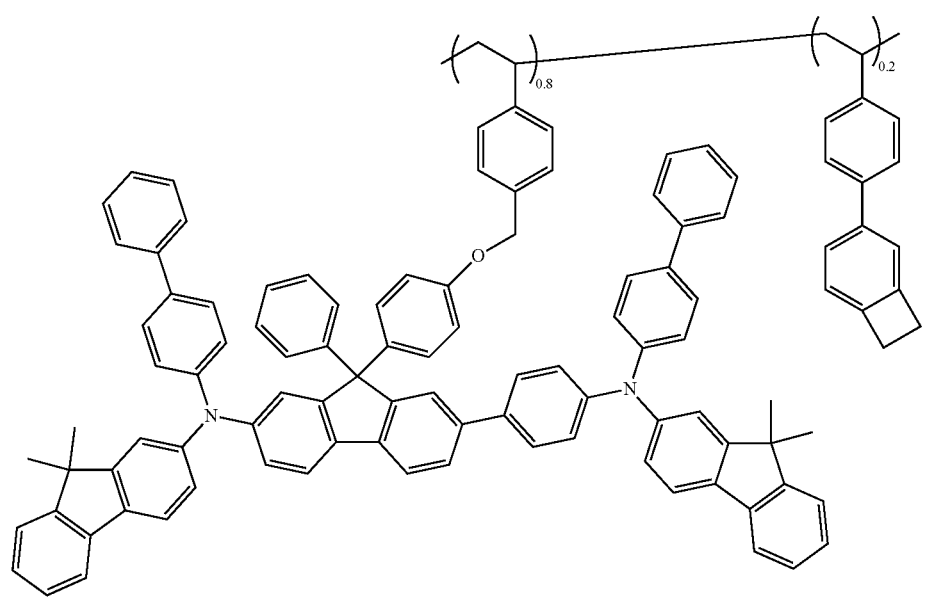

-continued
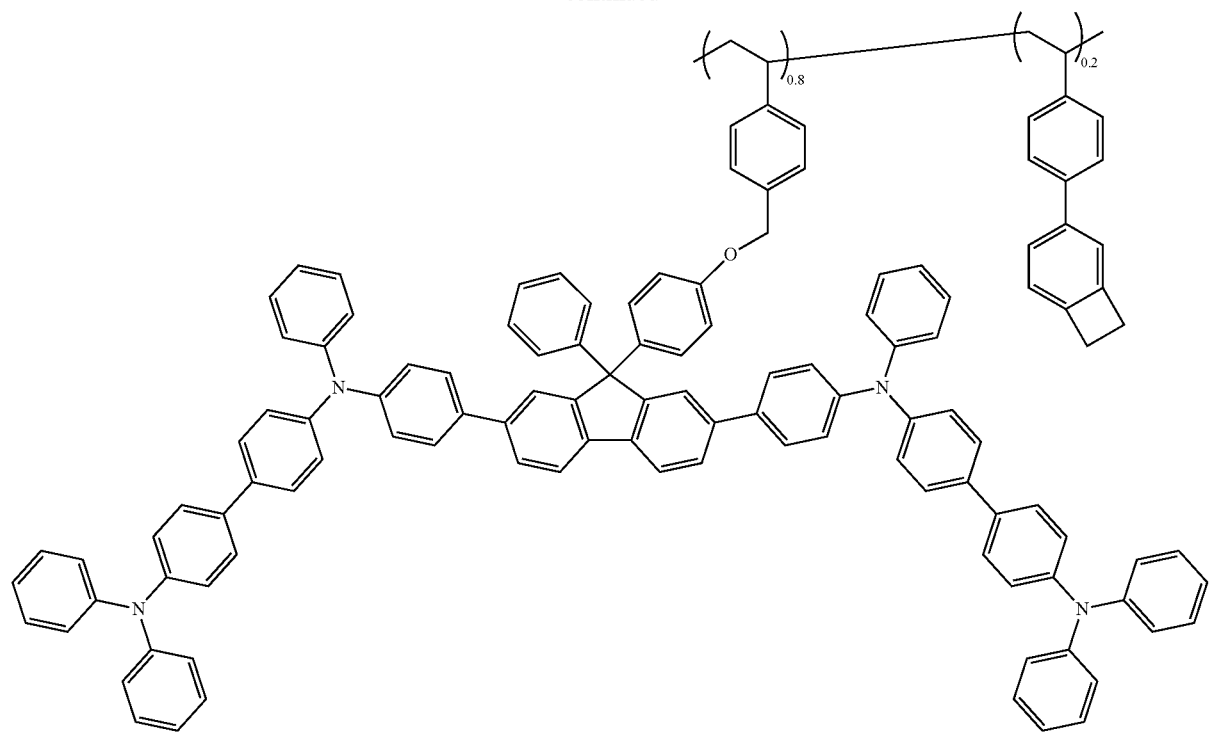
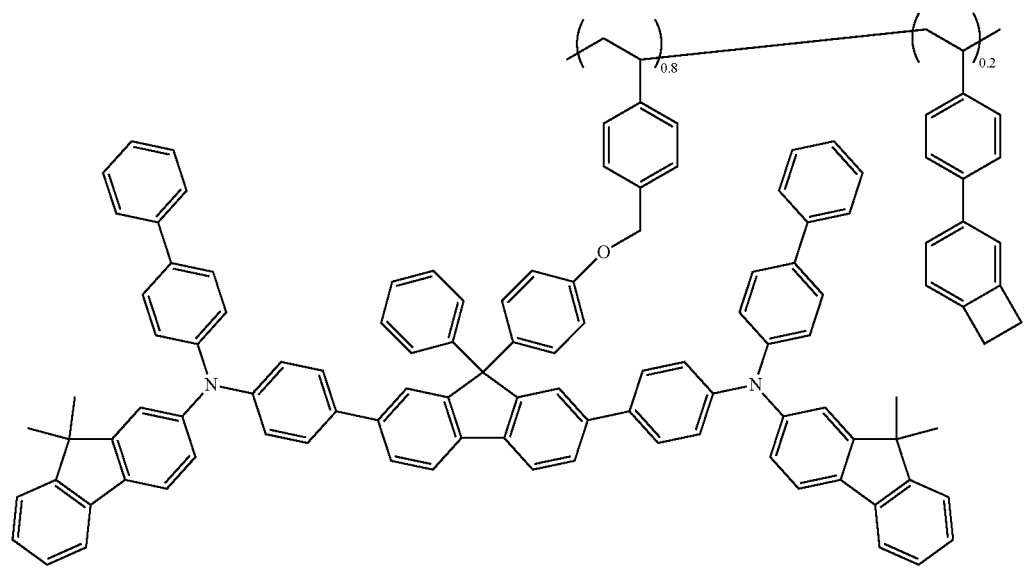

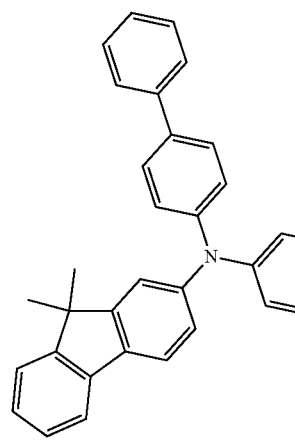
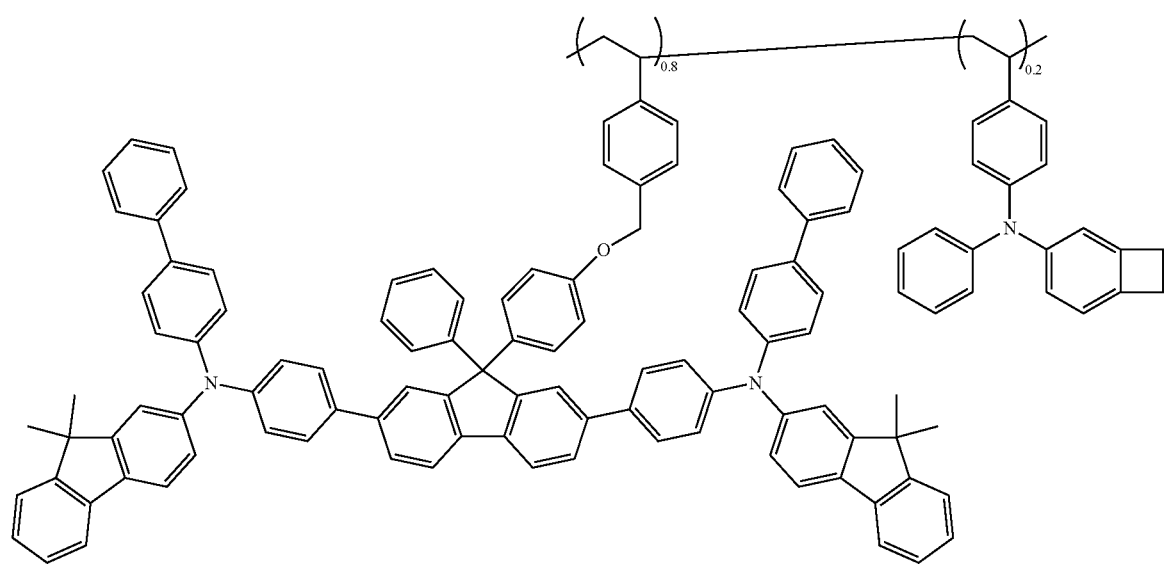
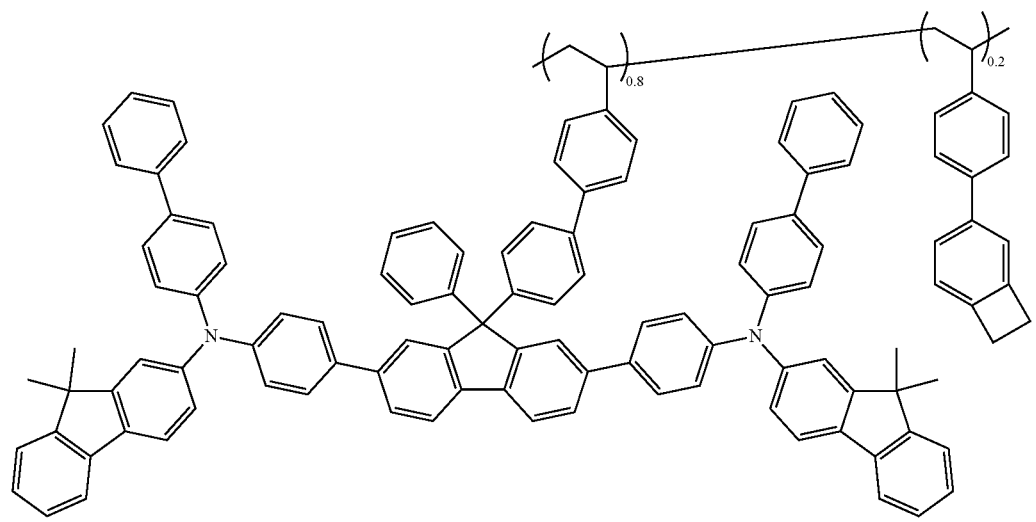

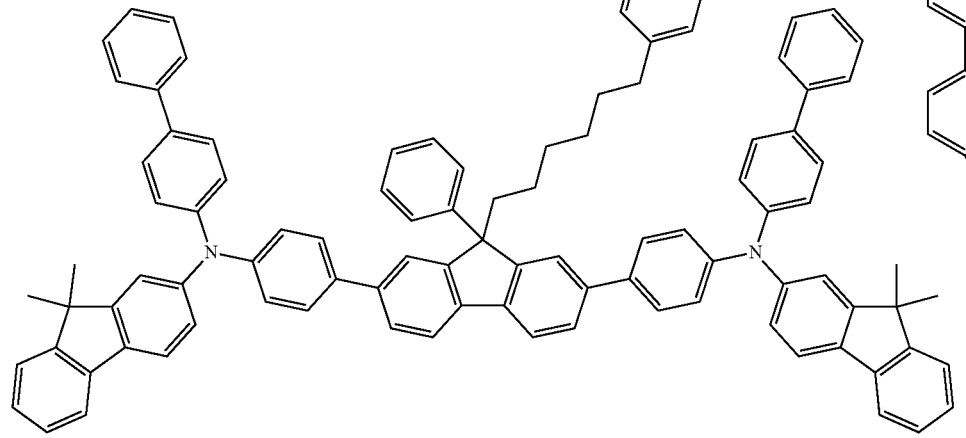
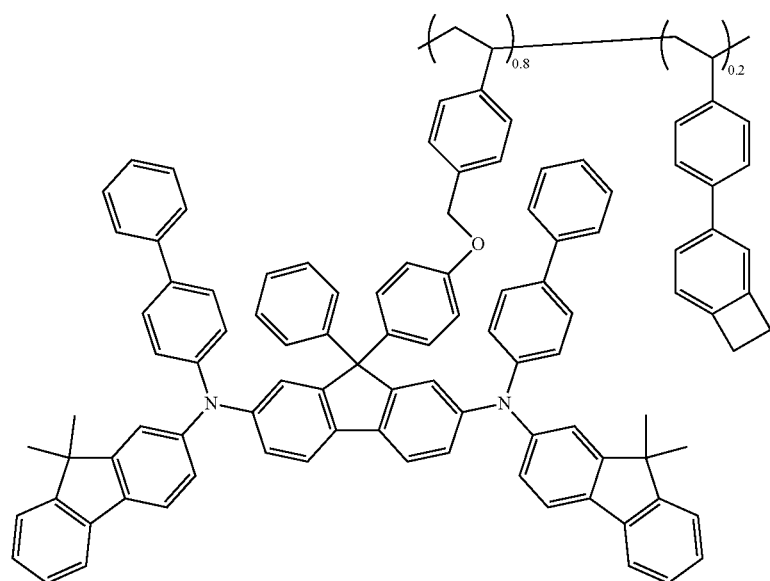

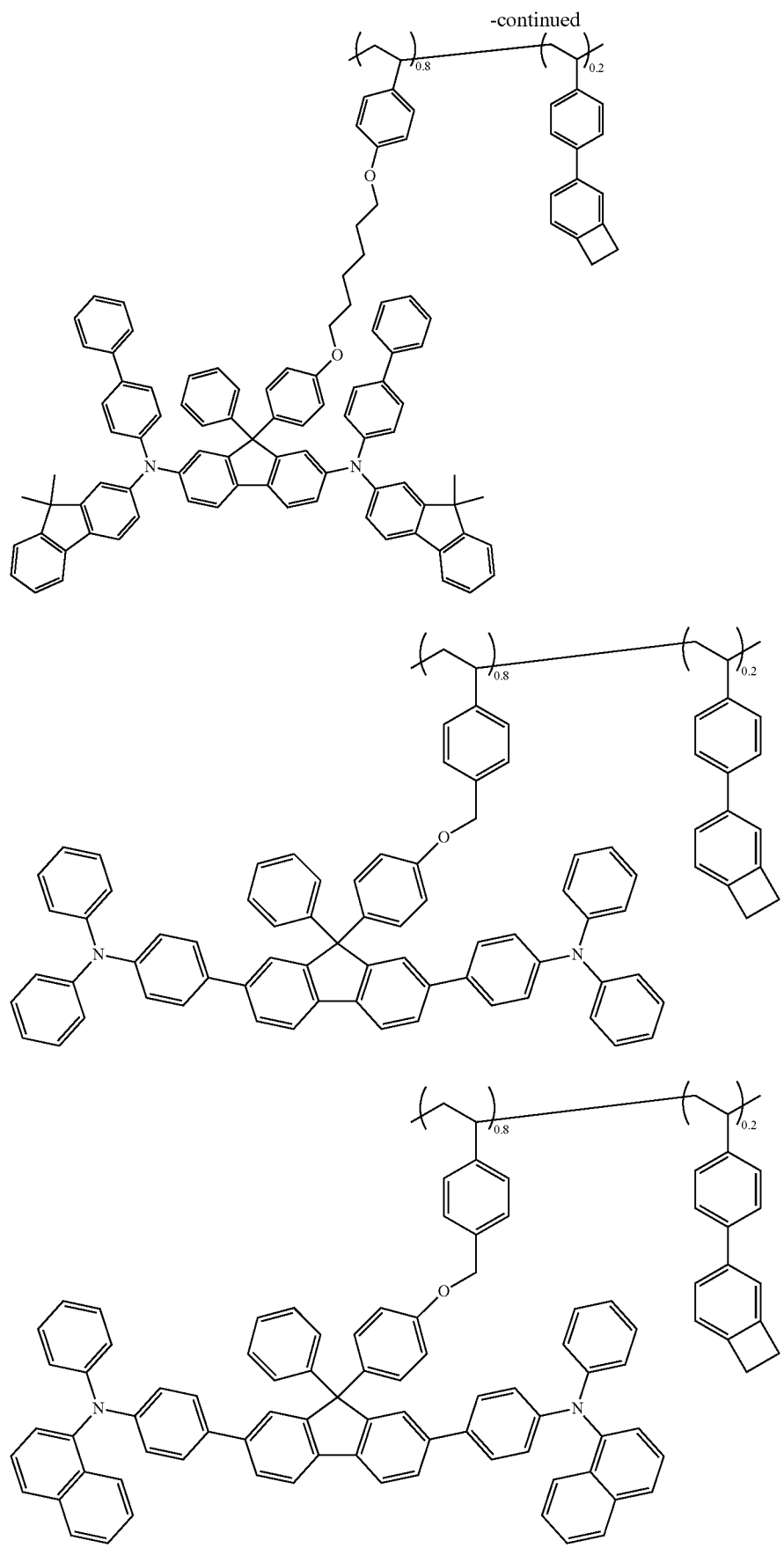

-continued
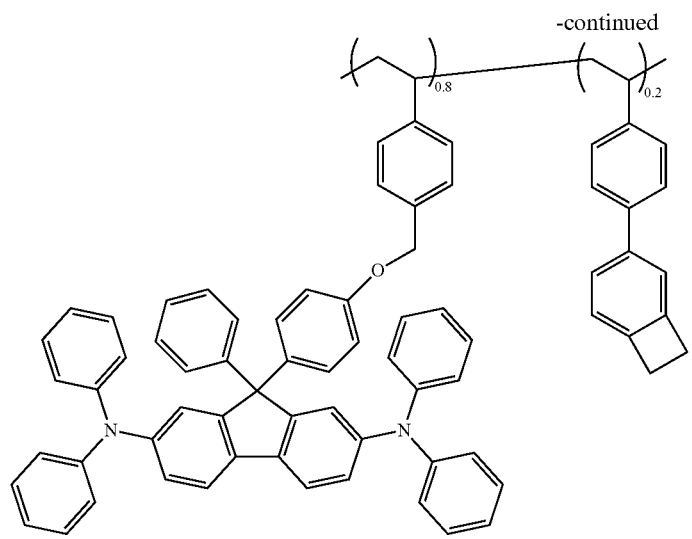
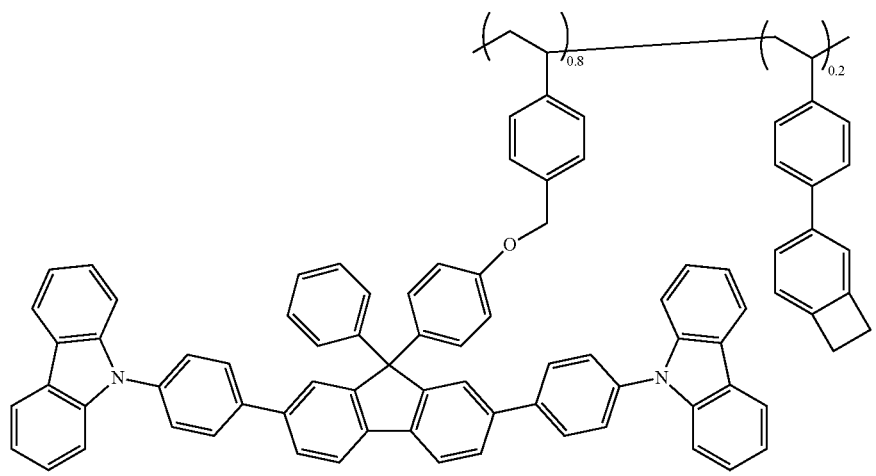
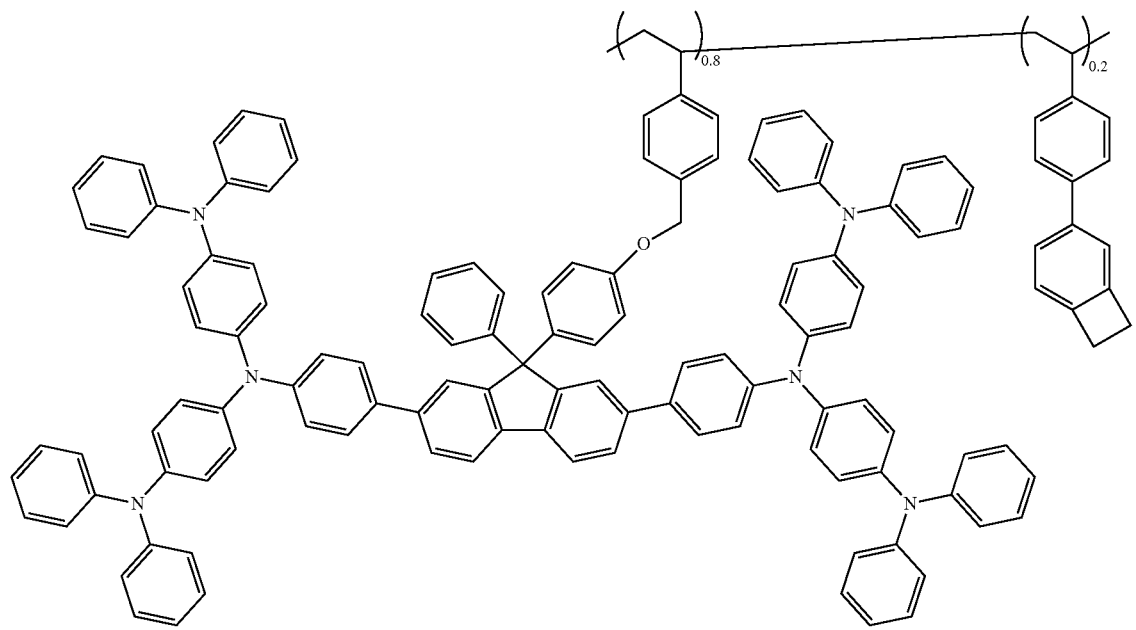

-continued
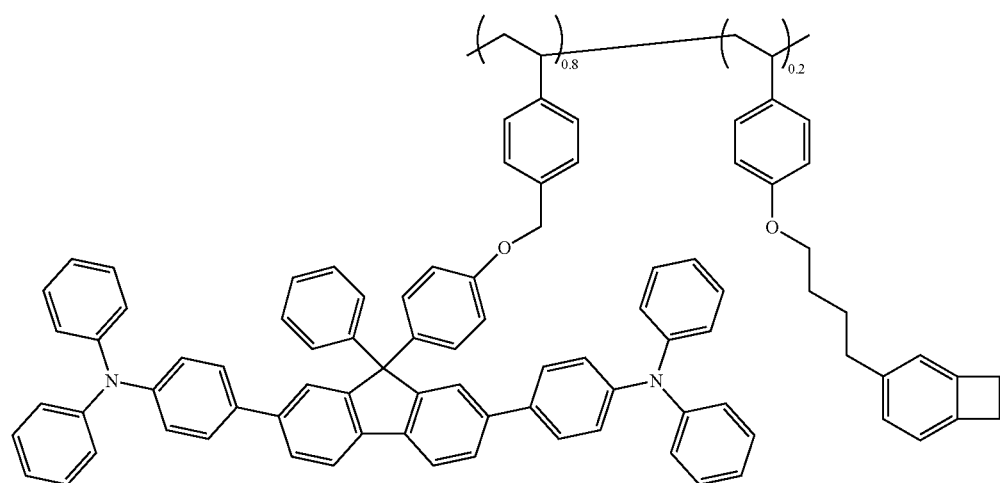
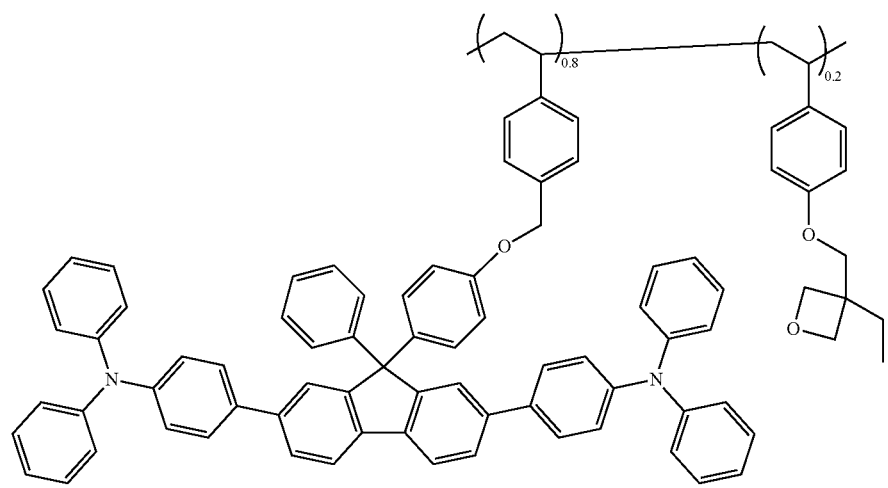
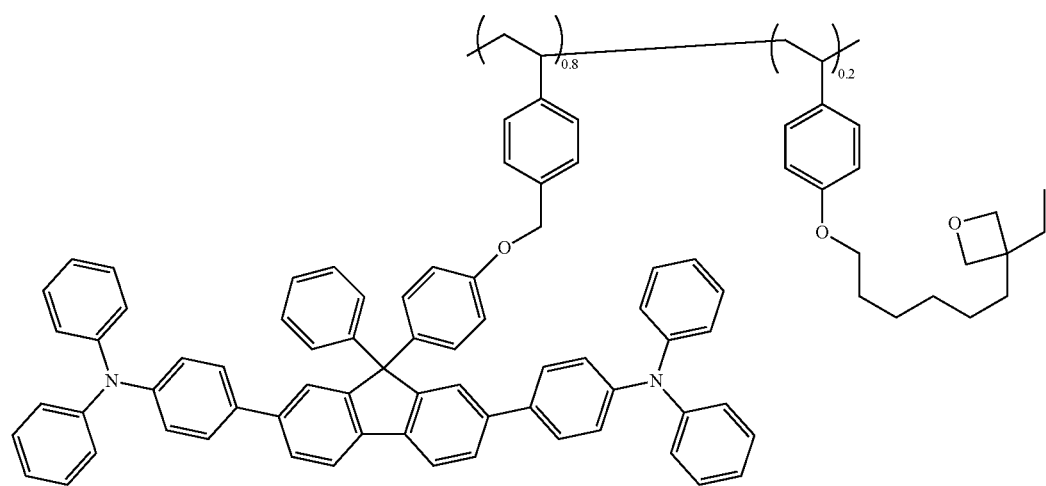

-continued
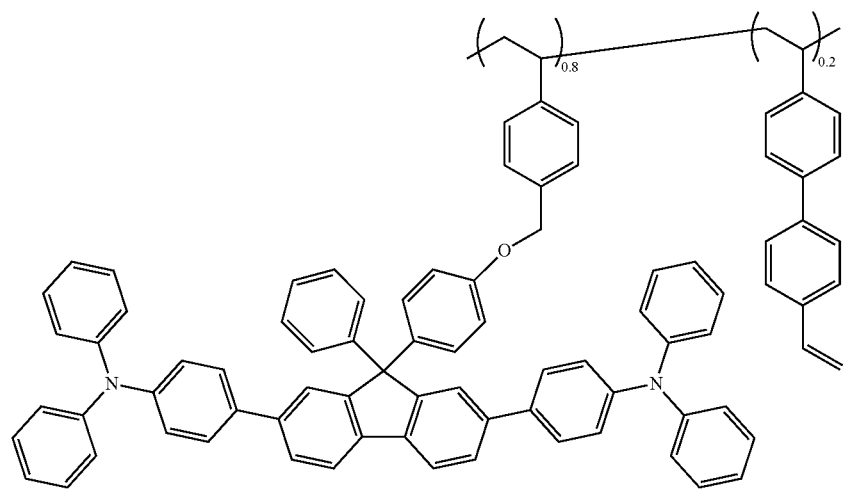
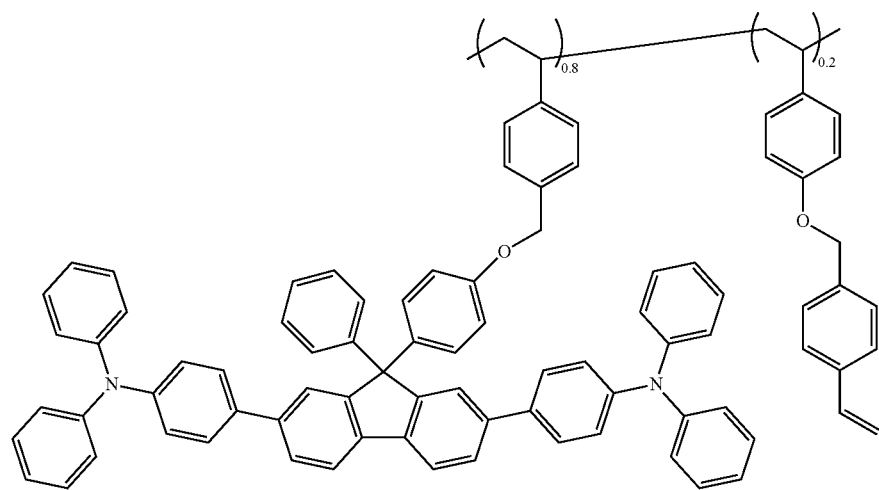
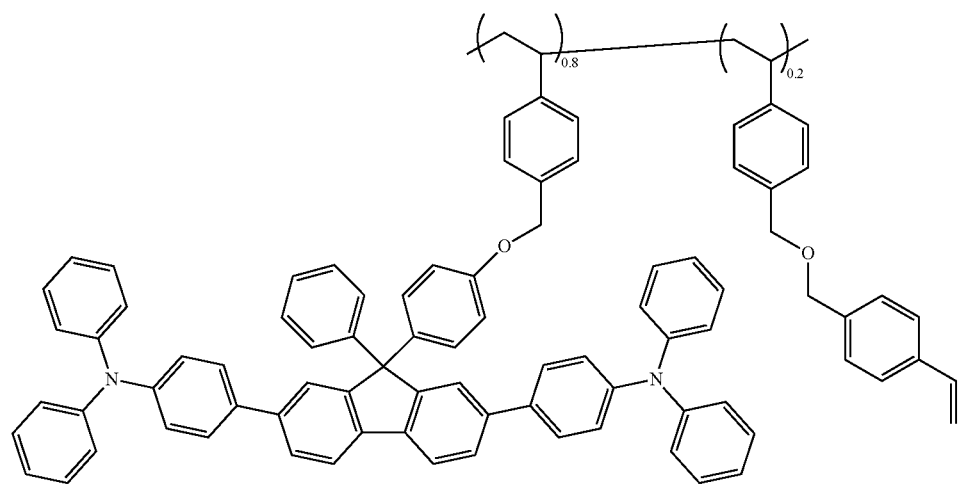

-continued
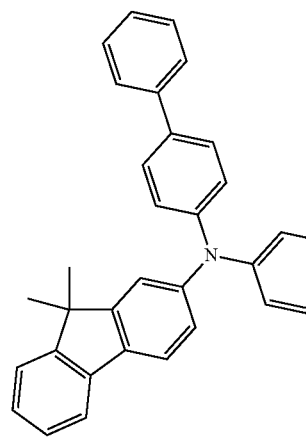
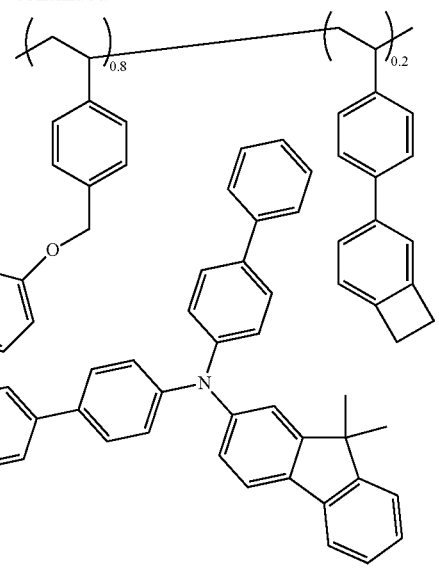
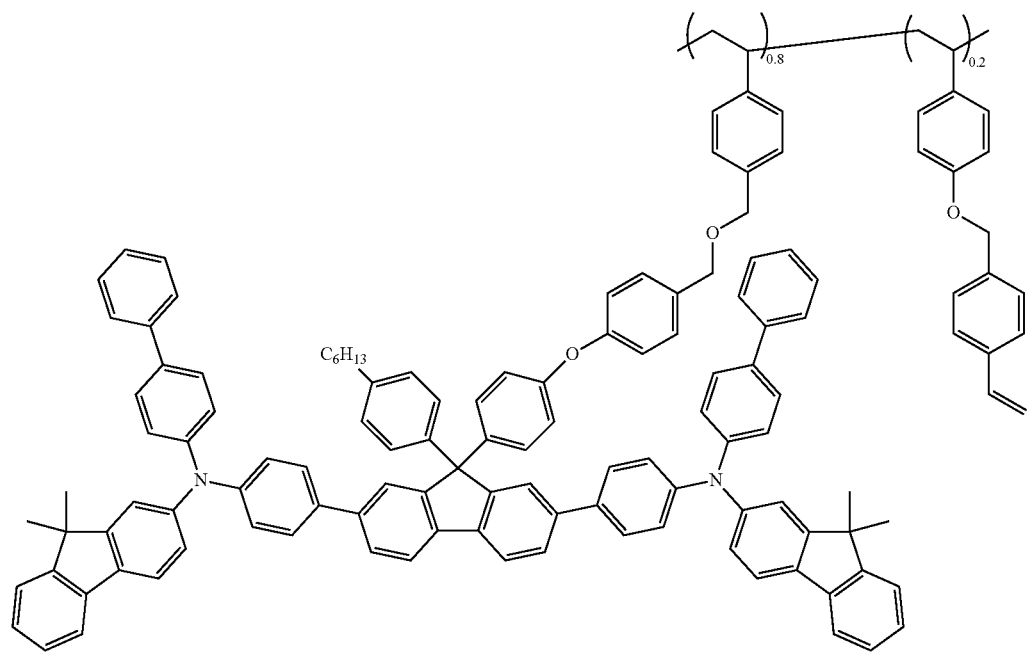

-continued
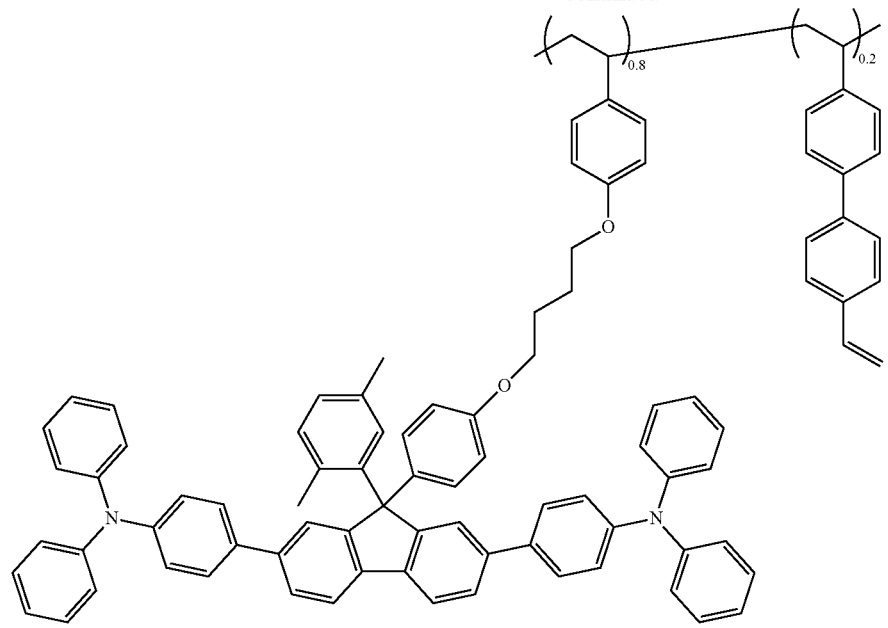
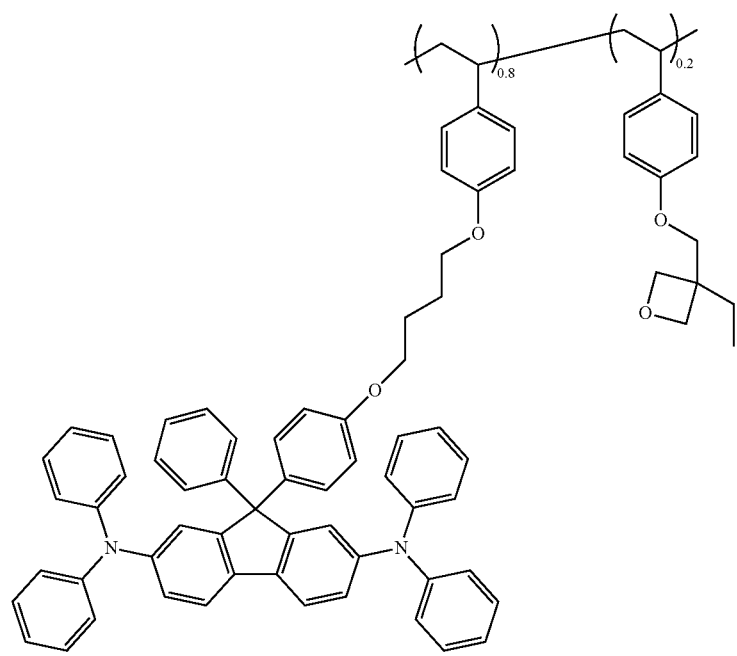

-continued
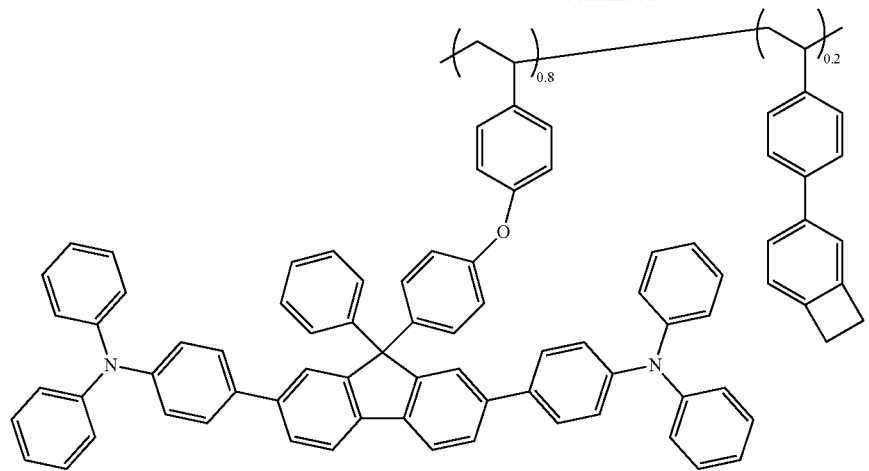
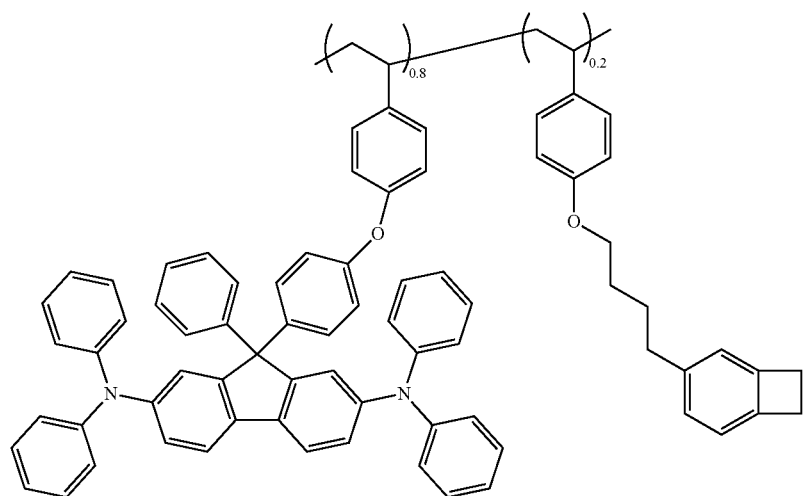
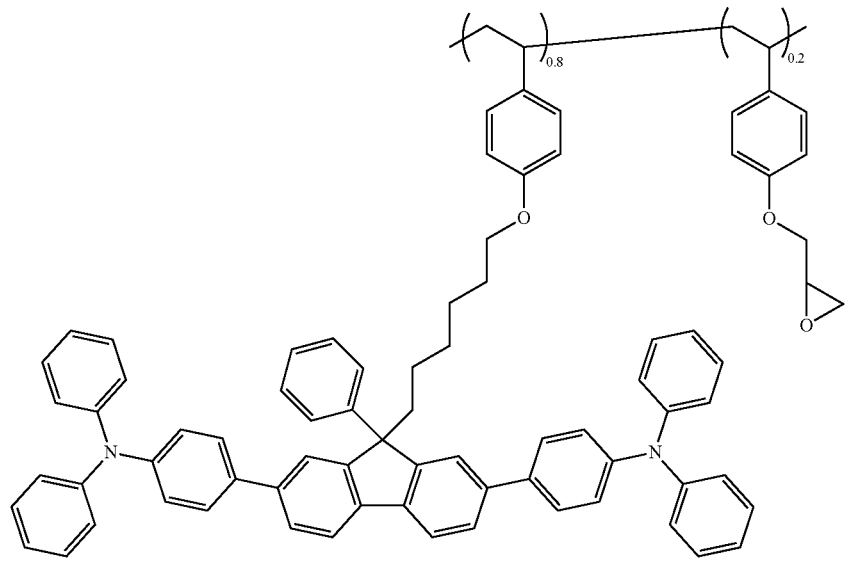

-continued
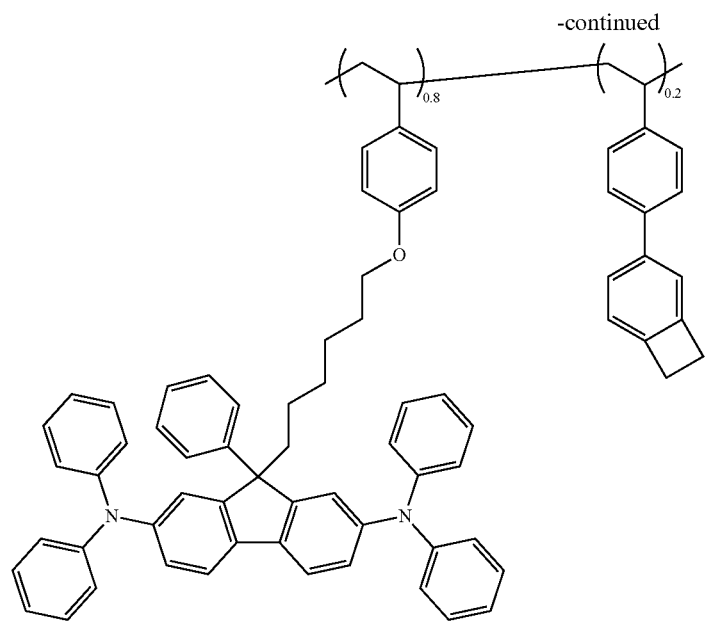
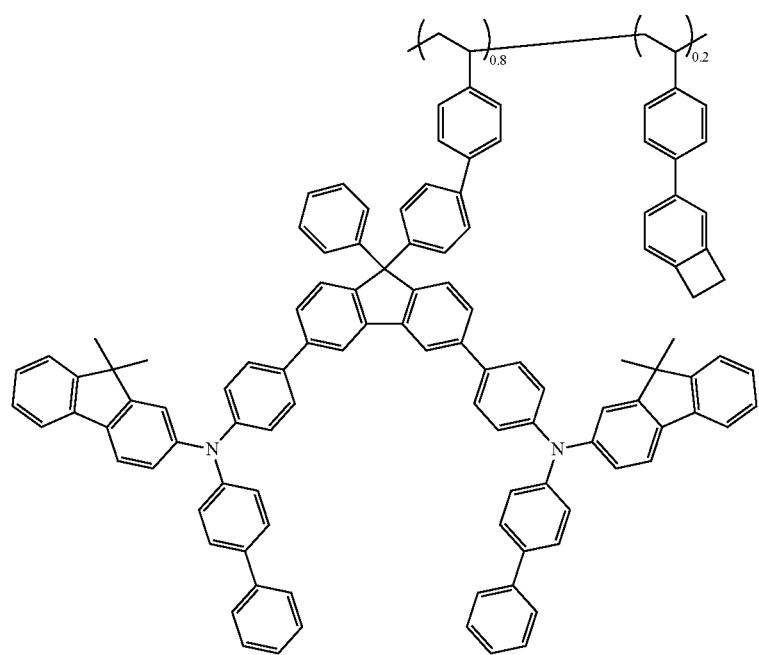

-continued
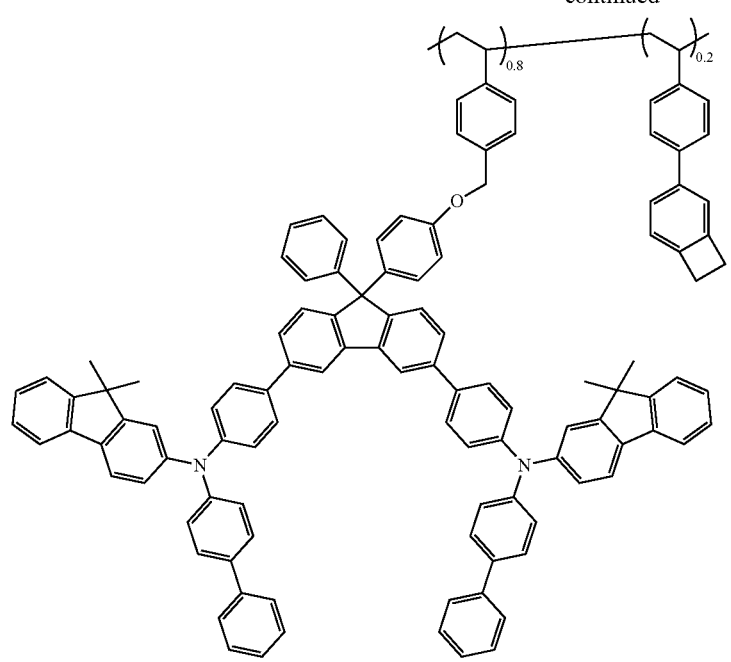
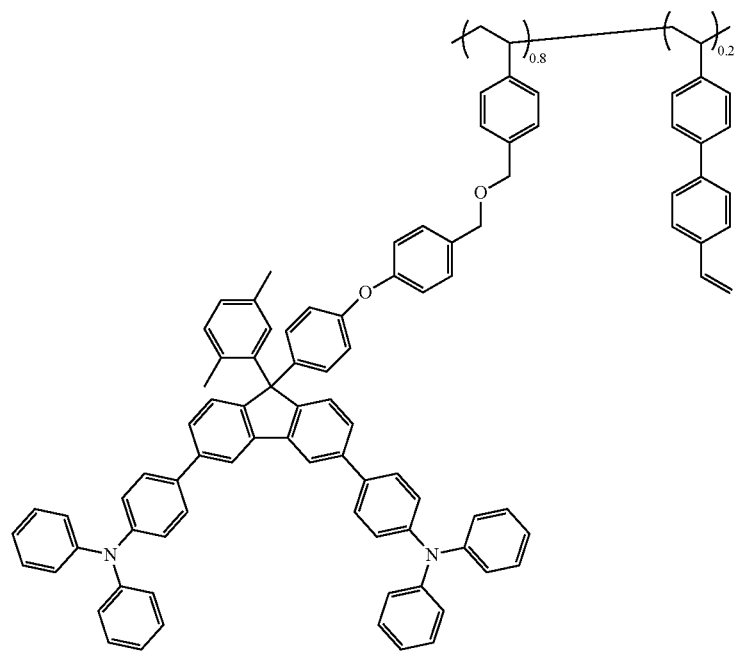

-continued
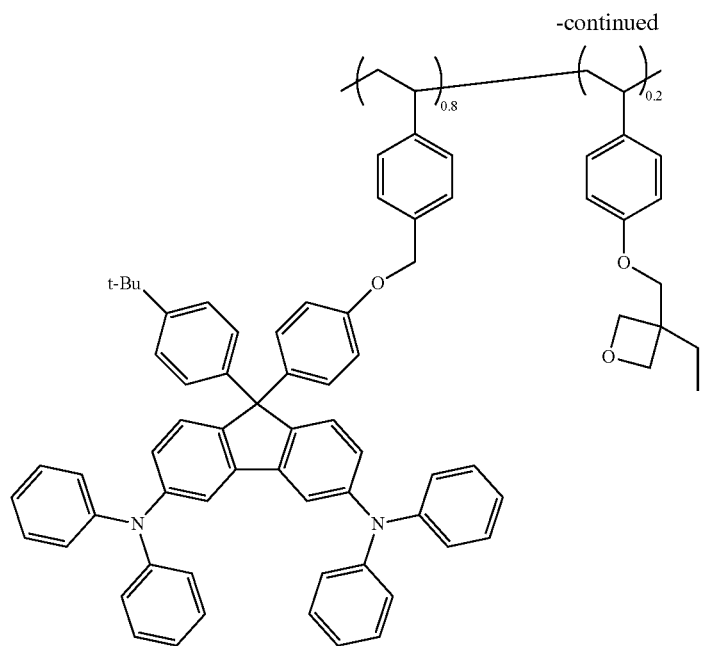
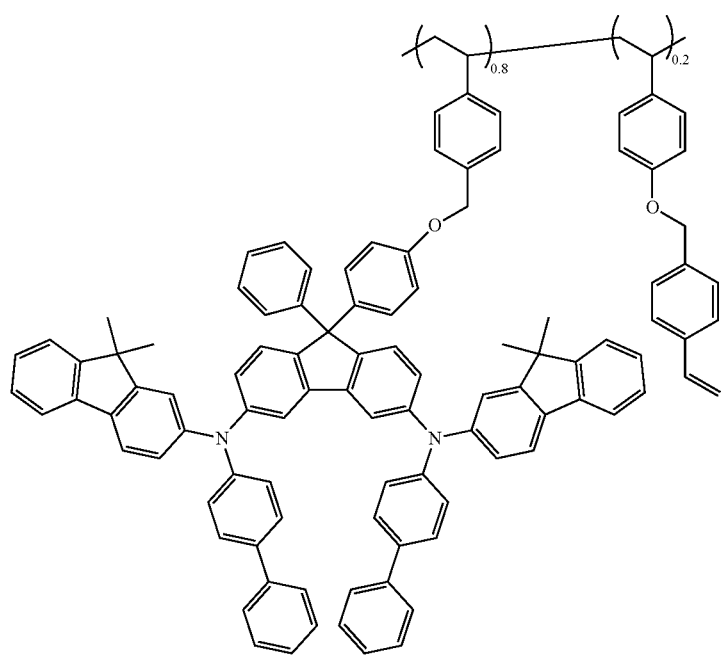

-continued

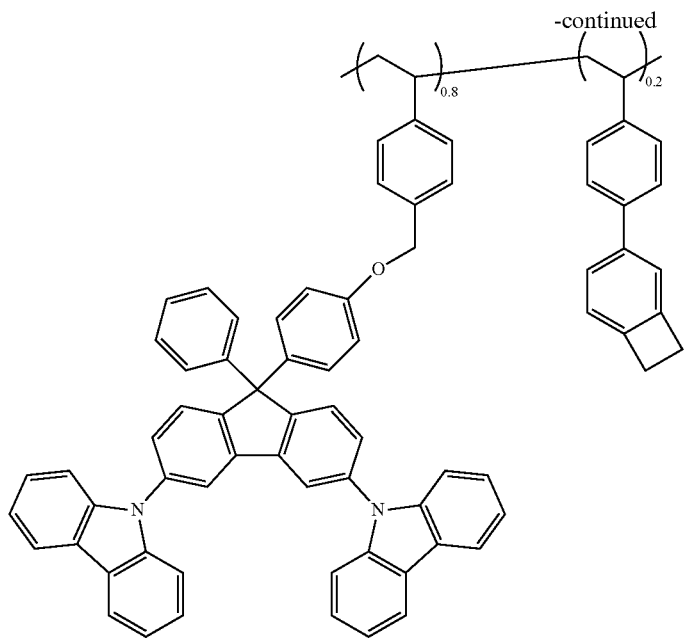

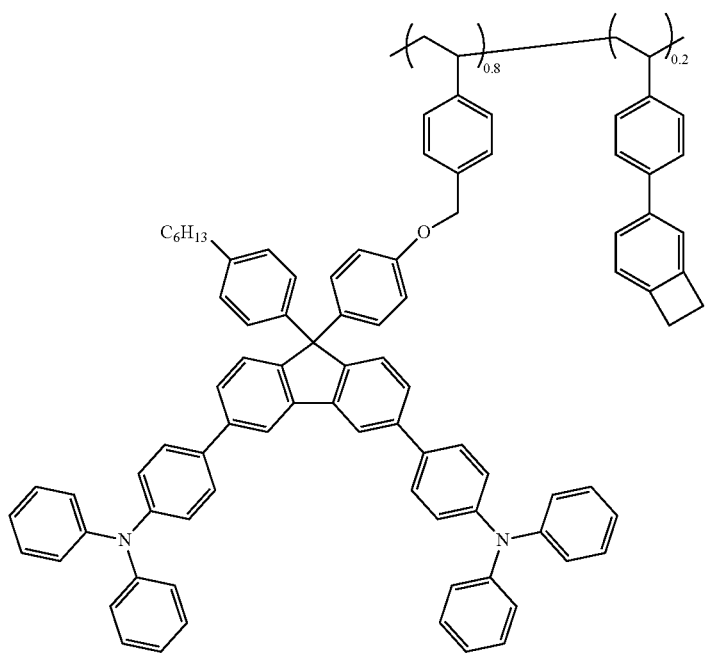

In one embodiment of the present specification, an end group of the polymer is hydrogen, a substituted or unsubstituted alkyl group, or a substituted or unsubstituted aryl group.

In one embodiment of the present specification, an end group of the polymer is an alkyl group unsubstituted or substituted with an alkyl group or a nitrile group; or an aryl group.

In one embodiment of the present specification, an end group of the polymer is a methyl group unsubstituted or substituted with a methyl group or a nitrile group; or a phenyl group.

The polymer according to one embodiment of the present application may be prepared using preparation methods to describe later.

For example, the polymer including the unit represented by Chemical Formula 1 and the unit represented by Chemical Formula 2 may be prepared as in the following Reaction Formula 1. Substituents may bond using methods known in the art, and types, positions or the number of the substituents may vary depending on technologies known in the art.

[Reaction Formula 1]

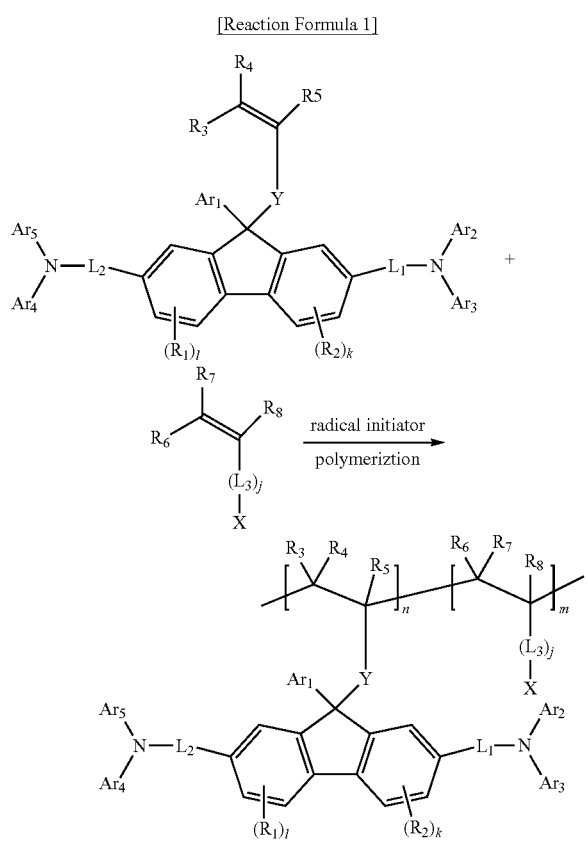

In the reaction formula, substituents have the same definitions as in Chemical Formulae 1 and 2.

In one embodiment of the present specification, the coating composition includes the polymer and a solvent.

In one embodiment of the present specification, the coating composition may be a liquid phase. The "liquid phase" means in a liquid state at room temperature and atmospheric pressure.

In one embodiment of the present specification, examples of the solvent may include chlorine-based solvents such as chloroform, methylene chloride, 1,2-dichloroethane, 1,1,2-trichloroethane, chlorobenzene or o-dichlorobenzene; ether-based solvents such as tetrahydrofuran or dioxane; aromatic hydrocarbon-based solvents such as toluene, xylene, trimethylbenzene or mesitylene; aliphatic hydrocarbon-based solvents such as cyclohexane, methylcyclohexane, n-pentane, n-hexane, n-heptane, n-octane, n-nonane or n-decane; ketone-based solvents such as acetone, methyl ethyl ketone or cyclohexanone; ester-based solvents such as ethyl acetate, butyl acetate or ethyl cellosolve acetate; polyalcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin or 1,2-hexanediol, and derivatives thereof; alcohol-based solvents such as methanol, ethanol, propanol, isopropanol or cyclohexanol; sulfoxide-based solvents such as dimethyl sulfoxide; amide-based solvents such as N-methyl-2-pyrrolidone or N,N-dimethylformamide; benzoate-based solvents such as methyl benzoate, butyl benzoate or 3-phenoxybenzoate; tetraline, and the like, however, the solvent is not limited thereto as long as it is a solvent capable of dissolving or dispersing the compound according to one embodiment of the present disclosure.

In another embodiment, the solvent may be used either alone as one type, or as a mixture mixing two or more solvent types.

In another embodiment, the solvent preferably has a boiling point of 40° C. to 250° C. and more preferably 60° C. to 230° C., however, the boiling point is not limited thereto.

In another embodiment, viscosity of the single or mixed solvent is preferably from 1 CP to 10 CP and more preferably from 3 CP to 8 CP, but is not limited thereto.

In another embodiment, the polymer including the unit represented by Chemical Formula 1 and the unit represented by Chemical Formula 2 in the coating composition preferably has a concentration of 0.1 wt/v % to 20 wt/v % and more preferably 0.5 wt/v % to 5 wt/v %, however, the concentration is not limited thereto.

In one embodiment of the present specification, the coating composition may further include one, two or more types of additives selected from the group consisting of thermal polymerization initiators and photopolymerization initiators.

Examples of the thermal polymerization initiator may include peroxides such as methyl ethyl ketone peroxide, methyl isobutyl ketone peroxide, acetylacetone peroxide, methylcyclohexanone peroxide, cyclohexanone peroxide, isobutyryl peroxide, 2,4-dichlorobenzoyl peroxide, bis-3,5,5-trimethyl hexanoyl peroxide, lauryl peroxide, benzoyl peroxide, p-chlorobenzoyl peroxide, dicumyl peroxide, 2,5-dimethyl-2,5-(t-butyloxy)-hexane, 1,3-bis(t-butylperoxyisopropyl)benzene, t-butyl cumyl peroxide, di-t-butyl peroxide, 2,5-dimethyl-2,5-(di-t-butylperoxy)hexane-3, tris-(t-butylperoxy)triazine, 1,1-di-t-butylperoxy-3,3,5-trimethylcyclohexane, 1,1-di-t-butylperoxycyclohexane, 2,2-di(t-butylperoxy)butane, 4,4-di-t-butylperoxy valeric acid n-butyl ester, 2,2-bis(4,4-t-butylperoxycyclohexyl) propane, t-butyl peroxyisobutyrate, di-t-butyl peroxyhexahydroterephthalate, t-butylperoxy-3,5,5-trimethylhexate, t-butyl peroxybenzoate or di-t-butyl peroxytrimethyl adipate; or azo-based such as azobis isobutylnitrile, azobis dimethylvaleronitrile or azobis cyclohexyl nitrile, but are not limited thereto.

Examples of the photopolymerization initiator may include acetophenone-based or ketal-based photopolymerization initiators such as diethoxyacetophenone, 2,2-dimethoxy-1,2-diphenyl ethan-1-one, 1-hydroxy-cyclohexyl-phenyl-ketone, 4-(2-hydroxyethoxy)phenyl-(2-hydroxy-2-propyl)ketone, 2-benzyl-2-dimethylamino-1-(4-morpholinophenyl)butanone-1,2-hydroxy-2-methyl-1-phenylpropan-1-one, 2-methyl-2-morpholino(4-methylthiophenyl) propan-1-one or 1-phenyl-1,2-propanedion-2-(o-ethoxycarbonyl)oxime; benzoin ether-based photopolymerization initiators such as benzoin, benzoin methyl ether, benzoin ethyl ether, benzoin isobutyl ether or benzoin isopropyl ether; benzophenone-based photopolymerization initiators such as benzophenone, 4-hydroxybenzophenone, 2-benzoylnaphthalene, 4-benzoylbiphenyl, 4-benzoyl phenyl ether, acrylated benzophenone or 1,4-benzoylbenzene; thioxanthone-based photopolymerization initiators such as 2-isopropylthioxanthone, 2-chlorothioxanthone, 2,4-dimethylthioxanthone, 2,4-diethylthioxanthone or 2,4-dichlorothioxanthone; and, as other photopolymerization initiators, ethyl anthraquinone, 2,4,6-trimethylbenzoyldiphenylphosphine oxide, 2,4,6-trimethylbenzoylphenylethoxyphosphine oxide, bis(2,4,6-trimethylbenzoyl)phenylphosphine oxide, bis(2,4-dimethoxybenzoyl)-2,4,4-trimethylpentylphosphine oxide, methylphenylglyoxyester, 9,10-phenanthrene, acridine-based compounds, triazine-based compounds, imidazole-based compounds, and the like. In addition, those having a photopolymerization facilitating effect may be used either alone or together with the photopolymerization initiator. Examples thereof may include triethanolamine, methyldiethanolamine, ethyl 4-dimethylaminobenzoate, isoamyl 4-dimethylaminobenzoate, (2-dimethylamino)ethyl benzoate, 4,4'-dimethylaminobenzophenone and the like, but are not limited thereto.

Another embodiment of the present specification provides an organic light emitting device formed using the coating composition.

In one embodiment of the present specification, the organic light emitting device includes a first electrode; a second electrode; and one or more organic material layers provided between the first electrode and the second electrode, and one or more layers of the organic material layers are formed using the coating composition including the polymer including the unit represented by Chemical Formula 1 and the unit represented by Chemical Formula 2.

In one embodiment of the present specification, the organic material layer formed using the coating composition including the polymer including the unit represented by Chemical Formula 1 and the unit represented by Chemical Formula 2 has a thickness of 10 nm to 100 nm and more preferably 20 nm to 50 nm.

In one embodiment of the present specification, the organic material layer formed using the coating composition is a hole transfer layer, a hole injection layer, or a layer carrying out hole transfer and hole injection at the same time.

In one embodiment of the present specification, the coating composition further includes a p-doping material.

In one embodiment of the present specification, the p-doping material includes $F_4TCNQ$; or a boron anion.

In one embodiment of the present specification, the p-doping material includes $F_4TCNQ$; or a boron anion, and the boron anion includes a halogen group.

In one embodiment of the present specification, the p-doping material includes $F_4TCNQ$; or a boron anion, and the boron anion includes F.

In one embodiment of the present specification, the p-doping material is selected from among the following structural formulae.

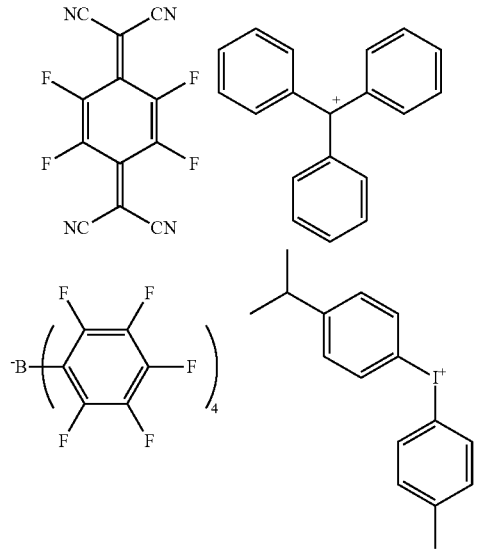

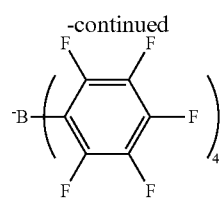

In one embodiment of the present specification, the organic light emitting device further includes one, two or more layers selected from the group consisting of a hole injection layer, a hole transfer layer, an electron transfer layer, an electron injection layer, an electron blocking layer and a hole blocking layer.

In one embodiment of the present specification, the first electrode is a cathode, and the second electrode is an anode.

In one embodiment of the present specification, the first electrode is an anode, and the second electrode is a cathode.

In another embodiment, the organic light emitting device may be an organic light emitting device having a structure in which an anode, one or more organic material layers and a cathode are consecutively laminated on a substrate (normal type).

In another embodiment, the organic light emitting device may be an organic light emitting device having a structure in a reverse direction in which a cathode, one or more organic material layers and an anode are consecutively laminated on a substrate (inverted type).

The organic material layer of the organic light emitting device of the present specification may be formed in a single layer structure, but may also be formed in a multilayer structure in which two or more organic material layers are laminated. For example, the organic light emitting device of the present disclosure may have a structure including a hole injection layer, a hole transfer layer, a light emitting layer, an electron transfer layer, an electron injection layer and the like as the organic material layer. However, the structure of the organic light emitting device is not limited thereto, and may include a smaller number of organic material layers.

For example, a structure of the organic light emitting device according to one embodiment of the present specification is illustrated in FIG. 1.

FIG. 1 illustrates a structure of the organic light emitting device in which an anode (201), a hole injection layer (301), a hole transfer layer (401), a light emitting layer (501), an electron injection and transfer layer (601) and a cathode (701) are consecutively laminated on a substrate (101).

In FIG. 1, the hole injection layer (301), the hole transfer layer (401) or the light emitting layer (501) is formed using the coating composition including the polymer including the unit represented by Chemical Formula 1 and the unit represented by Chemical Formula 2.

FIG. 1 illustrates the organic light emitting device, however, the organic light emitting device is not limited thereto.

When the organic light emitting device includes a plurality of organic material layers, the organic material layers may be formed with materials that are the same as or different from each other.

The organic light emitting device of the present specification may be manufactured using materials and methods known in the art, except that one or more layers of the organic material layers are formed using the coating composition including the compound.

For example, the organic light emitting device of the present specification may be manufactured by consecutively laminating an anode, an organic material layer and a cathode on a substrate. Herein, the organic light emitting device may be manufactured by forming an anode on a substrate by depositing a metal, a metal oxide having conductivity, or an alloy thereof using a physical vapor deposition (PVD) method such as sputtering or e-beam evaporation, forming an organic material layer including a hole injection layer, a hole transfer layer, a light emitting layer and an electron transfer layer thereon, and then depositing a material capable of being used as a cathode thereon. In addition to such a method, the organic light emitting device may also be manufactured by consecutively depositing a cathode material, an organic material layer and an anode material on a substrate.

Another embodiment of the present specification provides a method for manufacturing an organic light emitting device formed using the coating composition.

Specifically, in one embodiment of the present specification, the method for manufacturing an organic light emitting device includes preparing a substrate; forming a cathode or an anode on the substrate; forming one or more organic material layers on the cathode or the anode; and forming an anode or a cathode on the organic material layer, wherein one or more layers of the organic material layers are formed using the coating composition.

In one embodiment of the present specification, the organic material layer formed using the coating composition is formed using spin coating.

In another embodiment, the organic material layer formed using the coating composition is formed using a printing method.

In an embodiment of the present specification, examples of the printing method include inkjet printing, nozzle printing, offset printing, transfer printing, screen printing or the like, but are not limited thereto.

The coating composition according to one embodiment of the present specification is suited for a solution process due to its structural properties and may be formed using a printing method, and therefore, is economically effective in terms of time and costs when manufacturing a device.

In one embodiment of the present specification, the forming of an organic material layer formed using the coating composition includes coating the coating composition on the cathode or the anode; and heat treating or light treating the coated coating composition.

In one embodiment of the present specification, the time of heat treating the organic material layer formed using the coating composition is preferably within 1 hour and more preferably within 30 minutes.

In one embodiment of the present specification, the atmosphere of heat treating the organic material layer formed using the coating composition is preferably inert gas such as argon or nitrogen.

When the heat treatment or the light treatment is included in the forming of an organic material layer formed using the coating composition, an organic material layer including a thin-filmed structure by a plurality of the fluorene groups included in the coating composition forming crosslinkage may be provided. In this case, being dissolved by a solvent deposited on a surface of the organic material layer formed using the coating composition, or being morphologically affected or decomposed may be prevented.

Accordingly, when the organic material layer formed using the coating composition is formed including the heat treatment or the light treatment, resistance for the solvent increases, and multiple layers may be formed by repeatedly performing solution deposition and crosslinking methods, and as a result, lifetime properties of a device may be enhanced by increasing stability.

In one embodiment of the present specification, the coating composition including the compound may use a coating composition mixed to a polymer binder and dispersed.

In one embodiment of the present specification, as the polymer binder, those that do not extremely inhibit charge transfer are preferred, and those that do not have strong absorption for visible light are preferably used. Examples of the polymer binder may include poly(N-vinylcarbazole), polyaniline and derivatives thereof, polythiophene and derivatives thereof, poly(p-phenylenevinylene) and derivatives thereof, poly(2,5-thienylenevinylene) and derivatives thereof, polycarbonate, polyacrylate, polymethyl acrylate, polymethyl methacrylate, polystyrene, polyvinyl chloride, polysiloxane and the like.

In addition, by the polymer according to one embodiment of the present specification including carbazole and an amine group, the compound may be included alone in the organic material layer, thin-filming may be conducted through heat treating of light treating a coating composition including the compound, or a copolymer may be included using a coating composition mixed with other monomers. In addition, a copolymer or a mixture may be included using a coating composition mixed with other polymers.

As the anode material, materials having large work function are normally preferred so that hole injection to an organic material layer is smooth. Specific examples of the anode material capable of being used in the present disclosure include metals such as vanadium, chromium, copper, zinc and gold, or alloys thereof; metal oxides such as zinc oxide, indium oxide, indium tin oxide (ITO) and indium zinc oxide (IZO); combinations of metals and oxides such as ZnO:Al or $SnO_2$:Sb; conductive polymers such as poly(3-methylthiophene), poly[3,4-(ethylene-1,2-dioxy)thiophene] (PEDOT), polypyrrole and polyaniline, and the like, but are not limited thereto.

As the cathode material, materials having small work function are normally preferred so that electron injection to an organic material layer is smooth. Specific examples of the cathode material include metals such as magnesium, calcium, sodium, potassium, titanium, indium, yttrium, lithium, gadolinium, aluminum, silver, tin and lead, or alloys thereof; multilayer structure materials such as LiF/Al or $LiO_2$/Al, and the like, but are not limited thereto.

The hole injection layer is a layer that injects holes from an electrode, and the hole injection material is preferably a compound that has an ability to transfer holes and thereby has a hole injection effect in an anode and an excellent hole injection effect for a light emitting layer or a light emitting material, prevents excitons generated in the light emitting layer from moving to an electron injection layer or an electron injection material, and in addition thereto, has an excellent thin film forming ability. The highest occupied molecular orbital (HOMO) of the hole injection material is preferably in between the work function of an anode material and the HOMO of surrounding organic material layers. Specific examples of the hole injection material include metal porphyrins, oligothiophene, arylamine-based organic materials, hexanitrile hexaazatriphenylene-based organic materials, quinacridone-based organic materials, perylene-based organic materials, anthraquinone, and polyaniline- and polythiophene-based conductive polymers, and the like, but are not limited thereto.

The hole transfer layer is a layer that receives holes from a hole injection layer and transfers the holes to a light emitting layer, and as the hole transfer material, materials capable of receiving holes from an anode or a hole injection layer, moving the holes to a light emitting layer, and having high mobility for the holes are suited. Specific examples thereof include arylamine-based organic materials, conductive polymers, block copolymers having conjugated parts and non-conjugated parts together, and the like, but are not limited thereto.

The light emitting material is a material capable of emitting light in a visible light region by receiving holes and electrons from a hole transfer layer and an electron transfer layer, respectively, and binding the holes and the electrons, and is preferably a material having favorable quantum efficiency for fluorescence or phosphorescence. Specific examples thereof include 8-hydroxyquinoline aluminum complexes ($Alq_3$); carbazole-based compounds; dimerized styryl compounds; BAlq; 10-hydroxybenzoquinoline-metal compounds; benzoxazole-, benzothiazole- and benzimidazole-based compounds; poly(p-phenylenevinylene) (PPV)-based polymers; spiro compounds; polyfluorene, rubrene, and the like, but are not limited thereto.

The light emitting layer may include a host material and a dopant material. The host material includes fused aromatic ring derivatives, heteroring-containing compounds or the like. Specifically, the fused aromatic ring derivative includes anthracene derivatives, pyrene derivatives, naphthalene derivatives, pentacene derivatives, phenanthrene compounds, fluoranthene compounds and the like, and the heteroring-containing compound includes carbazole derivatives, dibenzofuran derivatives, ladder-type furan compounds, pyrimidine derivatives and the like, however, the material is not limited thereto.

The dopant material includes aromatic amine derivatives, styrylamine compounds, boron complexes, fluoranthene compounds, metal complexes and the like. Specifically, the aromatic amine derivative is a fused aromatic ring derivative having a substituted or unsubstituted arylamino group and includes arylamino group-including pyrene, anthracene, chrysene, peryflanthene and the like, and the styrylamine compound is a compound in which substituted or unsubstituted arylamine is substituted with at least one arylvinyl group, and one, two or more substituents selected from the group consisting of an aryl group, a silyl group, an alkyl group, a cycloalkyl group and an arylamino group are substituted or unsubstituted. Specifically, styrylamine, styryldiamine, styryltriamine, styryltetramine or the like is included, however, the styrylamine compound is not limited thereto. In addition, the metal complex includes iridium complexes, platinum complexes or the like, but is not limited thereto.

The electron transfer layer is a layer that receives electrons from an electron injection layer and transfers the electrons to a light emitting layer, and as the electron transfer material, materials capable of favorably receiving electrons from a cathode, moving the electrons to a light emitting layer, and having high mobility for the electrons are suited. Specific examples thereof include Al complexes of 8-hydroxyquinoline; complexes including $Alq_3$; organic radical compounds; hydroxyflavon-metal complexes, and the like, but are not limited thereto. The electron transfer layer may be used together with any desired cathode material as used in the art. Particularly, examples of the suitable cathode material include common materials that have small work function, and in which an aluminum layer or a silver layer follows. Specifically, the cathode material includes cesium, barium, calcium, ytterbium and samarium, and in each case, an aluminum layer or a silver layer follows.

The electron injection layer is a layer that injects electrons from an electrode, and the electron injection material is preferably a compound that has an ability to transfer electrons, has an electron injection effect from a cathode, has an excellent electron injection effect for a light emitting layer or a light emitting material, prevents excitons generated in the light emitting layer from moving to a hole injection layer, and in addition thereto, has an excellent thin film forming ability. Specific examples thereof include fluorenone, anthraquinodimethane, diphenoquinone, thiopyran dioxide, oxazole, oxadiazole, triazole, imidazole, perylene tetracarboxylic acid, fluorenylidene methane, anthrone or the like, and derivatives thereof, metal complex compounds, nitrogen-containing 5-membered ring derivatives, and the like, but are not limited there.

The metal complex compound includes 8-hydroxyquinolinato lithium, bis(8-hydroxyquinolinato)zinc, bis(8-hydroxyquinolinato) copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato) chlorogallium, bis(2-methyl-8-quinolinato) (o-cresolato) gallium, bis(2-methyl-8-quinolinato) (1-naphtholato) aluminum, bis(2-methyl-8-quinolinato) (2-naphtholato)gallium and the like, but is not limited thereto.

The hole blocking layer is a layer blocking holes from reaching a cathode, and generally, may be formed under the same condition as the hole injection layer. Specifically, oxadiazole derivatives or triazole derivatives, phenanthroline derivatives, BCP, aluminum complexes and the like are included, however, the material is not limited thereto.

The organic light emitting device according to the present specification may be a top-emission type, a bottom-emission type or a dual-emission type depending on the materials used.

In one embodiment of the present specification, the polymer may be included in an organic solar cell or an organic transistor in addition to the organic light emitting device.

Hereinafter, the present specification will be described in detail with reference to examples in order to specifically describe the present specification. However, the examples according to the present specification may be modified to various different forms, and the scope of the present specification is not to be construed as being limited to the examples described below. Examples of the present specification are provided in order to more fully describe the present specification to those having average knowledge in the art.

PREPARATION EXAMPLE

Preparation Example 1. Synthesis of Compound A (1) Synthesis of Intermediate 3

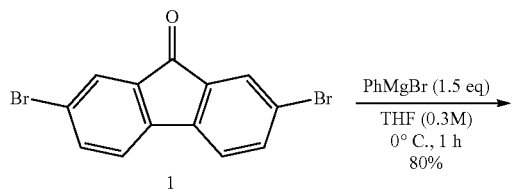

-continued

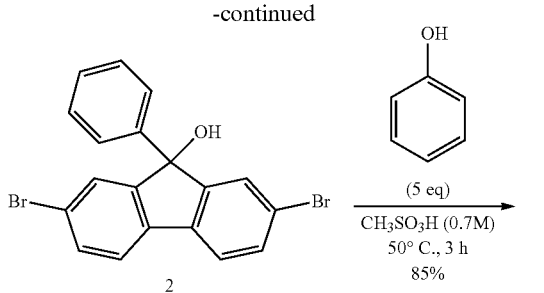

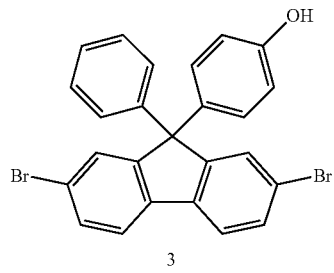

Synthesis of Intermediate 2: After introducing 2,7-dibromo-9-fluorenone (1) (20.2 g, 60 mmol) to a flask and dissolving in anhydrous tetrahydrofuran (200 mL), the flask was placed in an ice water bath. Phenylmagnesium bromide (3 M in ether, 30 mL, 90 mmol) was slowly introduced thereto, and the result was stirred for 1 hour at 0° C. The reaction was stopped using $NH_4Cl$ (aq), and the result was extracted with diethyl ether and water. After collecting the organic layer, the organic layer was dried using $MgSO_4$ and filtered. The filtrate was dried using a vacuum rotary evaporator to remove the organic solvent, and the residue was column purified to obtain Intermediate 2 (20 g, 80% yield).

Synthesis of Intermediate 3: Intermediate 2 (16.6 g, 40 mmol), phenol (18.8 g, 200 mmol) and methanesulfonic acid (57 mL) were introduced to a round bottom flask, and stirred for 3 hours at 50° C. After the reaction was finished, distilled water (57 mL) was introduced to the mixture, and the result was stirred for 30 minutes. After filtering, filtered solids were sufficiently washed with distilled water, and then dried for one day in a 50° C. vacuum oven to obtain Intermediate 3 (17 g, 85% yield).

(2) Synthesis of Intermediate 4

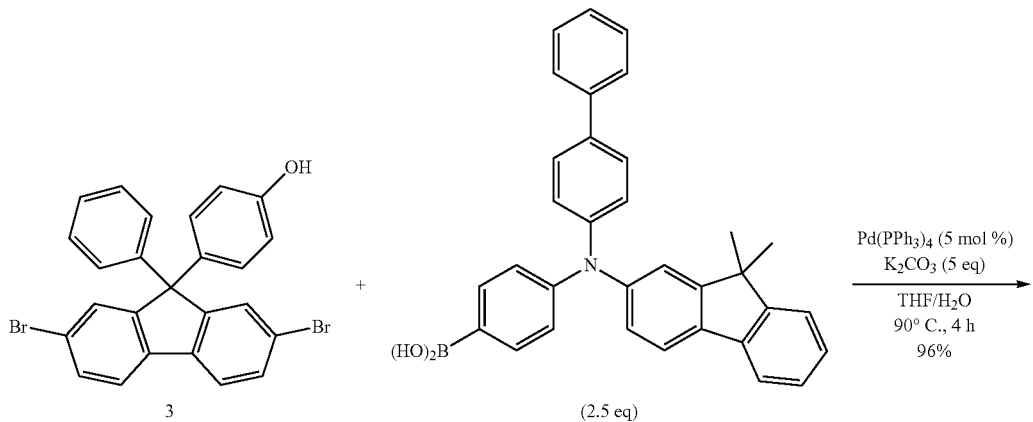

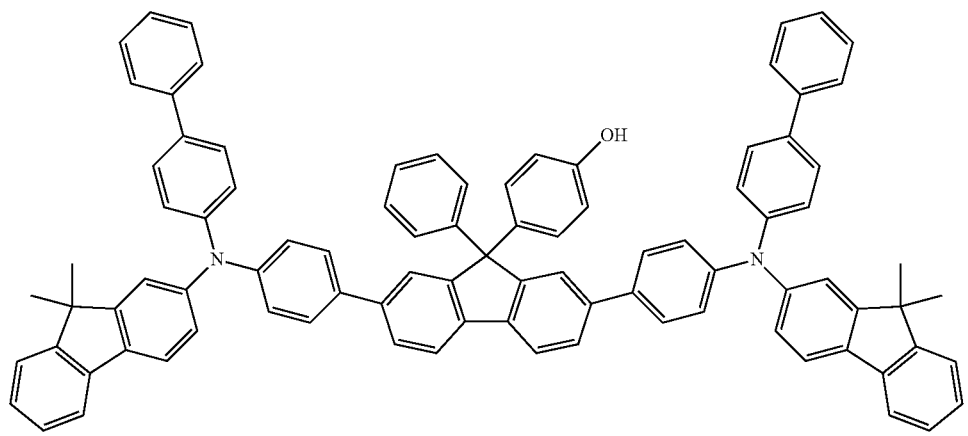

Intermediate 3 (2.46 g, 5 mmol), 4-biphenyl-4-yl(9,9-dimethyl-9H-fluoren-2-yl)amino)phenylboronic acid (6 g, 12.5 mmol), Pd(PPh$_3$)$_4$(289 mg, 0.25 mmol) and K$_2$CO$_3$ (3.46 g, 25 mmol) were introduced to a round bottom flask, and inside the flask was substituted with nitrogen. Tetrahydrofuran (THF) (20 mL) and H$_2$O (5 mL) were introduced thereto, and the result was stirred for 4 hours at 90° C. After the reaction was terminated, the result was extracted with ethyl acetate and water. After collecting the organic layer, the organic layer was dried using MgSO$_4$ and filtered. The filtrate was dried using a vacuum rotary evaporator to remove the organic solvent, and the residue was column purified to obtain Intermediate 4 (5.9 g, 96% yield).

(3) Synthesis of Intermediate 5

After introducing Intermediate 4 (2.4 g, 2 mmol), cesium carbonate (652 mg, 2 mmol) and 4-vinylbenzyl chloride (0.34 mL, 2.4 mmol) to a round bottom flask, anhydrous dimethylformamide (DMF) (10 mL) was introduced thereto, and the result was stirred for 4 hours at 60° C. After the reaction was terminated, the result was extracted with ethyl acetate and water. After collecting the organic layer, the organic layer was dried using MgSO$_4$ and filtered. The filtrate was dried using a vacuum rotary evaporator to remove the organic solvent, and the residue was column purified to obtain Intermediate 5 (1.7 g, 65% yield).

NMR measurement value of Intermediate 5: $^1$H NMR (500 MHz, CDCl$_3$) δ 7.82 (d, 2H), 7.66 (d, 2H), 7.64-7.58 (m, 9H), 7.54-7.47 (m, 8H), 7.46-7.38 (m, 8H), 7.37-7.30 (m, 8H), 7.18-7.00 (m, 18H), 7.11 (d, 2H), 6.85 (d, 2H), 6.70 (dd, 1H), 5.73 (d, 1H), 5.22 (d, 1H), 4.99 (s, 2H), 1.45 (s, 12H)

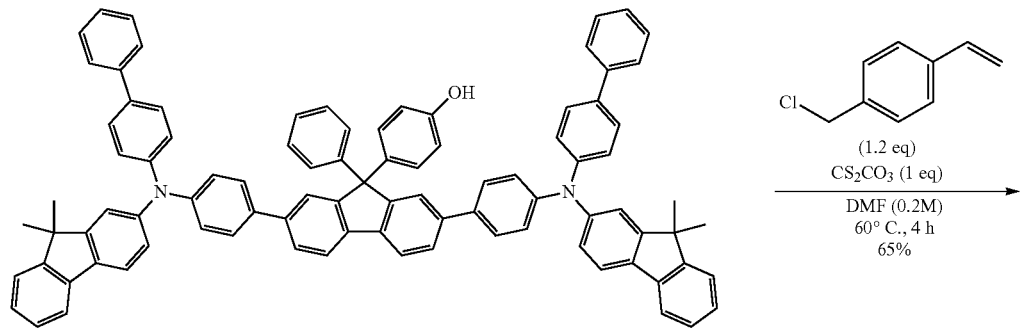

4

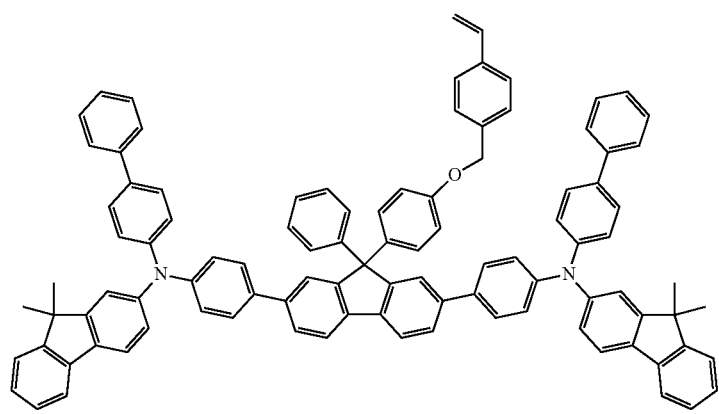

5

(4) Synthesis of Compound A

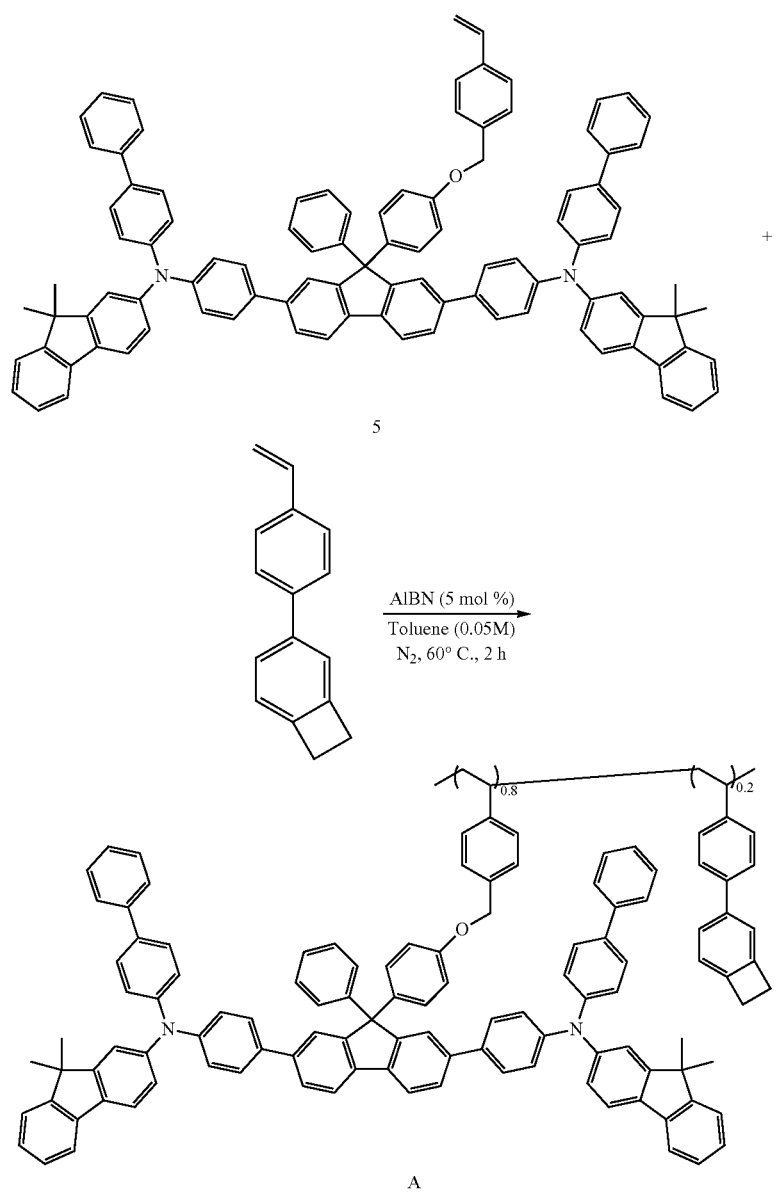

Intermediate 5 (1.06 g, 0.8 mmol), 3-(4-vinylphenyl) bicyclo[4.2.0]octa-1(6),2,4-triene (41 mg, 0.2 mmol) and azobisisobutyronitrile (6.6 mg, 0.04 mmol) were introduced to a round bottom flask, and then dissolved in anhydrous toluene (16 mL) under the nitrogen atmosphere. The result was stirred for 2 hours at 60° C. After the reaction was terminated, ethyl acetate (4 mL) was introduced thereto. The precipitates were filtered and washed with ethyl acetate. Obtained solids were dried to obtain Compound A (770 mg, 70% yield). (Mw=31,870, Mn=15,692)

GPC data of Compound A are shown in FIG. 4.

Preparation Example 2. Syntheses of Compound B and Compound C (1) Synthesis of Intermediate 6

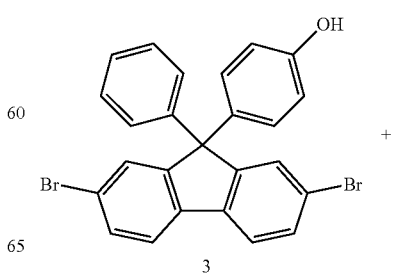

(2) Synthesis of Intermediate 7

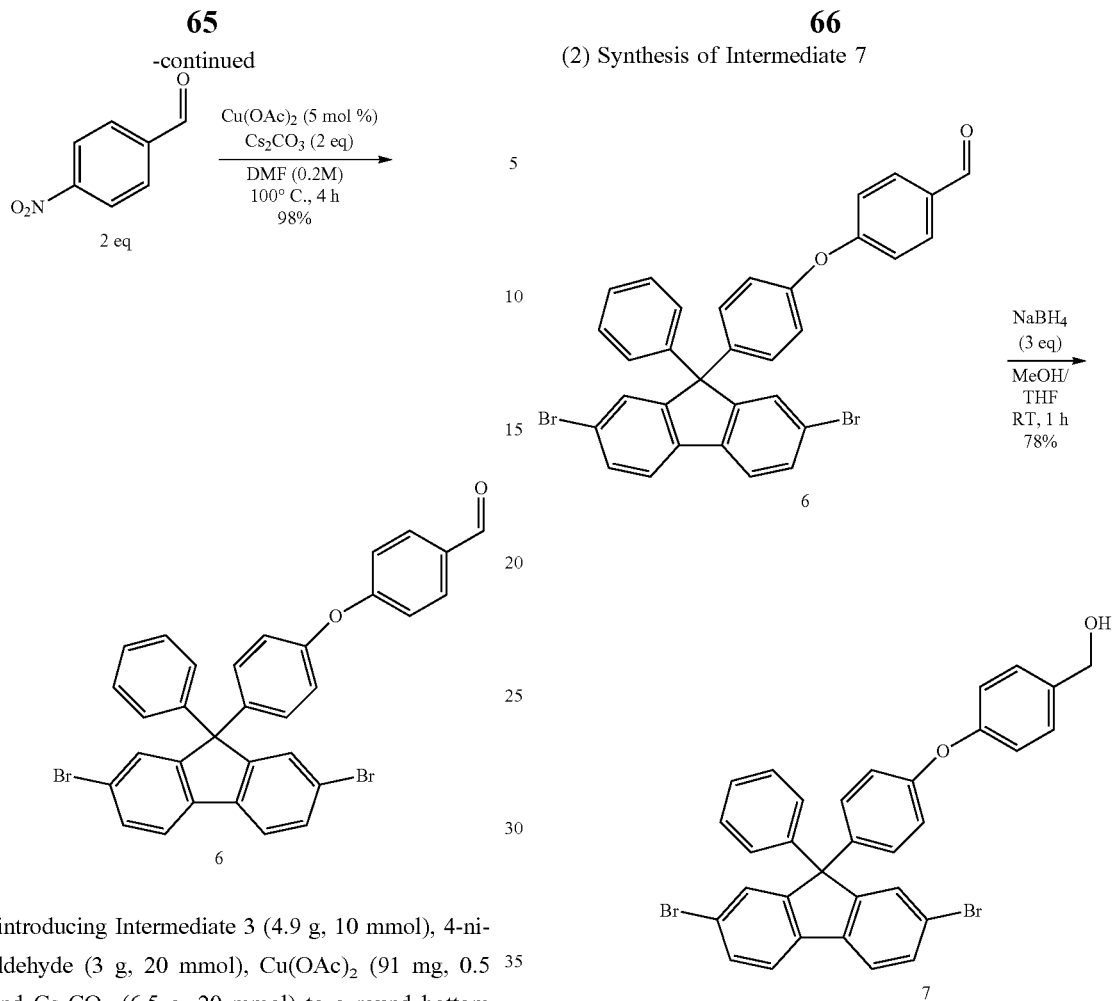

After introducing Intermediate 3 (4.9 g, 10 mmol), 4-nitrobenzaldehyde (3 g, 20 mmol), Cu(OAc)$_2$ (91 mg, 0.5 mmol) and Cs$_2$CO$_3$ (6.5 g, 20 mmol) to a round bottom flask, dimethylformamide (DMF) (50 mL) was introduced thereto. The result was stirred for 4 hours at 100° C. The result was cooled to room temperature, and then extracted with ethyl acetate and water. After collecting the organic layer, the organic layer was dried using MgSO$_4$ and filtered. The filtrate was dried using a vacuum rotary evaporator to remove the organic solvent, and the residue was column purified to obtain Intermediate 6 (5.8 g, 98% yield).

Intermediate 6 (2.4 g, 4 mmol) was introduced to a round bottom flask, and dissolved in methanol (MeOH) (10 mL) and THF (10 mL). To the reaction mixture, sodium borohydride (300 mg, 8 mmol) was added little by little, and the result was stirred for 30 minutes at room temperature. After the reaction was terminated, the result was extracted with ethyl acetate and water. After collecting the organic layer, the organic layer was dried using MgSO$_4$ and filtered. The filtrate was dried using a vacuum rotary evaporator to obtain Intermediate 7 (1.9 g, 78% yield).

(3) Synthesis of Intermediate 8

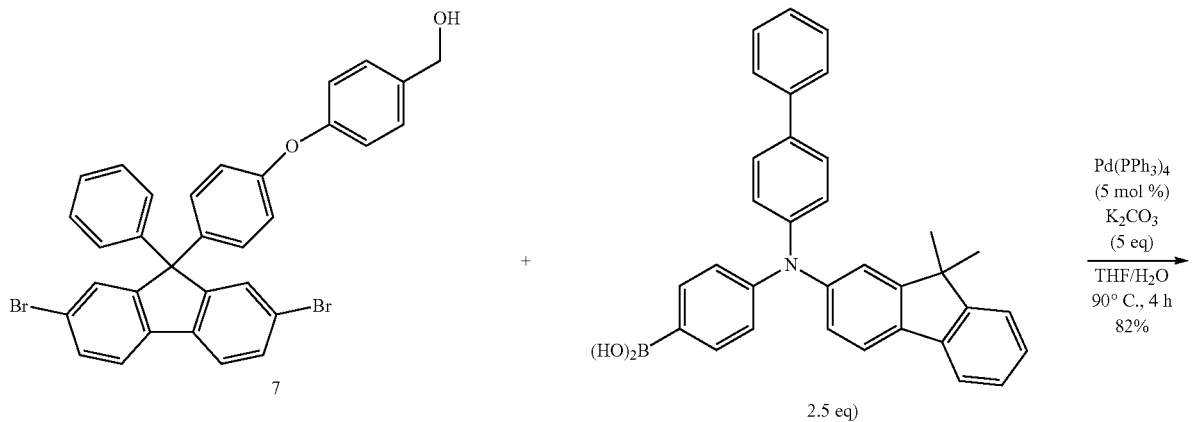

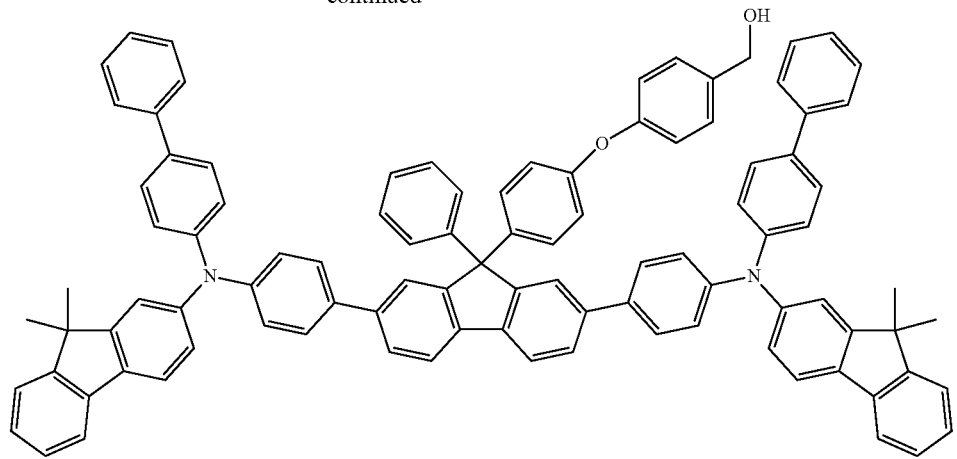

8

Intermediate 7 (1.5 g, 2.5 mmol), 4-(biphenyl-4-yl(9,9-dimethyl-9H-fluoren-2-yl)amino)phenylboronic acid (3 g, 6.25 mmol), Pd(PPh$_3$)$_4$ (144 mg, 0.125 mmol) and K$_2$CO$_3$ (1.73 g, 12.5 mmol) were introduced to a round bottom flask, and inside the flask was substituted with nitrogen. THF (9.4 mL) and H$_2$O (3.1 mL) were introduced thereto, and the result was stirred for 4 hours at 90° C. After the reaction was terminated, the result was extracted with ethyl acetate and water. After collecting the organic layer, the organic layer was dried using MgSO$_4$ and filtered. The filtrate was dried using a vacuum rotary evaporator to remove the organic solvent, and the residue was column purified to obtain Intermediate 8 (2.7 g, 82% yield).

(4) Synthesis of Intermediate 9

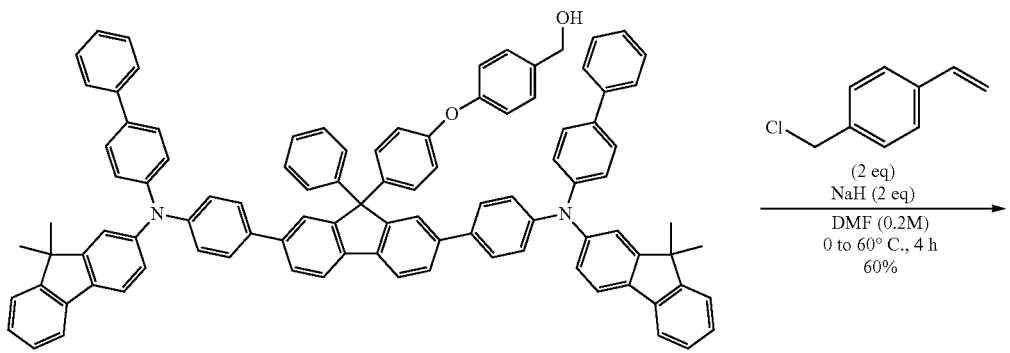

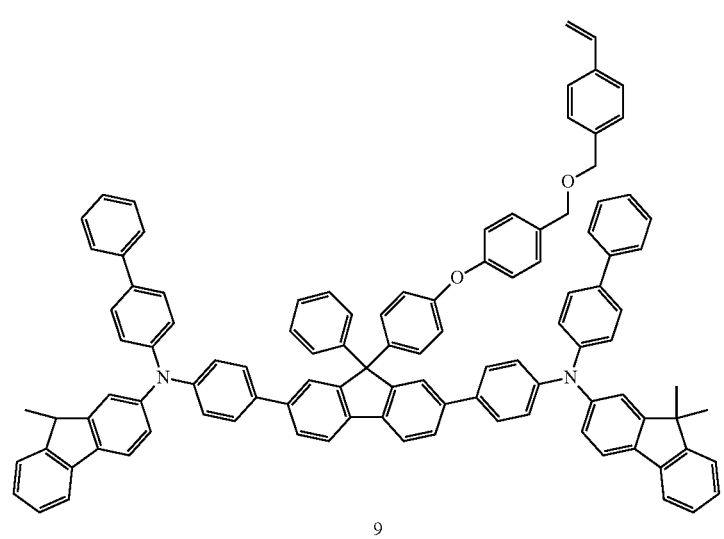

9

After introducing sodium hydride (60 wt %, 112 mg, 2.8 mmol) to a round bottom flask, inside the flask was substituted with the nitrogen atmosphere. Anhydrous DMF (3.5 mL) was introduced thereto, and the result was cooled to 0° C. After slowly introducing a solution dissolving Intermediate 8 (1.84 g, 1.4 mmol) in anhydrous DMF (3.5 mL) to the reaction mixture, the result was stirred for 1 hour at 0° C. After introducing 4-vinylbenzyl chloride (0.39 mL, 2.8 mmol) thereto, the temperature was raised to 60° C., and the result was stirred for 4 hours. After the reaction was terminated, the result was extracted with ethyl acetate and water. After collecting the organic layer, the organic layer was dried using $MgSO_4$ and filtered. The filtrate was dried using a vacuum rotary evaporator to remove the organic solvent, and the residue was column purified to obtain Intermediate 9 (1.2 g, 60% yield).

NMR measurement value of Intermediate 9: $^1$H NMR (500 MHz, $CDCl_3$) δ 7.87 (d, 2H), 7.78-7.64 (m, 7H), 7.64-7.58 (m, 5H), 7.55-7.49 (m, 8H), 7.45-7.40 (m, 6H), 7.37 (d, 2H), 7.34-7.24 (m, 19H), 7.23-7.18 (m, 8H), 7.09 (d, 2H), 6.97 (d, 2H), 6.88 (d, 2H), 6.69 (dd, 1H), 5.73 (d, 1H), 5.21 (d, 1H), 4.50 (s, 2H), 4.48 (s, 2H), 1.65 (s, 12H)

(5) Synthesis of Compound B

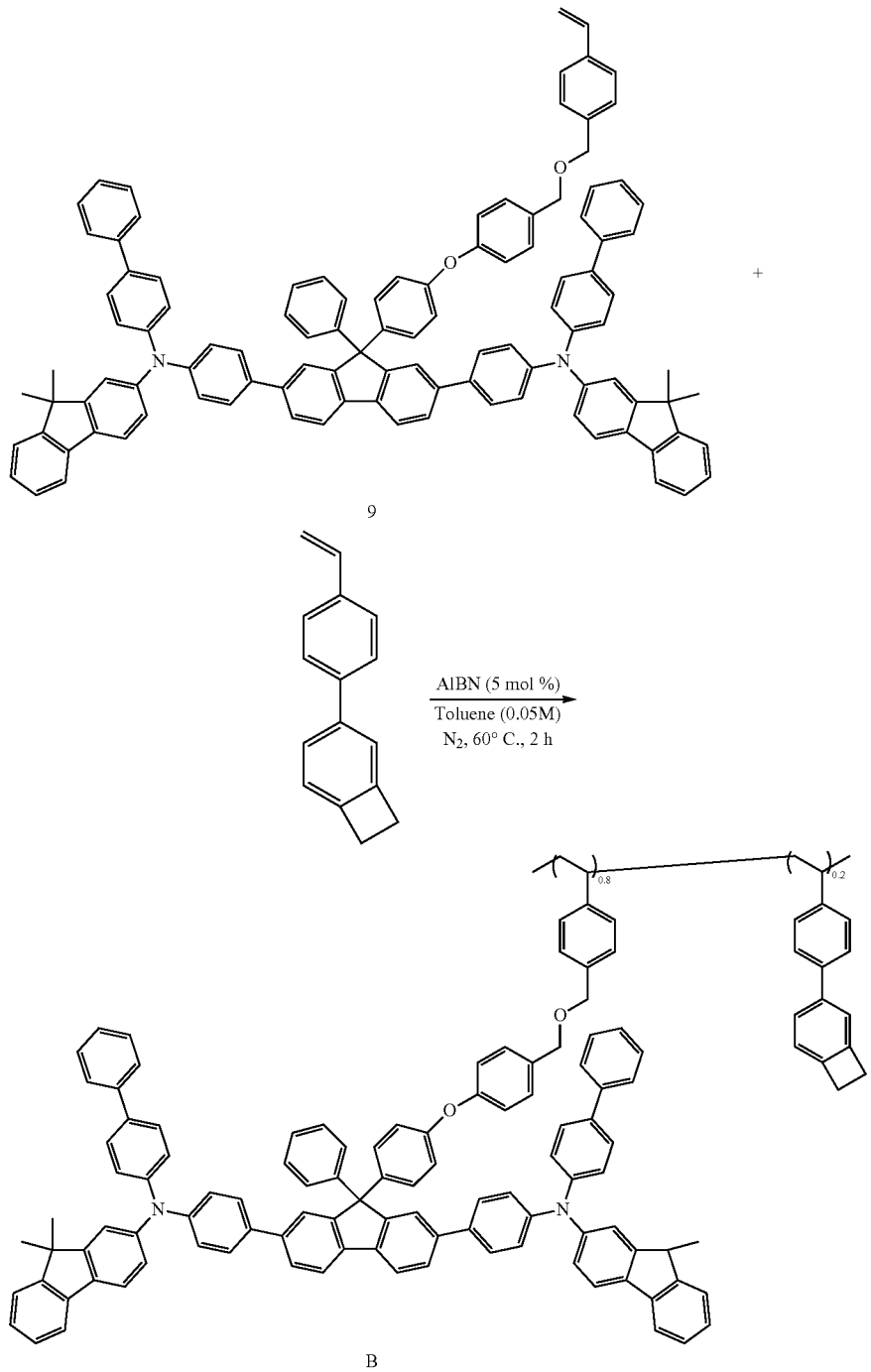

Intermediate 9 (1.1 g, 0.8 mmol), 3-(4-vinylphenyl)bicyclo[4.2.0]octa-1(6),2,4-triene (41 mg, 0.2 mmol) and azobisisobutyronitrile (6.6 mg, 0.04 mmol) were introduced to a round bottom flask, and then dissolved in anhydrous toluene (16 mL) under the nitrogen atmosphere. The result was stirred for 2 hours at 60° C. After the reaction was terminated, ethyl acetate (4 mL) was introduced thereto. The precipitates were filtered and washed with ethyl acetate. Obtained solids were dried to obtain Compound B (700 mg, 61% yield). (Mw=40,580, Mn=18,652)

(6) Synthesis of Compound C

Intermediate 9 (1.1 g, 0.8 mmol), 3-ethyl-3-((4-vinylphenoxy)methyl) oxetane (44 mg, 0.2 mmol) and azobisisobutyronitrile (6.6 mg, 0.04 mmol) were introduced to a round bottom flask, and then dissolved in anhydrous toluene (16 mL) under the nitrogen atmosphere. The result was stirred for 2 hours at 60° C. After the reaction was terminated, ethyl acetate (4 mL) was introduced thereto. The precipitates were filtered and washed with ethyl acetate. Obtained solids were dried to obtain Compound C (869 mg, 76% yield). (Mw=44,302, Mn=27,787)

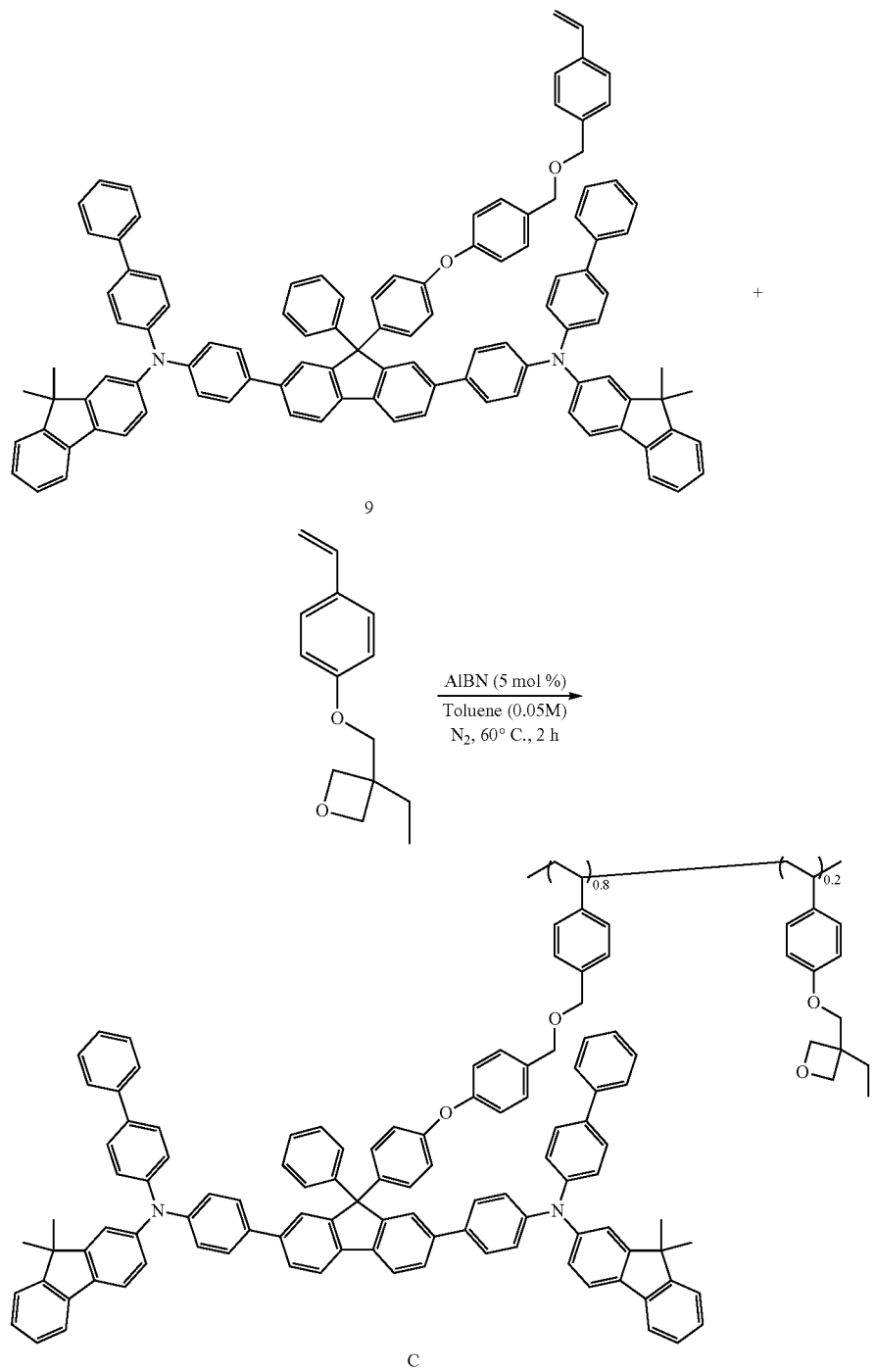

Preparation Example 3. Synthesis of Compound D (1) Synthesis of Intermediate 10

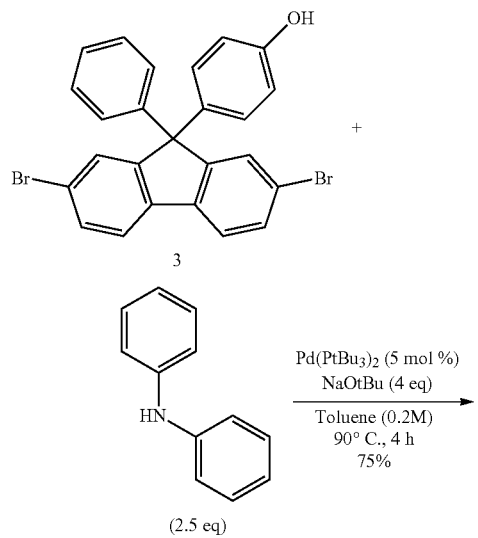

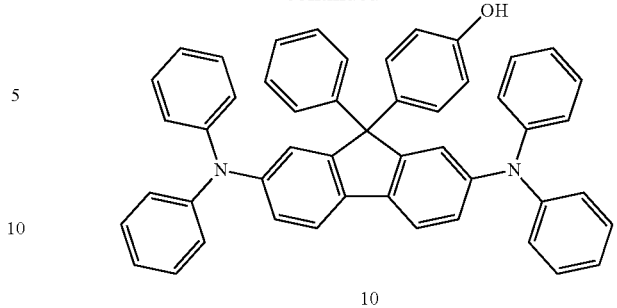

After introducing Intermediate 3 (2.46 g, 5 mmol), diphenylamine (2.12 g, 12.5 mmol), Pd(PtBu$_3$)$_2$ (128 mg, 0.25 mmol) and sodium tert-butoxide (NaOtBu) (1.92 g, 20 mmol) to a round bottom flask, inside the flask was substituted with nitrogen. After introducing toluene (25 mL) thereto, the result was stirred for 4 hours at 90° C. After the reaction was terminated, the result was extracted with ethyl acetate and water. After collecting the organic layer, the organic layer was dried using MgSO$_4$ and filtered. The filtrate was dried using a vacuum rotary evaporator to remove the organic solvent, and the residue was column purified to obtain Intermediate 10 (2.5 g, 75% yield).

(2) Synthesis of Intermediate 11

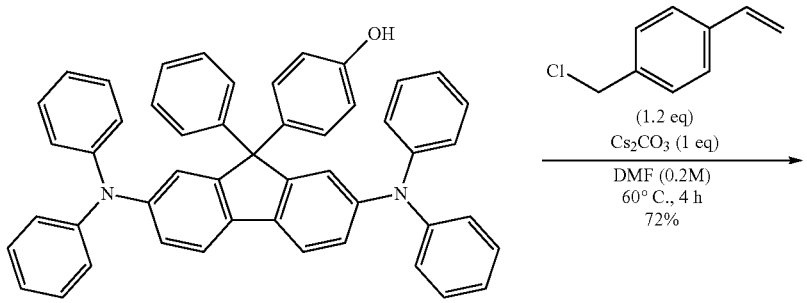

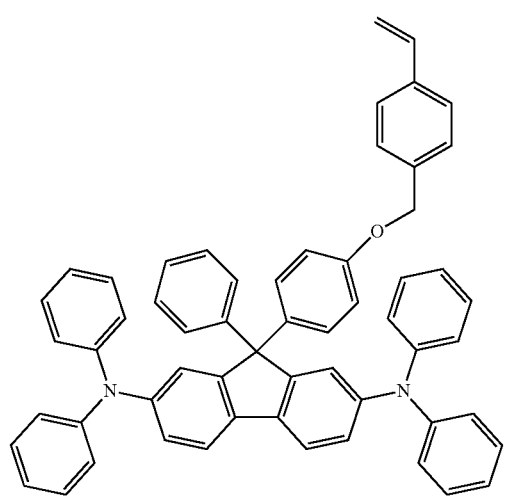

After introducing Intermediate 10 (1.34 g, 2 mmol), cesium carbonate (652 mg, 2 mmol) and 4-vinylbenzyl chloride (0.34 mL, 2.4 mmol) to a round bottom flask, anhydrous DMF (10 mL) was introduced thereto, and the result was stirred for 4 hours at 60° C. After the reaction was terminated, the result was extracted with ethyl acetate and water. After collecting the organic layer, the organic layer was dried using MgSO$_4$ and filtered. The filtrate was dried using a vacuum rotary evaporator to remove the organic solvent, and the residue was column purified to obtain Intermediate 11 (1.13 g, 72% yield).

NMR measurement value of Intermediate 11: $^1$H NMR (500 MHz, CDCl$_3$) δ 7.82 (d, 2H), 7.66 (d, 2H), 7.33-7.24 (m, 17H), 7.11 (d, 8H), 7.08 (d, 4H), 7.02 (t, 4H), 6.85 (d, 2H), 6.70 (dd, 1H), 5.73 (d, 1H), 5.22 (d, 1H), 4.97 (s, 2H)

(3) Synthesis of Compound D

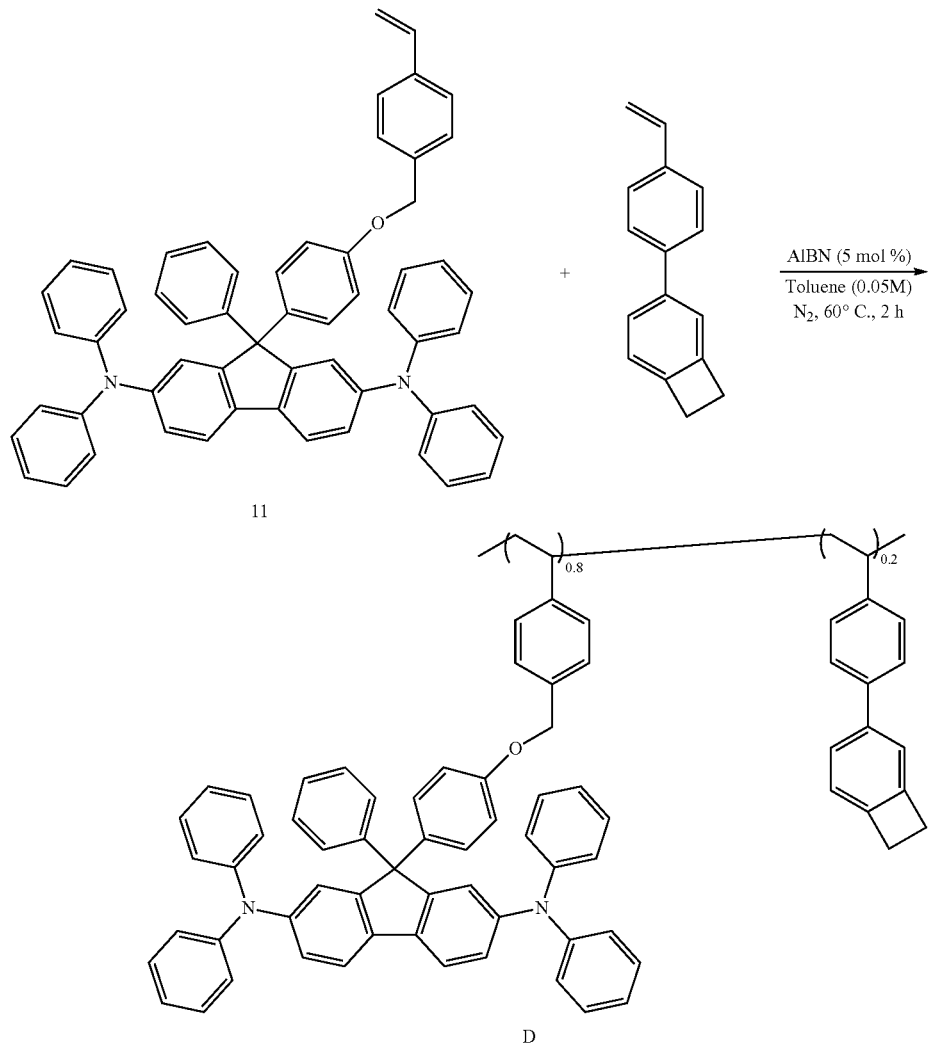

Intermediate 11 (628 mg, 0.8 mmol), 3-(4-vinylphenyl)bicyclo[4.2.0]octa-1(6),2,4-triene (41 mg, 0.2 mmol) and azobisisobutyronitrile (6.6 mg, 0.04 mmol) were introduced to a round bottom flask, and then dissolved in anhydrous toluene (16 mL) under the nitrogen atmosphere. The result was stirred for 2 hours at 60° C. After the reaction was terminated, ethyl acetate (4 mL) was introduced thereto. The precipitates were filtered and washed with ethyl acetate. Obtained solids were dried to obtain Compound D (502 mg, 75% yield). (Mw=37,210, Mn=22,367)

Preparation Example 4. Synthesis of Comparative Compound E

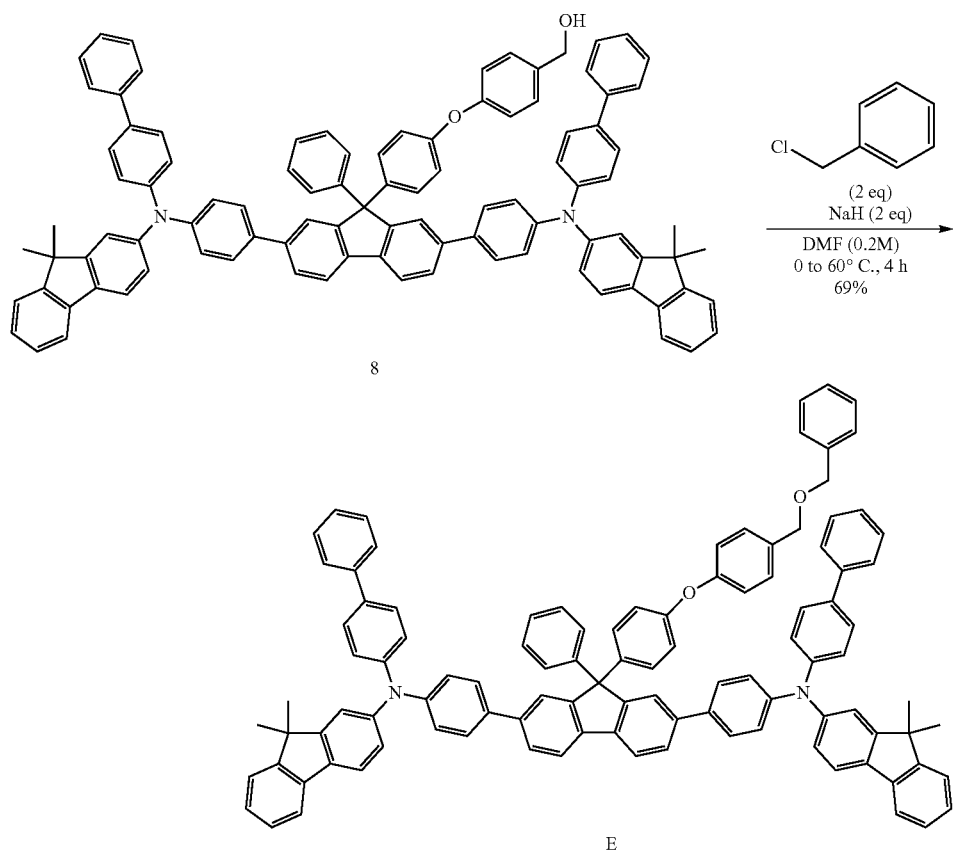

After introducing sodium hydride (60 wt %, 80 mg, 2 mmol) to a round bottom flask, inside the flask was substituted with the nitrogen atmosphere. Anhydrous DMF (2.5 mL) was introduced thereto, and the result was cooled to 0° C. After slowly introducing a solution dissolving Intermediate 8 (1.31 g, 1 mmol) in anhydrous DMF (2.5 mL) to the reaction mixture, the result was stirred for 1 hour at 0° C. After introducing benzyl chloride (0.23 mL, 2 mmol) thereto, the temperature was raised to 60° C., and the result was stirred for 4 hours. After the reaction was terminated, the result was extracted with ethyl acetate and water. After collecting the organic layer, the organic layer was dried using MgSO$_4$ and filtered. The filtrate was dried using a vacuum rotary evaporator to remove the organic solvent, and the residue was column purified to obtain Compound E (970 mg, 69% yield).

NMR measurement value of Compound E: $^1$H NMR (500 MHz, CDCl$_3$) δ 7.87 (d, 2H), 7.78-7.64 (m, 7H), 7.64-7.58 (m, 5H), 7.56-7.49 (m, 8H), 7.45-7.40 (m, 6H), 7.37 (d, 2H), 7.34-7.24 (m, 19H), 7.23-7.16 (m, 9H), 7.10 (d, 2H), 6.97 (d, 2H), 6.87 (d, 2H), 4.50 (s, 2H), 4.48 (s, 2H), 1.65 (s, 12H)

Preparation Example 5. Synthesis of Comparative Compound F (1) Synthesis of Intermediate 13

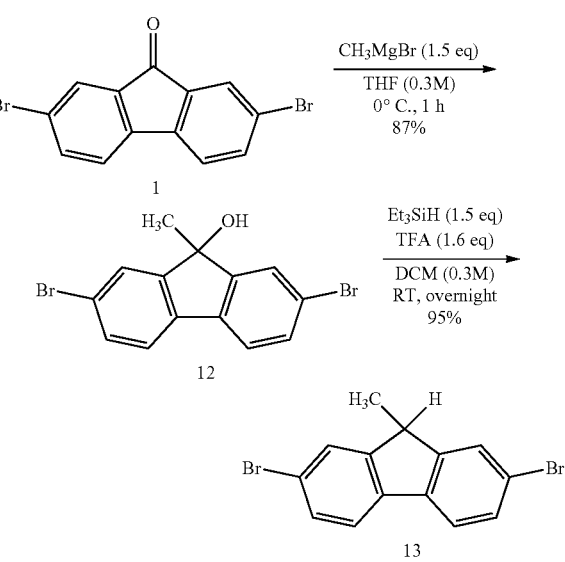

Synthesis of Intermediate 12: After introducing 2,7-dibromo-9-fluorenone (1) (10.1 g, 30 mmol) to a flask and dissolving in anhydrous tetrahydrofuran (100 mL), the flask was placed in an ice water bath. Methylmagnesium bromide (3 M in ether, 15 mL, 45 mmol) was slowly introduced thereto, and the result was stirred for 1 hour at 0° C. The reaction was stopped using NH₄Cl (aq), and the result was extracted with diethyl ether and water. After collecting the organic layer, the organic layer was dried using MgSO₄ and filtered. The filtrate was dried using a vacuum rotary evaporator to remove the organic solvent, and the residue was column purified to obtain Intermediate 12 (9.2 g, 87% yield).

Synthesis of Intermediate 13: After dissolving Intermediate 12 (7.1 g, 20 mmol) in DCM (67 mL), triethylsilane (4.8 mL, 30 mmol) and trifluoroacetic acid (2.45 mmol, 32 mmol) were introduced thereto, and the result was stirred overnight at room temperature. After the reaction was terminated, the result was column purified to obtain Intermediate 13 (6.4 g, yield 95%).

(9) Synthesis of Intermediate 14

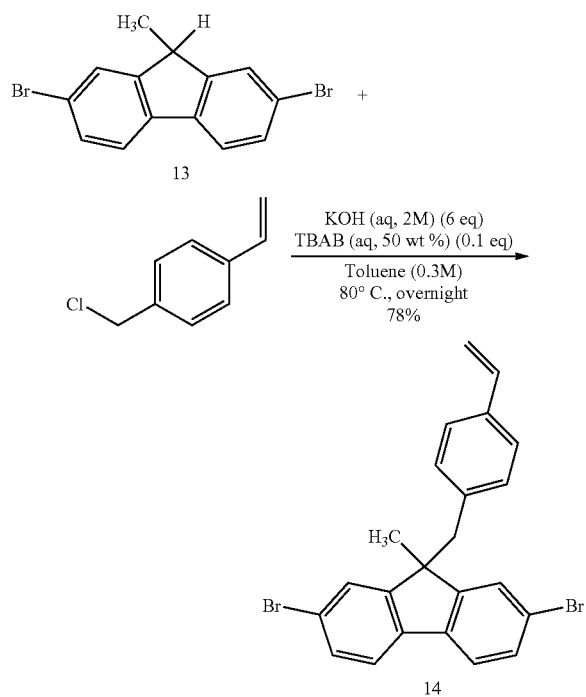

After dissolving Intermediate 13 (3.4 g, 10 mmol) and 4-vinylbenzyl chloride (1.7 mL, 12 mmol) in toluene (33 mL) and introducing 2 M KOH (30 mL) and tetra n-butylammonium bromide (TBAB) (aq 50 wt %) (0.31 mL, 1 mmol) thereto, the result was stirred for 12 hours under reflux. After the reaction was terminated, the result was extracted with ethyl acetate and water. After collecting the organic layer, the organic layer was dried using MgSO₄ and filtered. The filtrate was dried using a vacuum rotary evaporator to remove the organic solvent, and the residue was column purified to obtain Intermediate 14 (3.5 g, yield 78%).

(3) Synthesis of Comparative Compound F

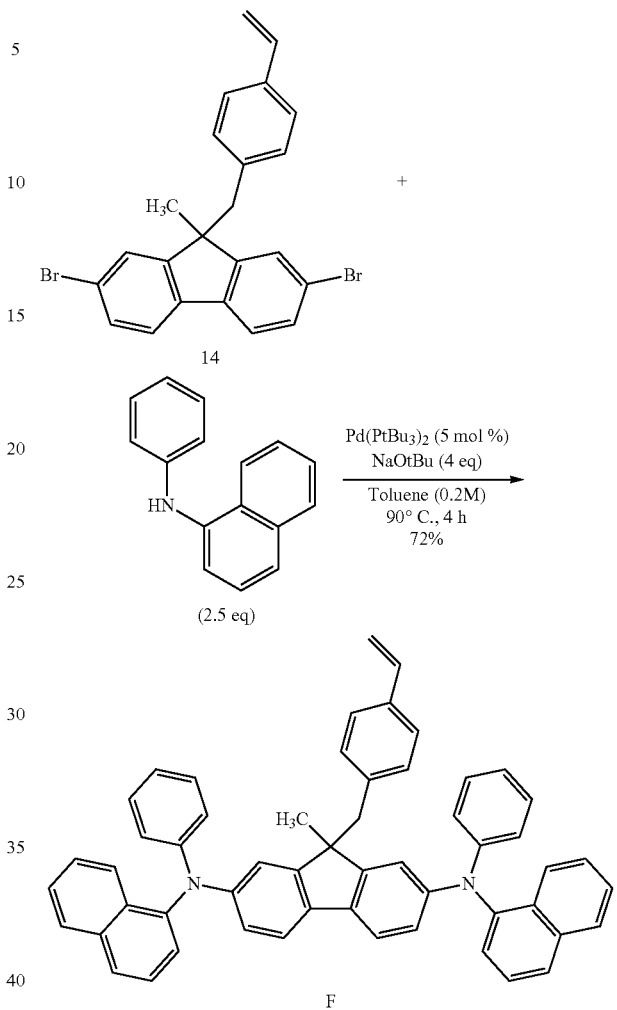

After introducing Intermediate 14 (1.8 g, 4 mmol), N-phenyl-1-naphthylamine (2.2 g, 10 mmol), Pd(PtBu₃)₂ (102 mg, 0.2 mmol) and NaOtBu (1.54 g, 16 mmol) to a round bottom flask, inside the flask was substituted with the nitrogen atmosphere. Anhydrous toluene (20 mL) was introduced thereto, and the result was stirred for 4 hours at 90° C. After the reaction was terminated, the result was extracted with ethyl acetate and water. After collecting the organic layer, the organic layer was dried using MgSO₄ and filtered. The filtrate was dried using a vacuum rotary evaporator to remove the organic solvent, and the residue was column purified to obtain Compound F (2.1 g, yield 72%).

NMR measurement value of Compound F: $^1$H NMR (500 MHz, CDCl₃) δ 8.19 (d, 2H), 8.08 (d, 2H), 7.85 (d, 2H), 7.81 (d, 2H), 7.66-7.50 (m, 10H), 7.33 (s, 2H) 7.16-7.24 (m, 6H), 7.08 (d, 4H), 7.00 (t, 2H), 6.75 (d, 2H), 3.20 (s, 2H), 1.75 (s, 3H)

EXPERIMENTAL EXAMPLE

Experimental Example 1. Measurement of Thin Film Retention Rate

A 2 wt % toluene solution of each of Compound B and Comparative Compound E was spin coated on glass to form a thin film. The result was heat treated for 30 minutes at 220°

C. under the nitrogen atmosphere, and UV absorption of each thin film was measured. Each of the thin films was dipped in toluene for 10 minutes, then dried and then UV measured. A thin film retention rate was measured by comparing sizes of maximum peaks of UV absorption before and after dipping in toluene.

A thin film was not retained in Comparative Compound E that does not have a curing group (FIG. 2, thin film retention rate 0%), however, Compound B additionally having a curing group had excellent tolerance for a solvent (FIG. 3, thin film retention rate 100%). It was seen that a crosslinking reaction was progressed due to the unit of Chemical Formula 2, and a high film retention rate was obtained.

FIG. 2 shows experimental results on the film retention rate of Comparative Compound E.

FIG. 3 shows experimental results on the film retention rate of Compound B.

EXAMPLE

[Preparation of ITO Substrate]

A glass substrate on which indium tin oxide (ITO) was coated as a thin film to a thickness of 1,500 Å was placed in detergent-dissolved distilled water and ultrasonic cleaned. Herein, a product of Fischer Co. was used as the detergent, and as the distilled water, distilled water filtered twice with a filter manufactured by Millipore Co. was used. After the ITO was cleaned for 30 minutes, ultrasonic cleaning was repeated twice using distilled water for 10 minutes.

After the cleaning with distilled water was finished, the substrate was ultrasonic cleaned with solvents of isopropyl alcohol and acetone, then dried, cleaned for 5 minutes, and then transported to a glove box.

Device Example 1

On the transparent ITO electrode, a 2 wt % toluene ink of Compound A: the following p dopant (the following Chemical Formula M) (weight ratio of 8:2) was spin coated (4000 rpm) on the ITO surface and heat treated (cured) for 30 minutes at 200° C. to form a hole injection layer to a thickness of 40 nm. After that, the result was transported to a vacuum deposition apparatus, and a hole transfer layer having a thickness of 20 nm was formed on the hole injection layer by vacuum depositing Compound G.

Subsequently, a light emitting layer was formed on the hole transfer layer to a thickness of 20 nm by vacuum depositing Compound H and Compound I in a concentration of 8%. On the light emitting layer, an electron injection and transfer layer was formed by vacuum depositing Compound J to a thickness of 35 nm. On the electron injection and transfer layer, LiF and aluminum were consecutively deposited to a thickness of 1 nm and a thickness of 100 nm, respectively, to form a cathode.

in the above-mentioned process, the deposition rates of the organic materials were maintained at 0.4 Å/sec to 0.7 Å/sec, the deposition rates of the lithium fluoride and the aluminum of the cathode were maintained at 0.3 Å/sec and 2 Å/sec, respectively, and the degree of vacuum during the deposition was maintained at $2 \times 10^{-7}$ torr to $5 \times 10^{-8}$ torr.

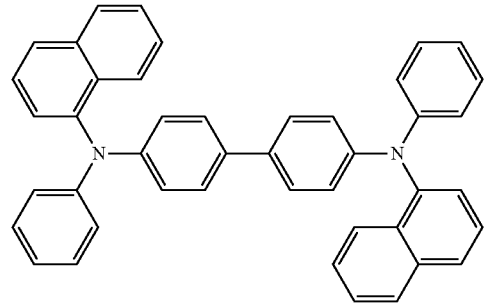

[Compound G]

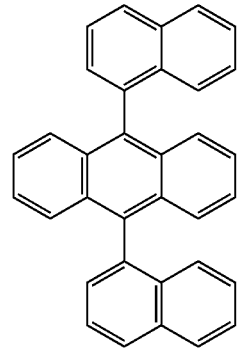

[Compound H]

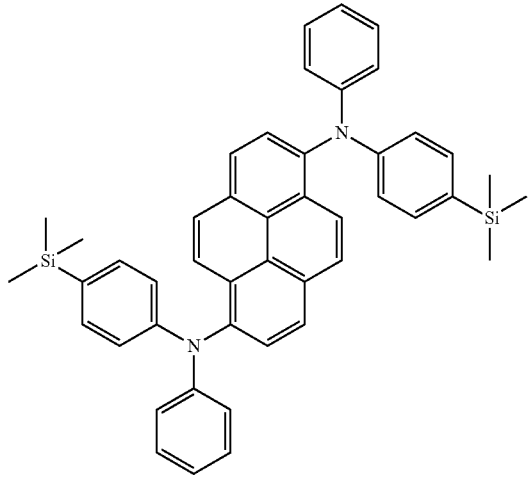

[Compound I]

-continued

[Compound J]

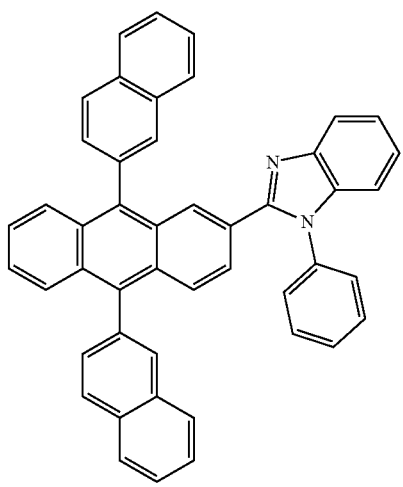

As the p-doping material, organic compound-type p-dopants of the following Chemical Formula K, or ionic p-dopants of Chemical Formula L or Chemical Formula M were used, however, the p-doping material is not limited thereto.

[Chemical Formula K]

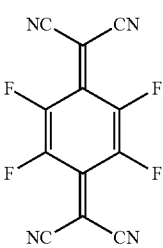

[Chemical Formula L]

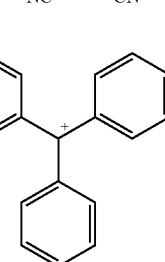

[Chemical Formula M]

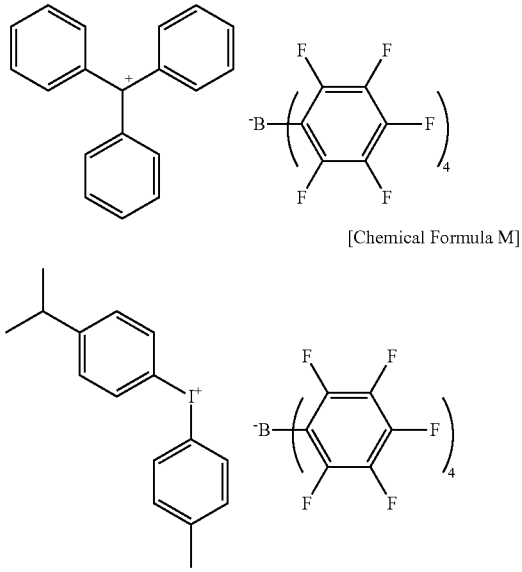

Device Example 2

An organic light emitting device was manufactured in the same manner as in Device Example 1 except that, in the manufacturing process of Device Example 1, a 2 wt % toluene ink of Compound B:p-dopant (8:2) was used instead of the 2 wt % toluene ink of Compound A:p-dopant(8:2) when forming the hole injection layer to a film.

Device Example 3

An organic light emitting device was manufactured in the same manner as in Device Example 1 except that, in the manufacturing process of Device Example 1, a 2 wt % toluene ink of Compound C:p-dopant (8:2) was used instead of the 2 wt % toluene ink of Compound A:p-dopant(8:2) when forming the hole injection layer to a film.

Device Example 4

An organic light emitting device was manufactured in the same manner as in Device Example 1 except that, in the manufacturing process of Device Example 1, a 2 wt % toluene ink of Compound D:p-dopant (8:2) was used instead of the 2 wt % toluene ink of Compound A:p-dopant(8:2) when forming the hole injection layer to a film.

Comparative Device Example 1

An organic light emitting device was manufactured in the same manner as in Device Example 1 except that, in the manufacturing process of Device Example 1, a 2 wt % toluene ink of Comparative Compound F:p-dopant (8:2) was used instead of the 2 wt % toluene ink of Compound A:p-dopant(8:2) when forming the hole injection layer to a film.

For the organic light emitting devices manufactured in Device Examples 1 to 4, and Comparative Device Example 1, results of measuring driving voltage, external quantum efficiency, luminance and lifetime at current density of 10 $mA/cm^2$ are shown in the following Table 1. The external quantum efficiency may be obtained by (the number of emitted photons)/(the number of injected charge carriers).

TABLE 1

| | Volt | J (mA/cm$^2$) | EQE (%) | Cd/m$^2$ | T95@ 500 nit |
|---|---|---|---|---|---|
| Device Example1 | 5.25 | 10 | 3.8 | 108 | 52 |
| Device Example2 | 5.06 | 10 | 3.4 | 110 | 58 |
| Device Example3 | 5.53 | 10 | 4.0 | 110 | 60 |
| Device Example4 | 5.02 | 10 | 3.2 | 105 | 49 |
| Comparative Device Example 1 | 7.23 | 10 | 2.1 | 62 | 20 |

The polymer formed with Chemical Formula 1 and Chemical Formula 2 according to one embodiment of the present specification had excellent solubility for organic solvents and readily prepared a coating composition. From the results of Table 1, it was identified that an organic light emitting device having more superior performance was obtained since a uniform coating layer was able to be formed using the coating composition and film stability was excellent as well.

The invention claimed is:
1. A polymer comprising:
a unit represented by the following Chemical Formula 1; and a unit represented by the following Chemical Formula 2:

[Chemical Formula 1]

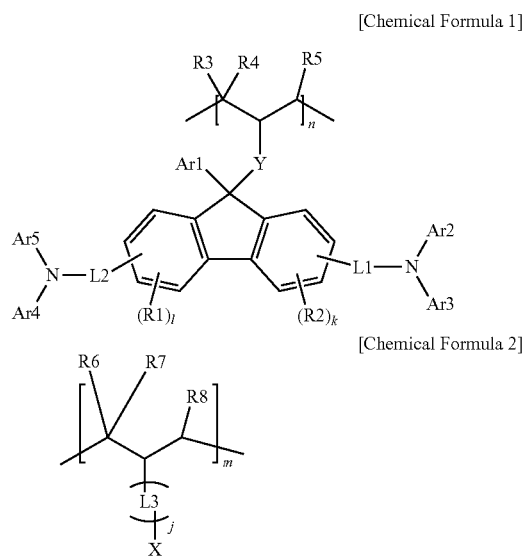

[Chemical Formula 2]

wherein, in Chemical Formulae 1 and 2,
Ar1 to Ar5 are the same as or different from each other, and each independently a substituted or unsubstituted aryl group;
Ar2 and Ar3 are optionally bond to each other to form a substituted or unsubstituted heteroring;
Ar4 and Ar5 are optionally bond to each other to form a substituted or unsubstituted heteroring;
L1 and L2 are the same as or different from each other, and each independently a direct bond; or a substituted or unsubstituted arylene group;
Y is —Y1— or —(Y2)$_i$-Y3-;
Y1 and Y3 are the same as or different from each other, and each independently a substituted or unsubstituted arylene group; or a substituted or unsubstituted alkylene group;
Y2 is a substituted or unsubstituted arylene group; a substituted or unsubstituted alkylene group; or —O—;
i is an integer of 1 to 8, and when i is 2 or greater, Y2s are the same as or different from each other;
Y2 bonding to Y3 is different from Y3, and when there are two or more Y2s, adjacent Y2s are different from each other;
R1 to R8 are the same as or different from each other, and each independently hydrogen, or a substituted or unsubstituted alkyl group;
L3 is a direct bond; a substituted or unsubstituted arylene group; a substituted or unsubstituted alkylene group; a substituted or unsubstituted alkyleneoxy group; or a substituted or unsubstituted divalent arylamine group;
l and k are the same as or different from each other, and each independently an integer of 0 to 3, and when l is 2 or greater, R1s are the same as or different from each other, and when k is 2 or greater, R2s are the same as or different from each other;
j is an integer of 1 to 3, and when j is 2 or greater, L3s are the same as or different from each other;
X is a curing group;
n and m mean a molar ratio in the polymer; and
0<n<1, 0<m<1, and m+n≤1.

2. The polymer of claim 1, wherein the polymer including the unit represented by Chemical Formula 1 and the unit represented by Chemical Formula 2 has a number average molecular weight of 1,000 g/mol to 300,000 g/mol.

3. The polymer of claim 1, wherein Ar1 to Ar5 are the same as or different from each other, and each independently a substituted or unsubstituted phenyl group; a substituted or unsubstituted biphenyl group; or a substituted or unsubstituted fluorene group.

4. The polymer of claim 1, wherein L3 is a direct bond; a phenylene group unsubstituted or substituted with one, two or more substituents selected from the group consisting of an alkyl group, an alkoxy group and an arylamine group; or a divalent arylamine group.

5. The polymer of claim 1, wherein L1 and L2 are the same as or different from each other, and each independently a direct bond; or a phenylene group.

6. The polymer of claim 1, wherein Y1 and Y3 are the same as or different from each other, and each independently a substituted or unsubstituted phenylene group; or a substituted or unsubstituted biphenylylene group; and Y2s are the same as or different from each other, and each independently a substituted or unsubstituted phenylene group; a substituted or unsubstituted biphenylylene group; a substituted or unsubstituted methylene group; a substituted or unsubstituted ethylene group; a substituted or unsubstituted propylene group; a substituted or unsubstituted butylene group; a substituted or unsubstituted pentylene group; a substituted or unsubstituted hexylene group; or —O—.

7. The polymer of claim 1, wherein Y is selected from among the following structural formulae:

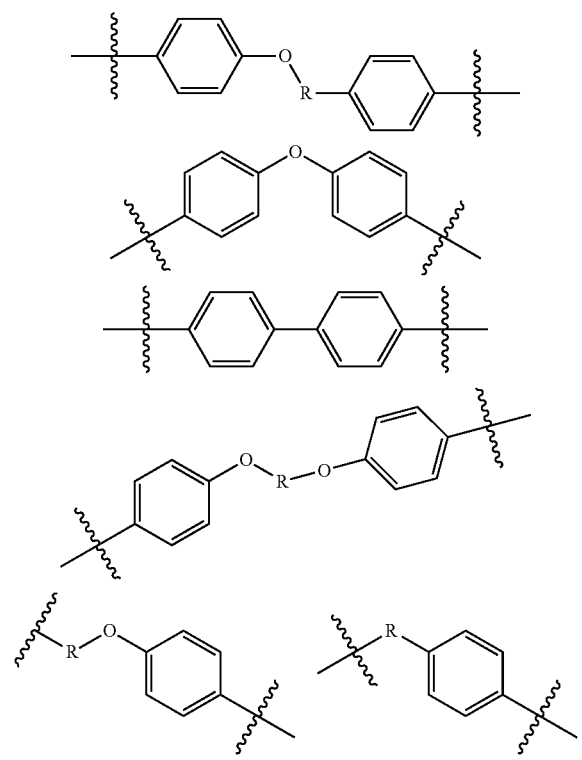

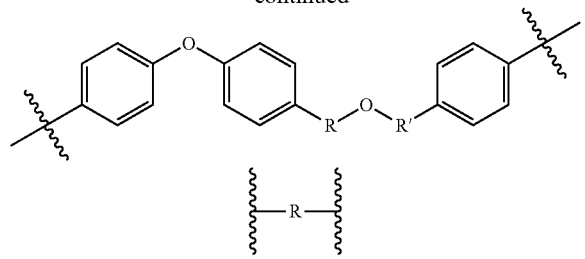

in the structural formulae, R and R' are the same as or different from each other, and each independently a substituted or unsubstituted alkylene group.

8. The polymer of claim 1, wherein the curing group is selected from among the following structural formulae:

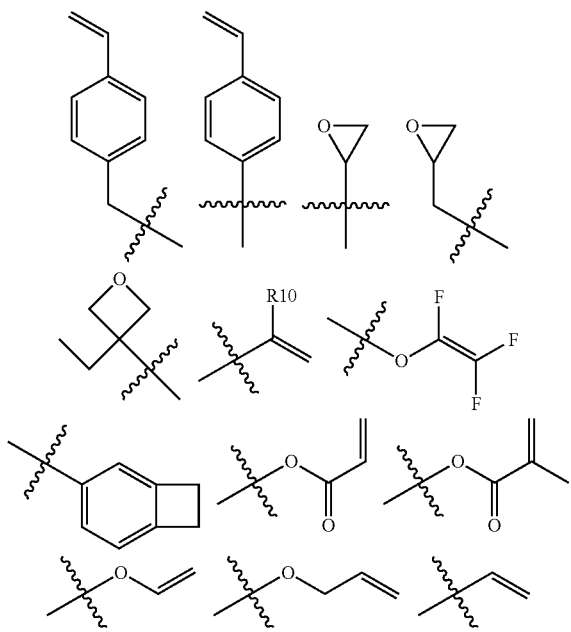

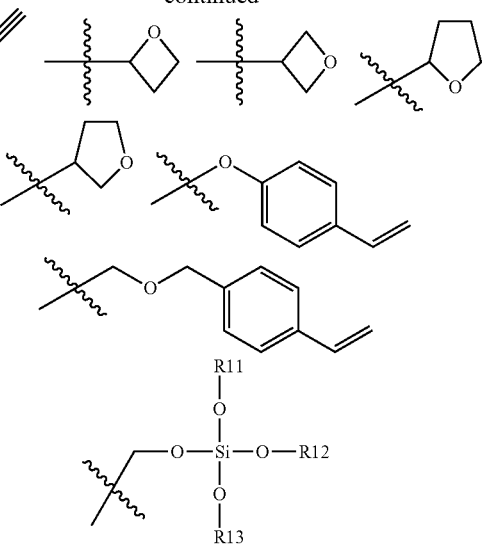

in the structural formulae, R10 to R13 are the same as or different from each other and each independently hydrogen, or a substituted or unsubstituted alkyl group having 1 to 6 carbon atoms, and

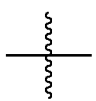

means a site bonding to L3.

9. The polymer of claim 1, wherein n is 0.6≤n<1, and m is 0<m≤0.4.

10. The polymer of claim 1, wherein the polymer including the unit represented by Chemical Formula 1 and the unit represented by Chemical Formula 2 is selected from among the following structural formulae:

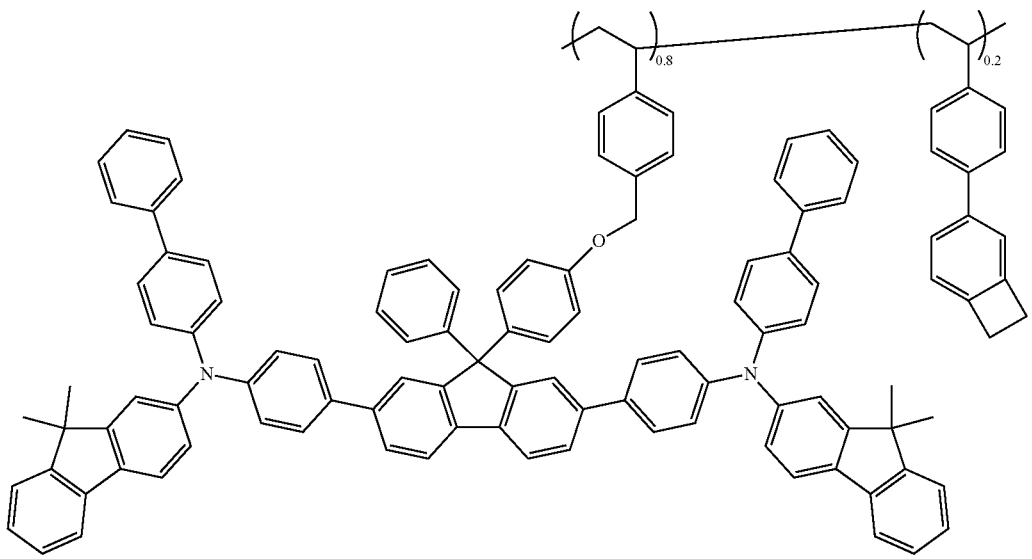

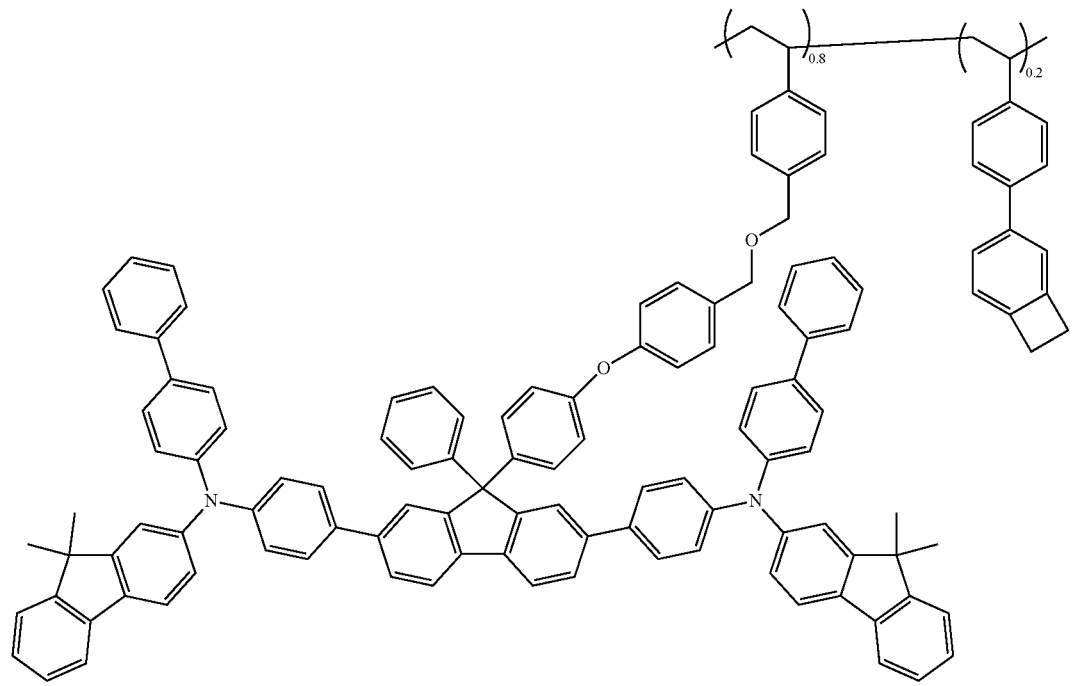
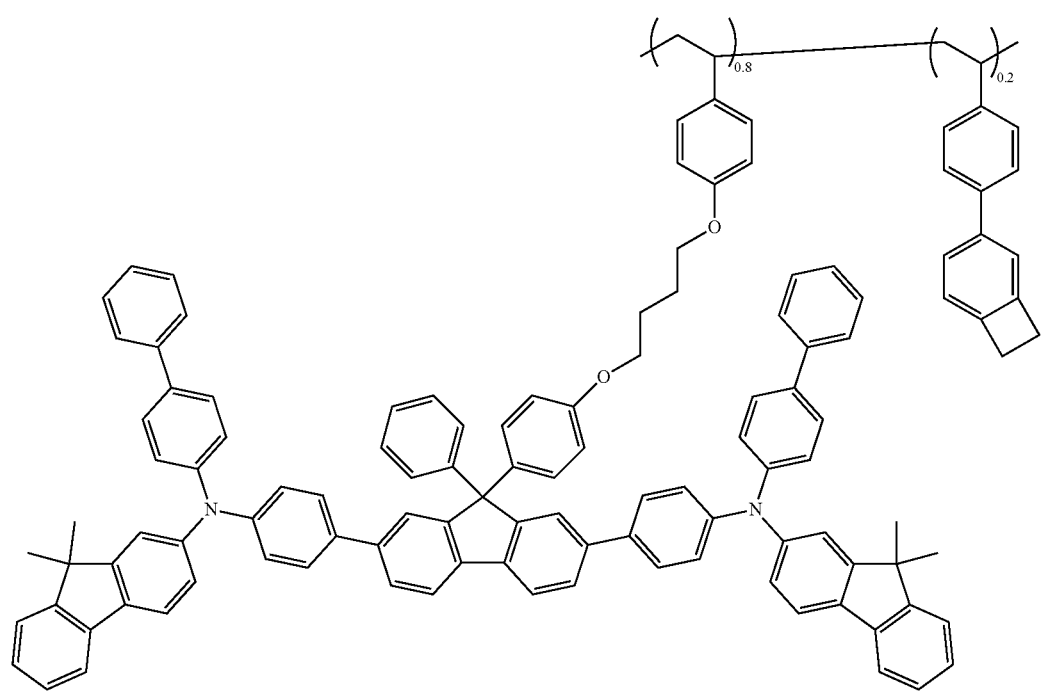

-continued
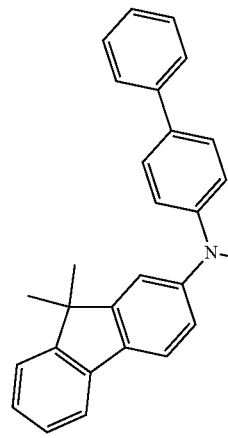
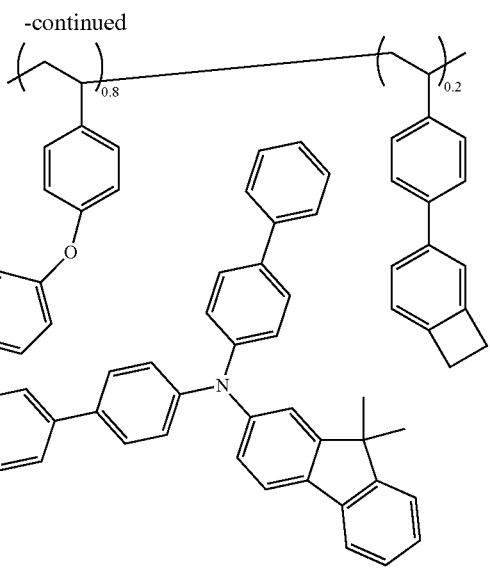
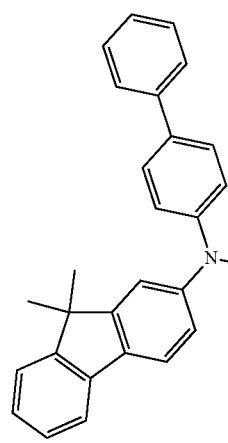
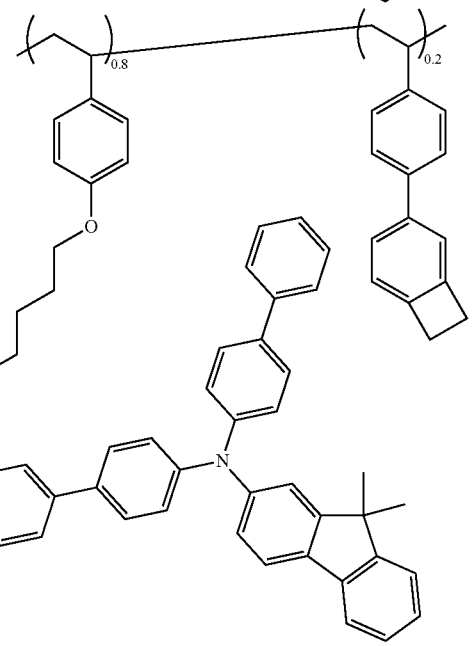
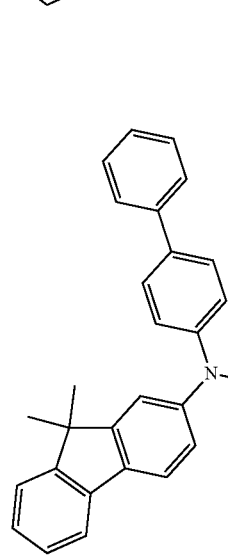
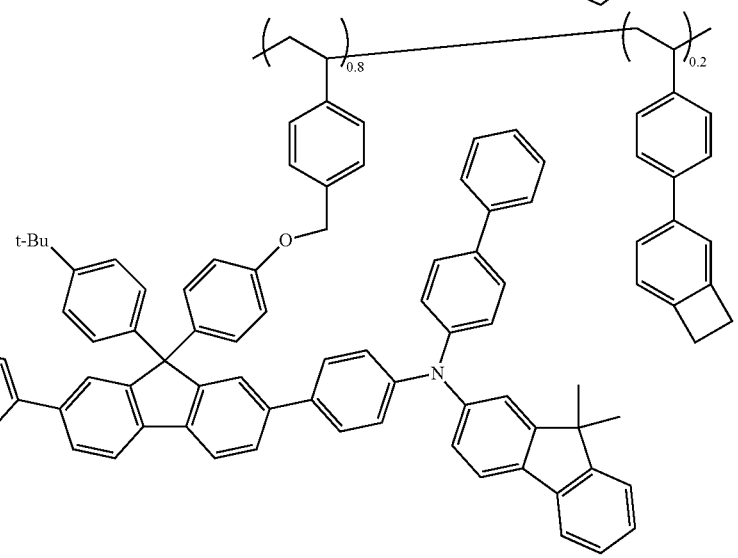

-continued
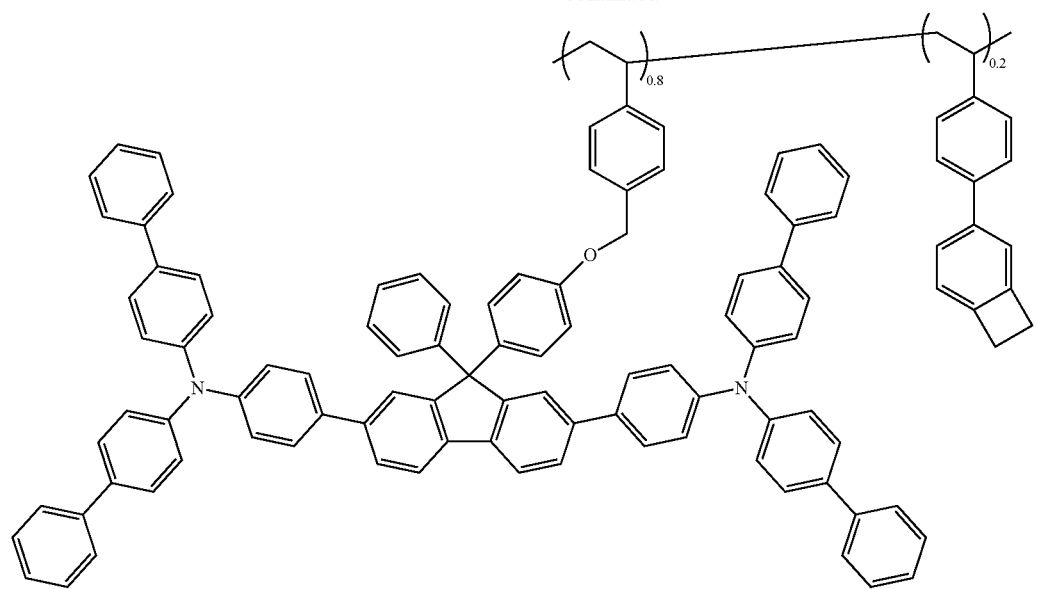
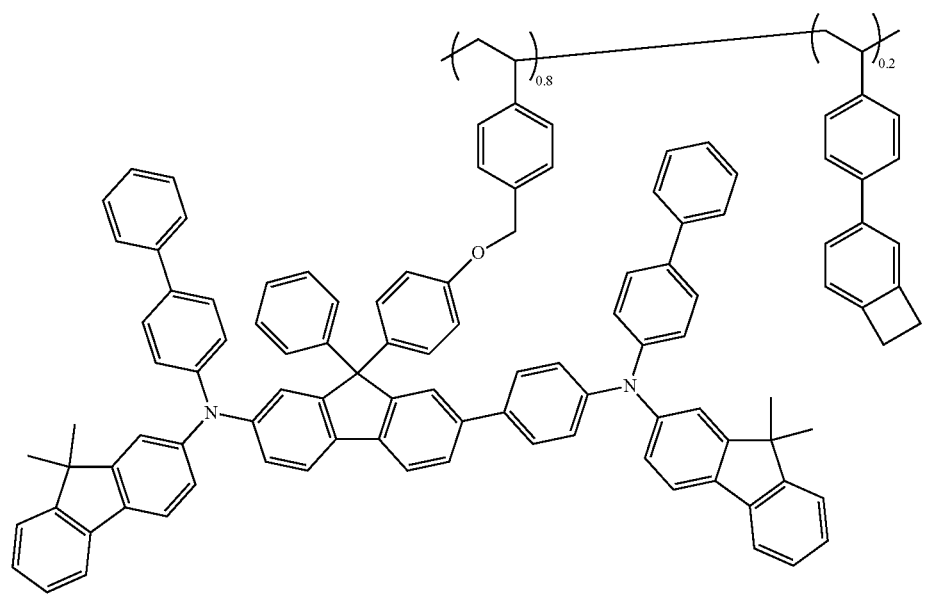

-continued
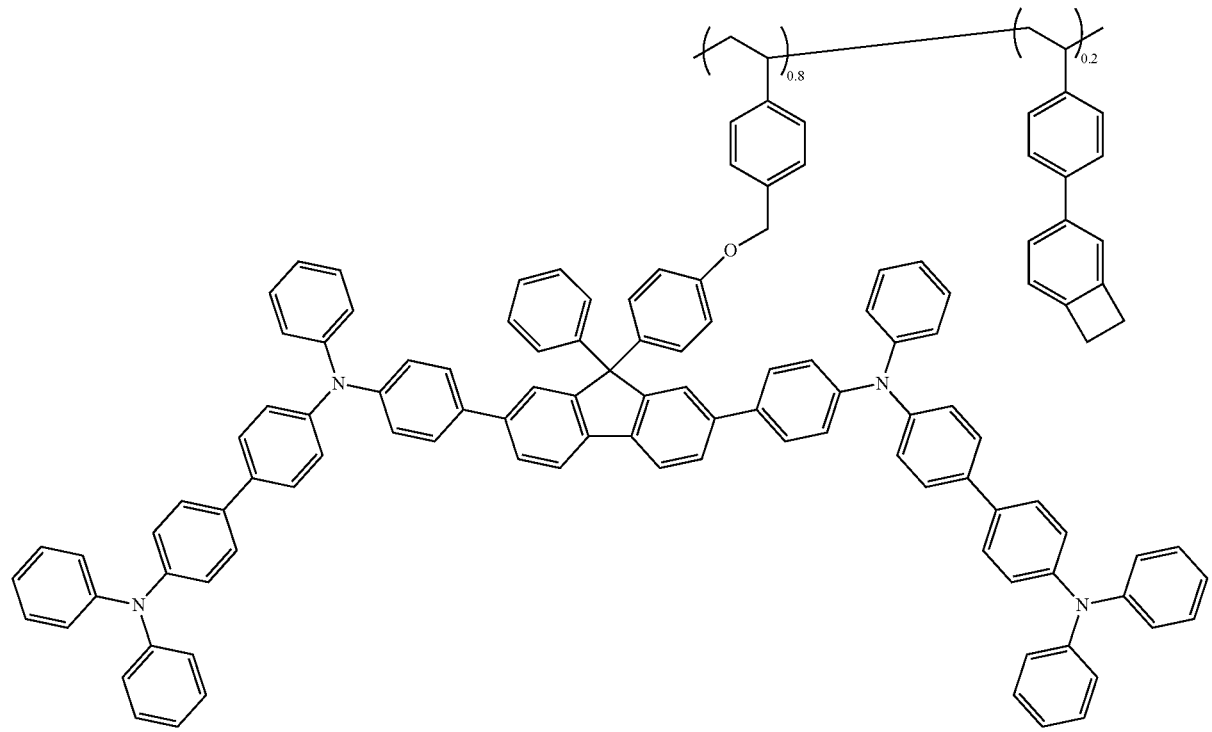
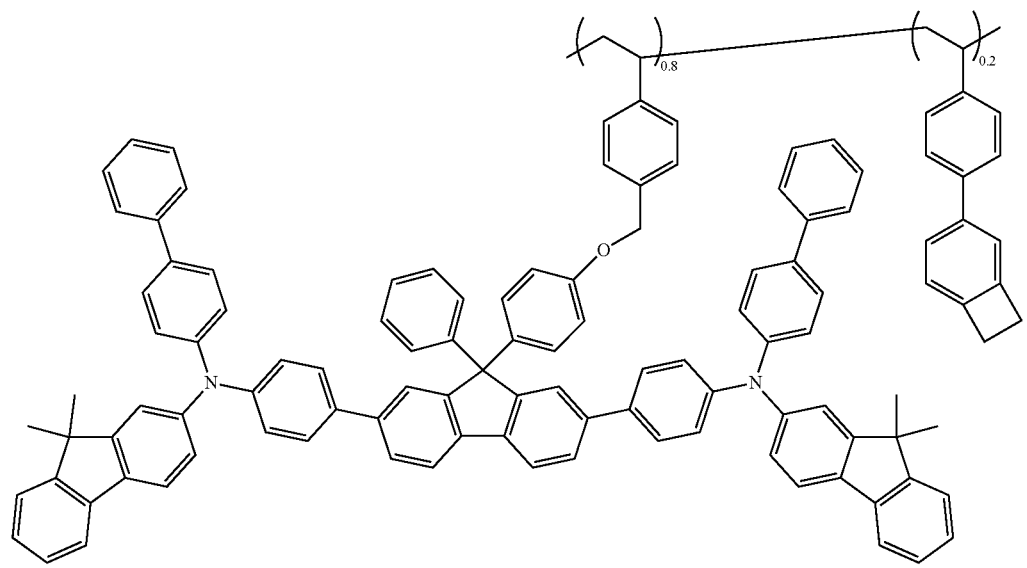

-continued
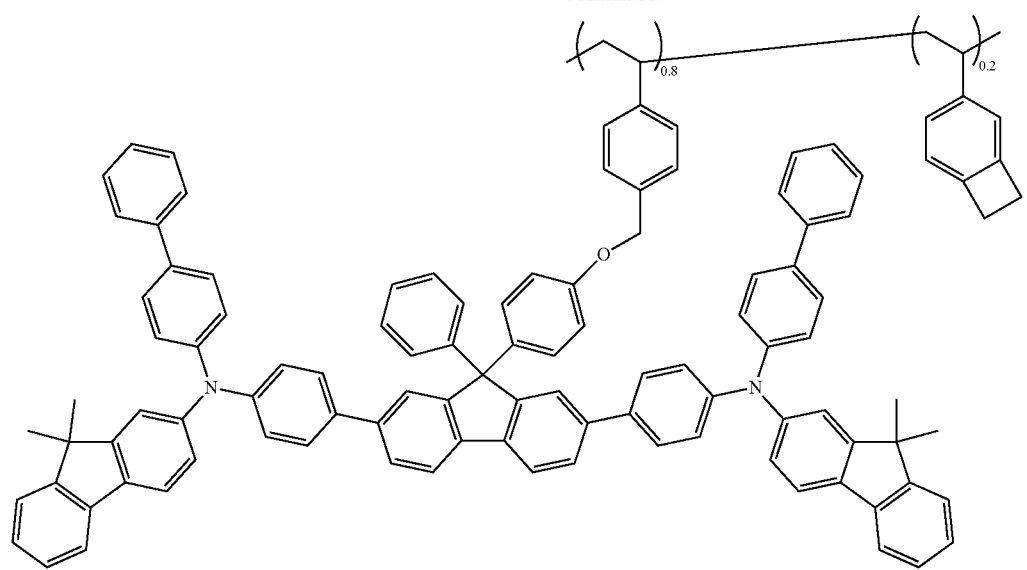
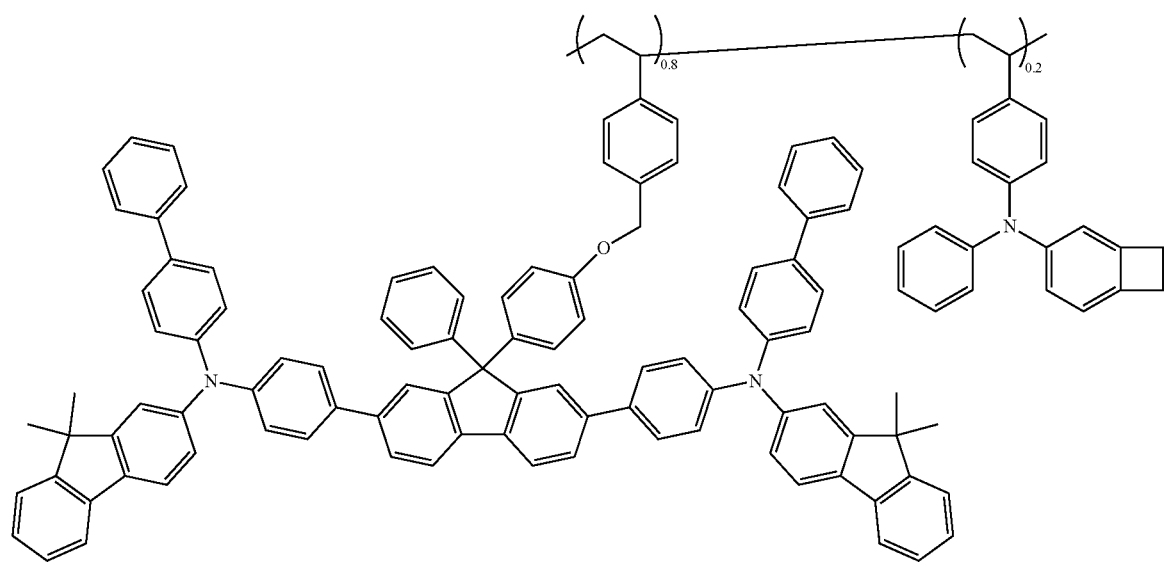
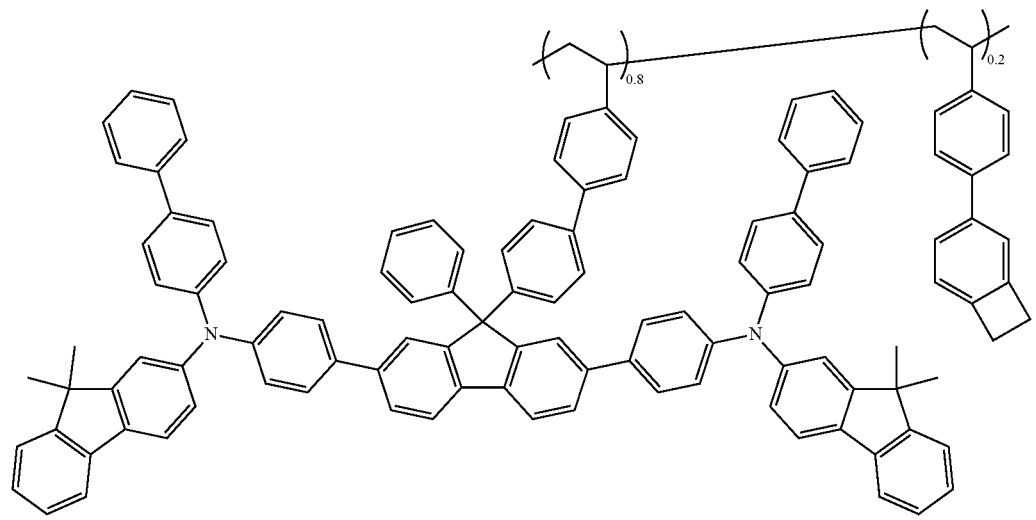

-continued
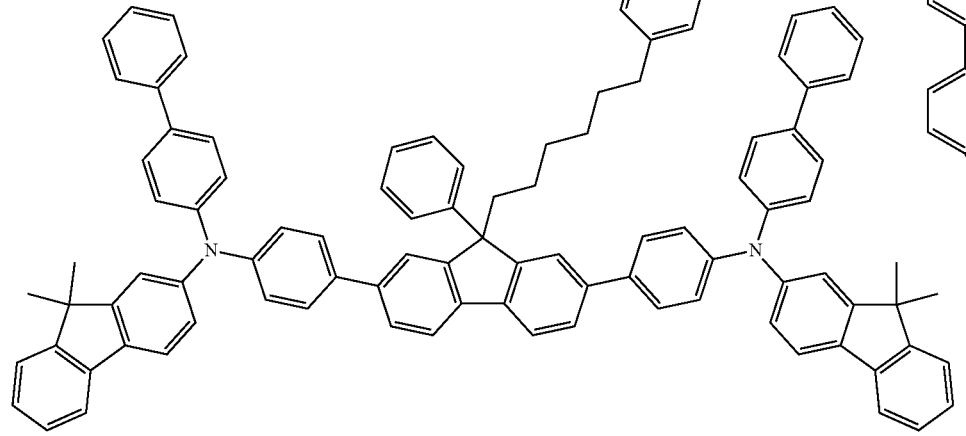
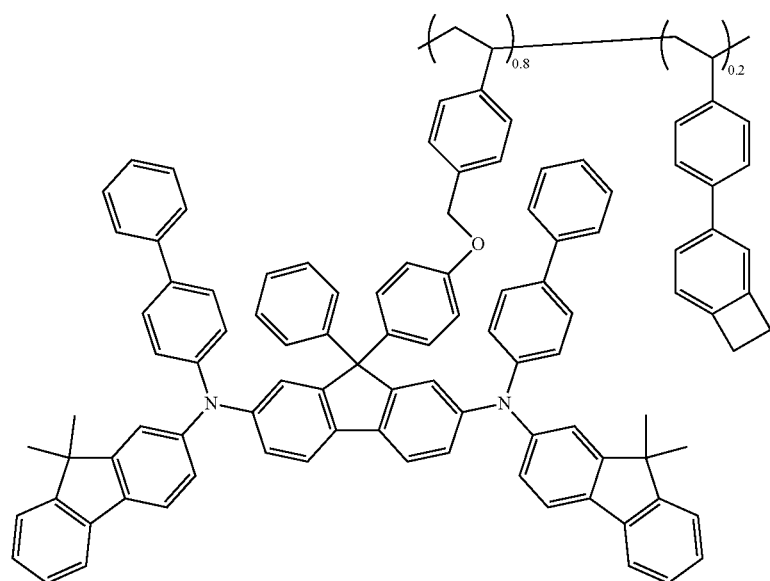

-continued
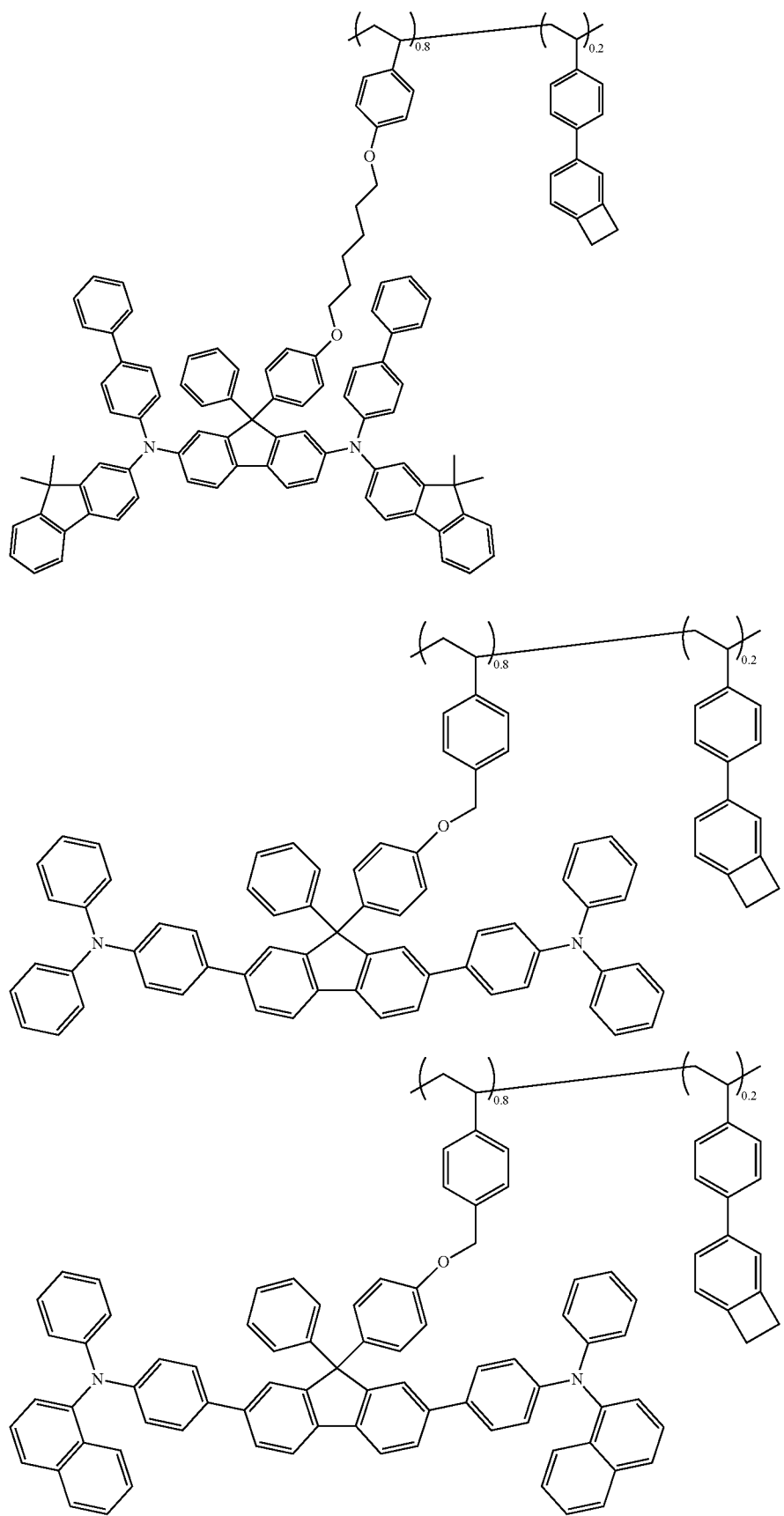

-continued
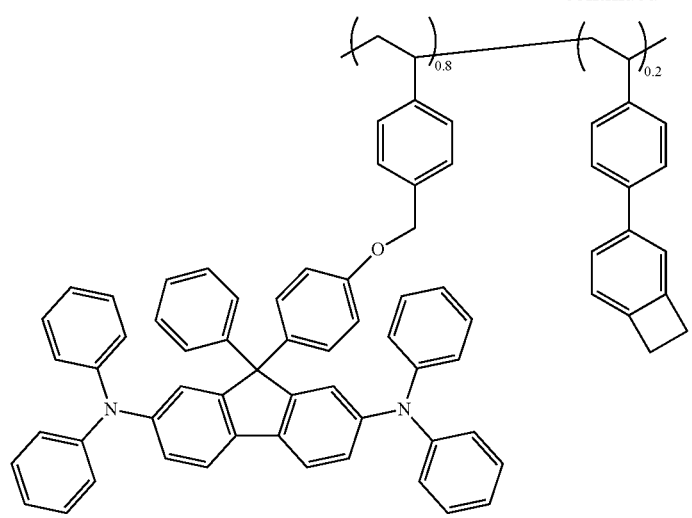
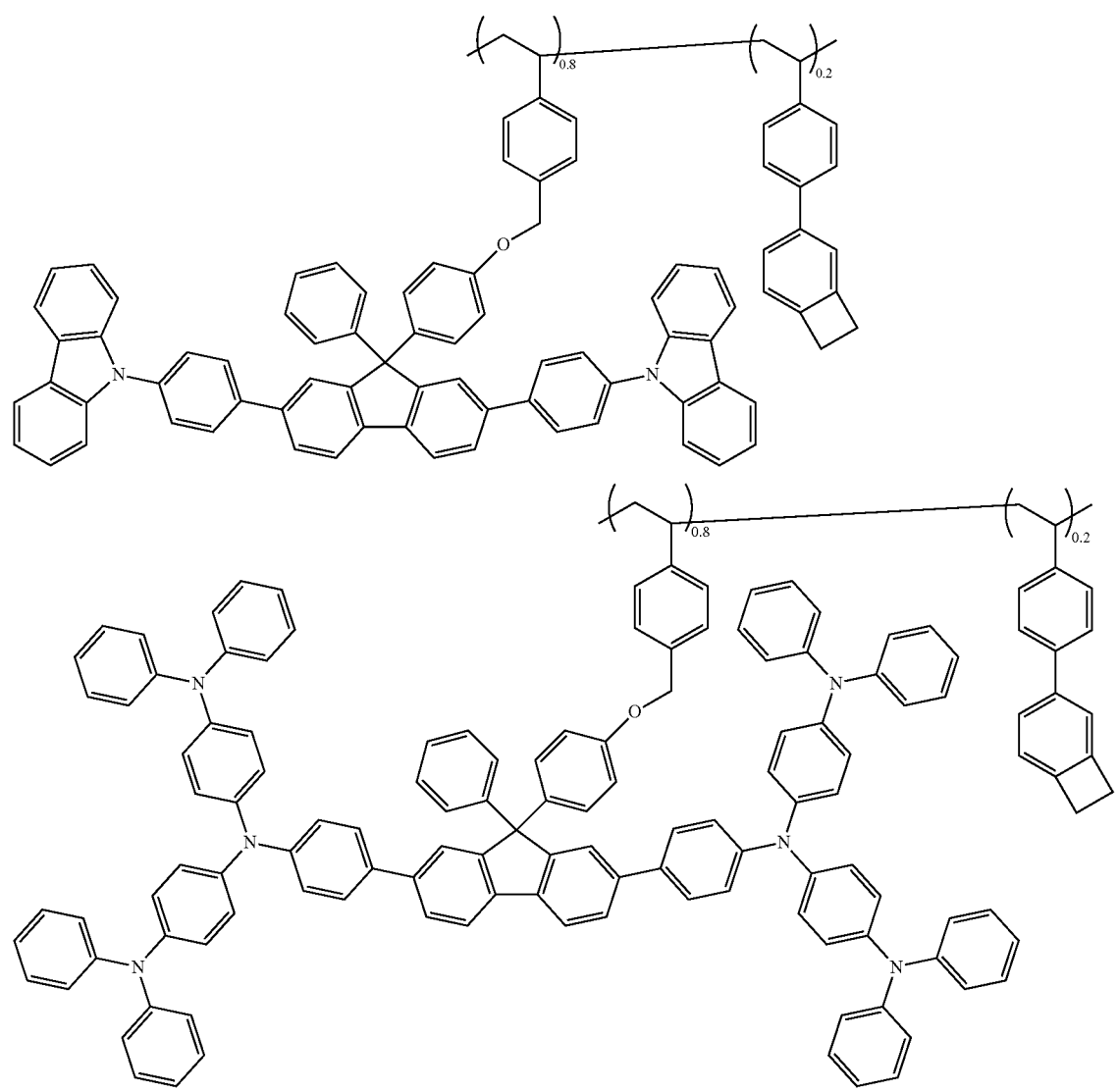

-continued
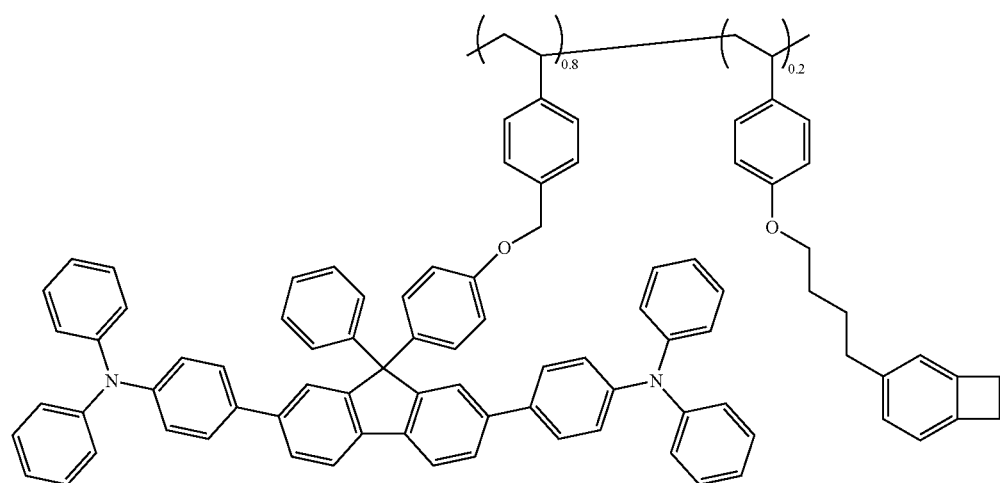
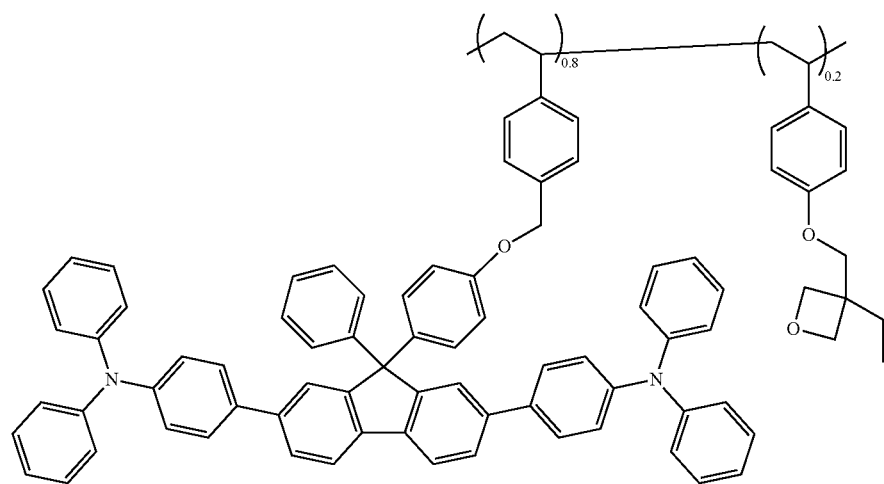
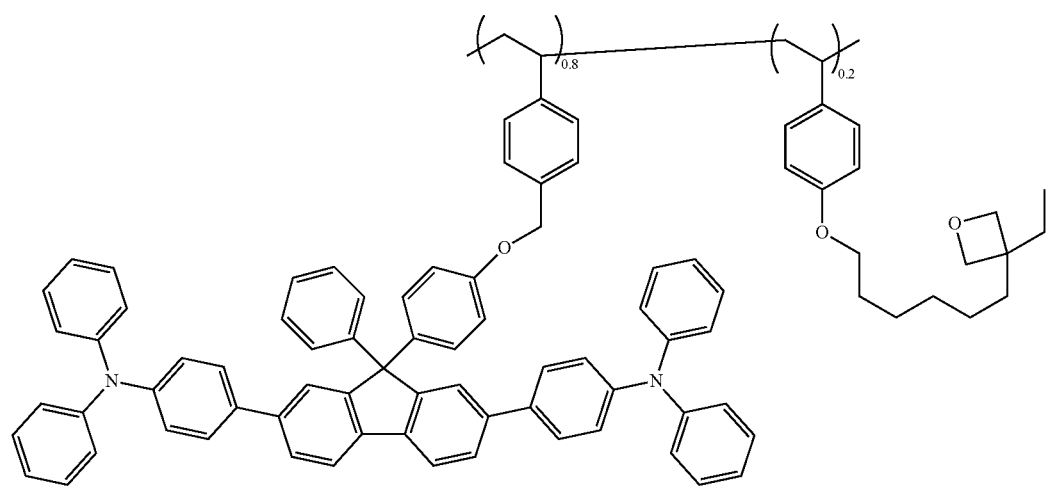

-continued
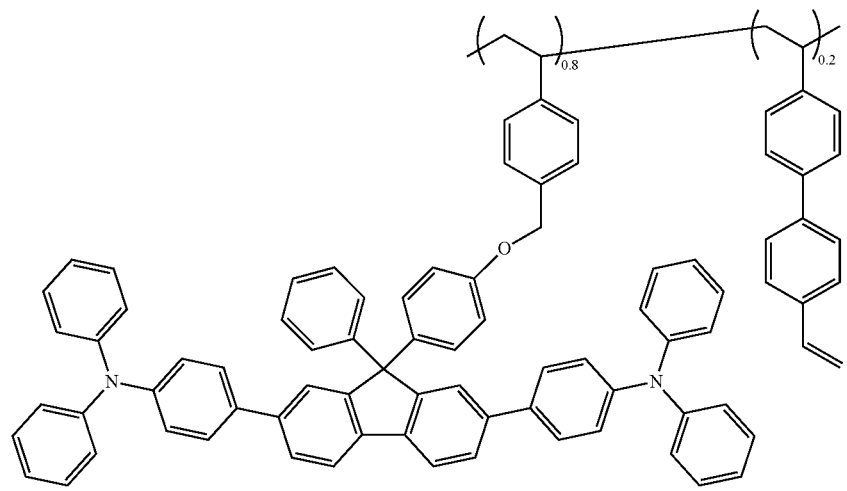
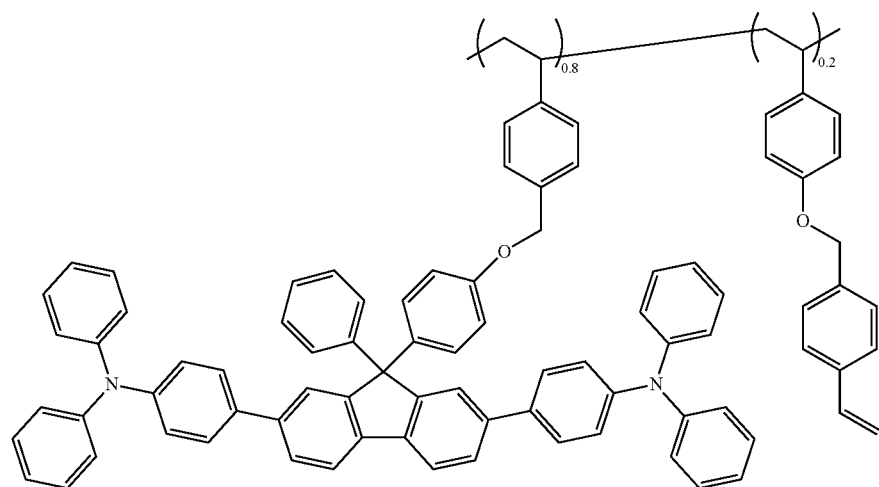
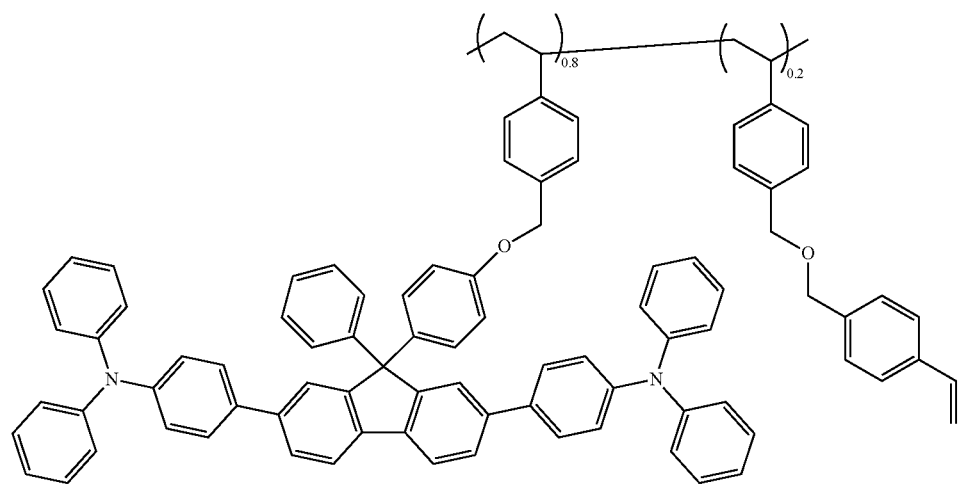

-continued
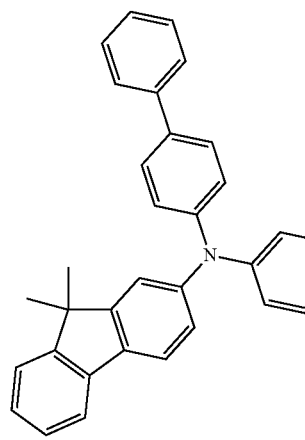
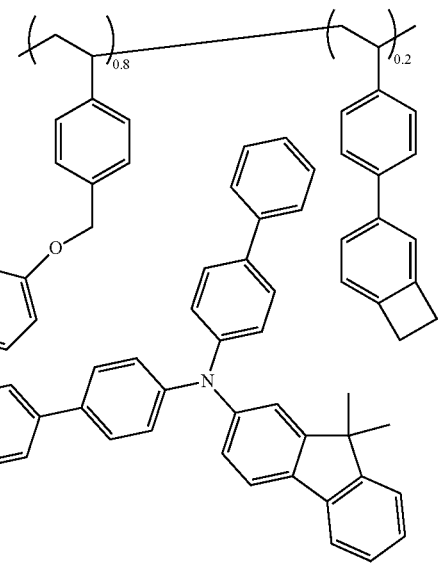
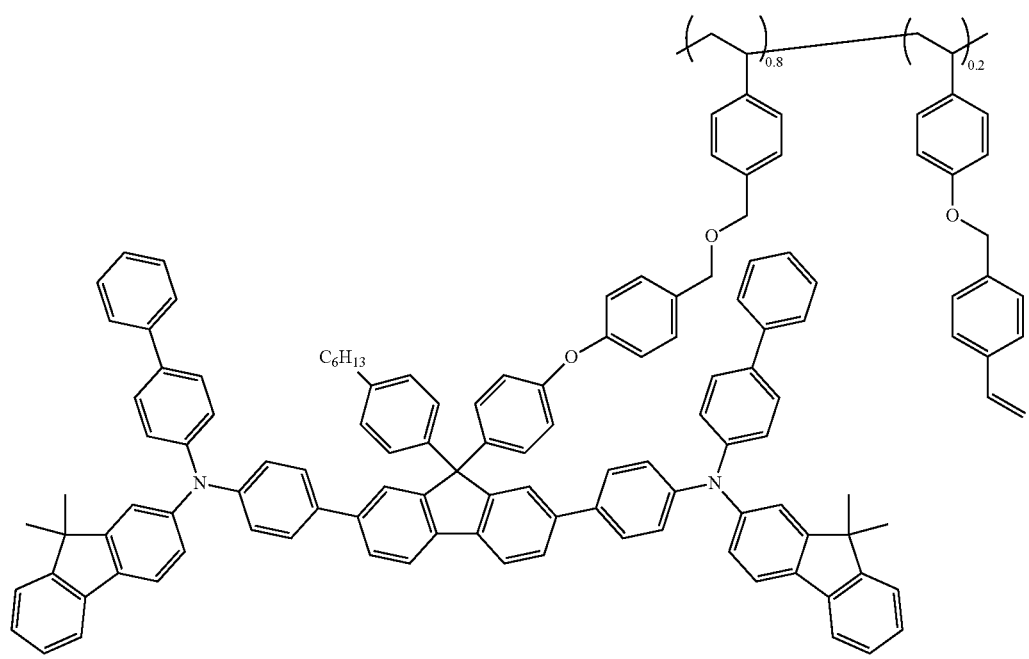

-continued
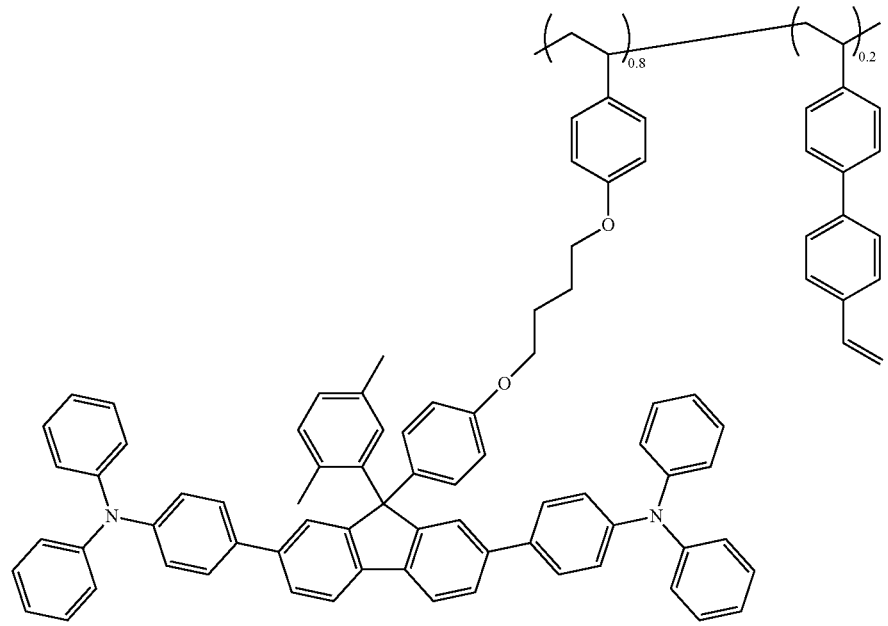
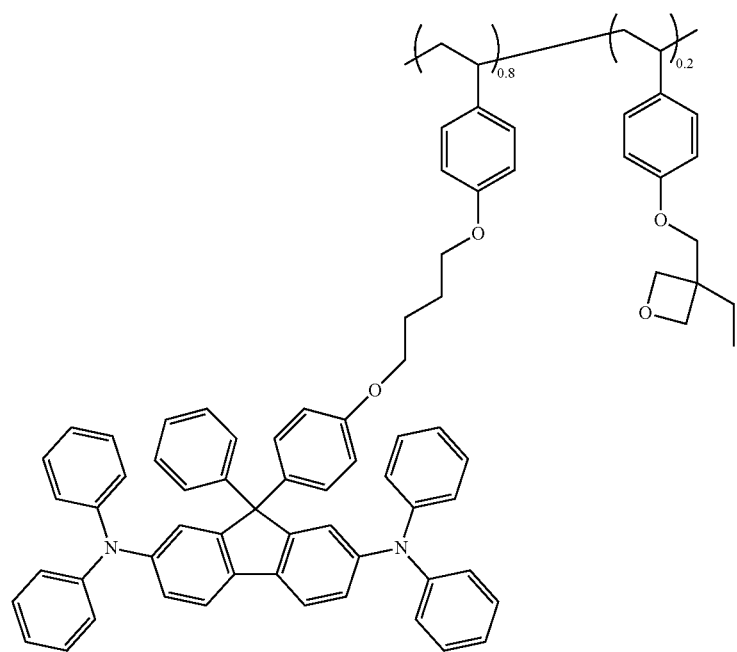

-continued
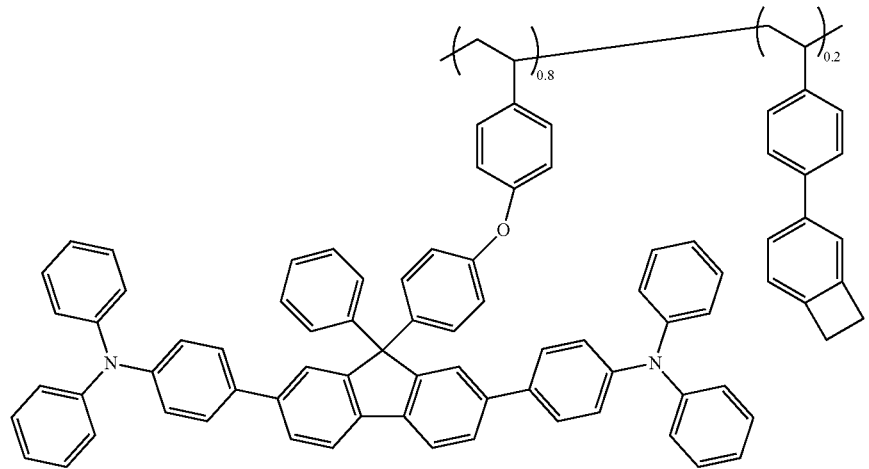
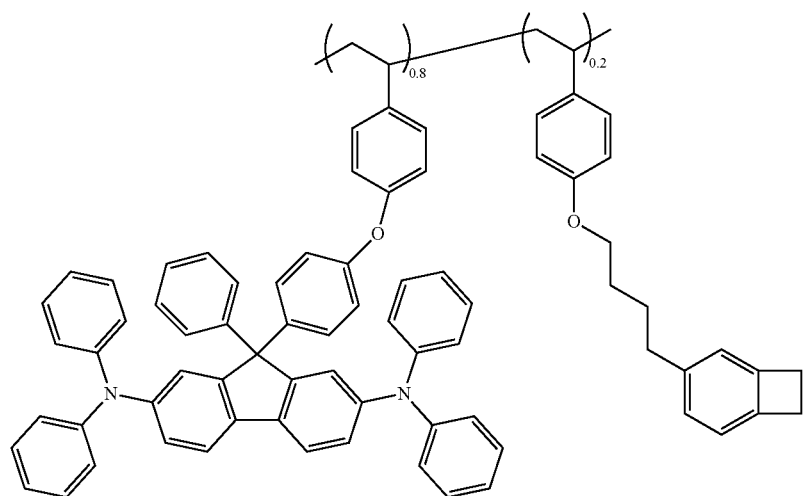
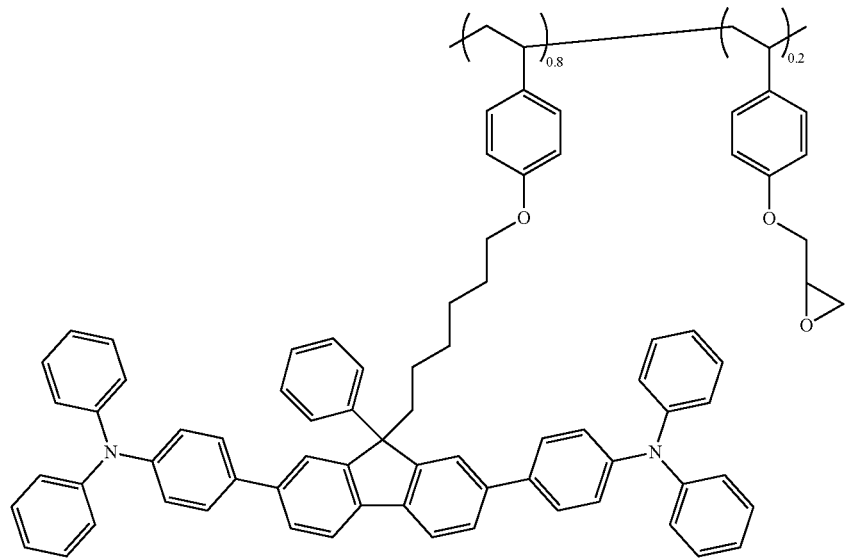

-continued
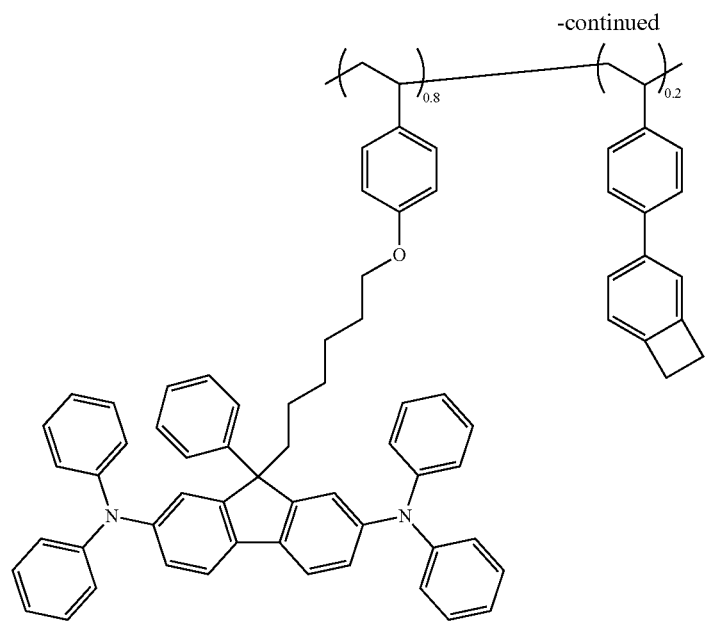
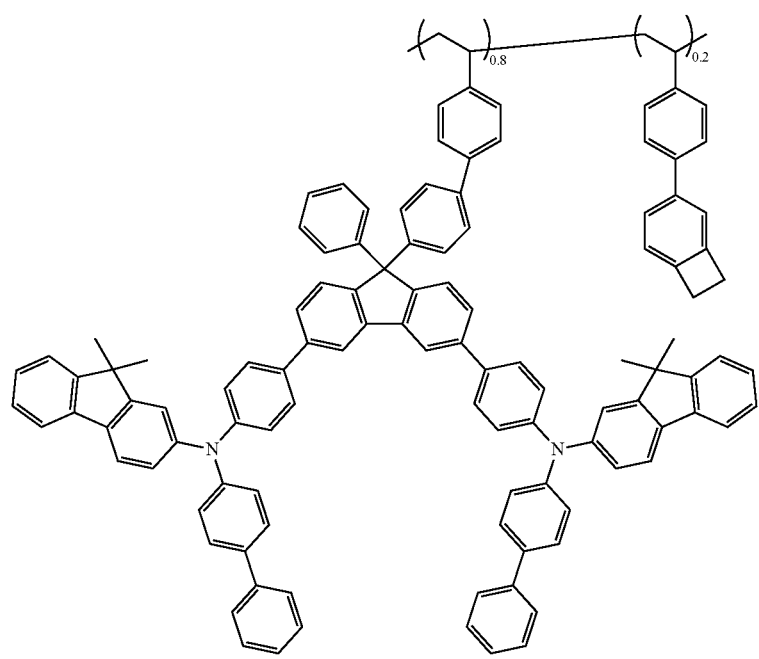

-continued
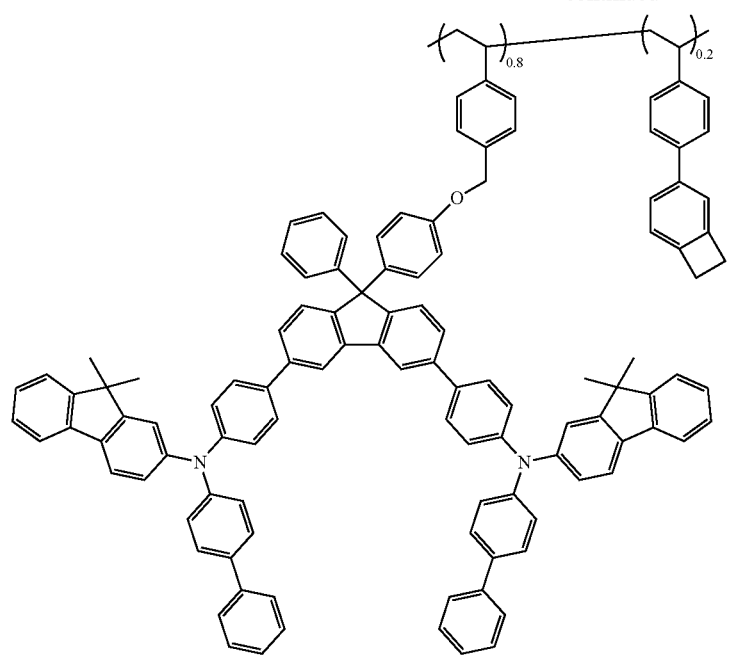
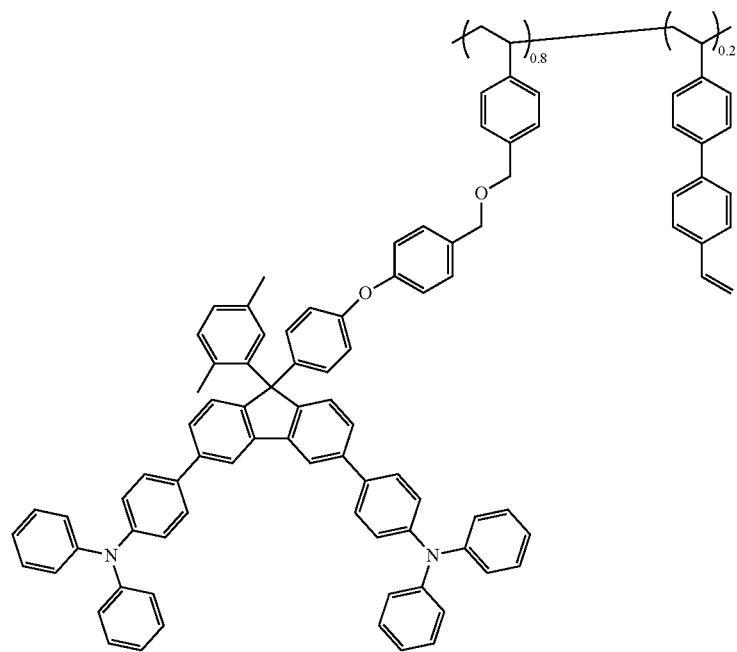

-continued
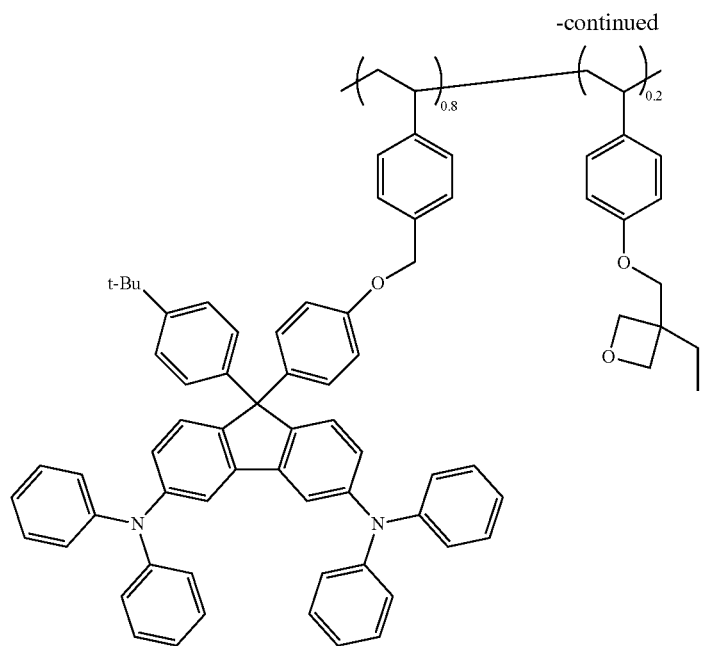
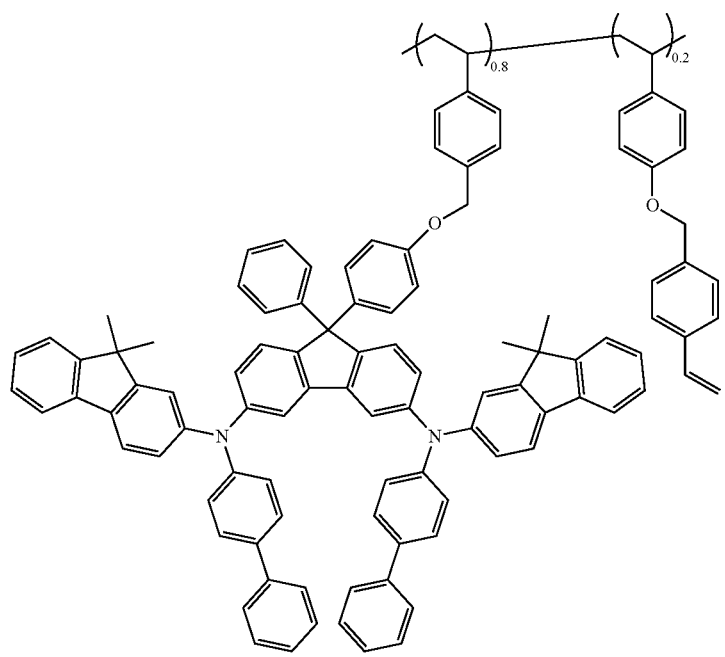

-continued

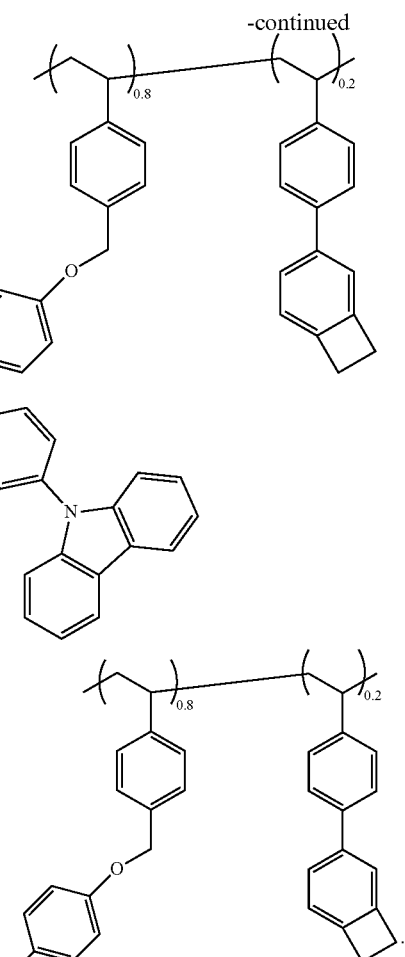

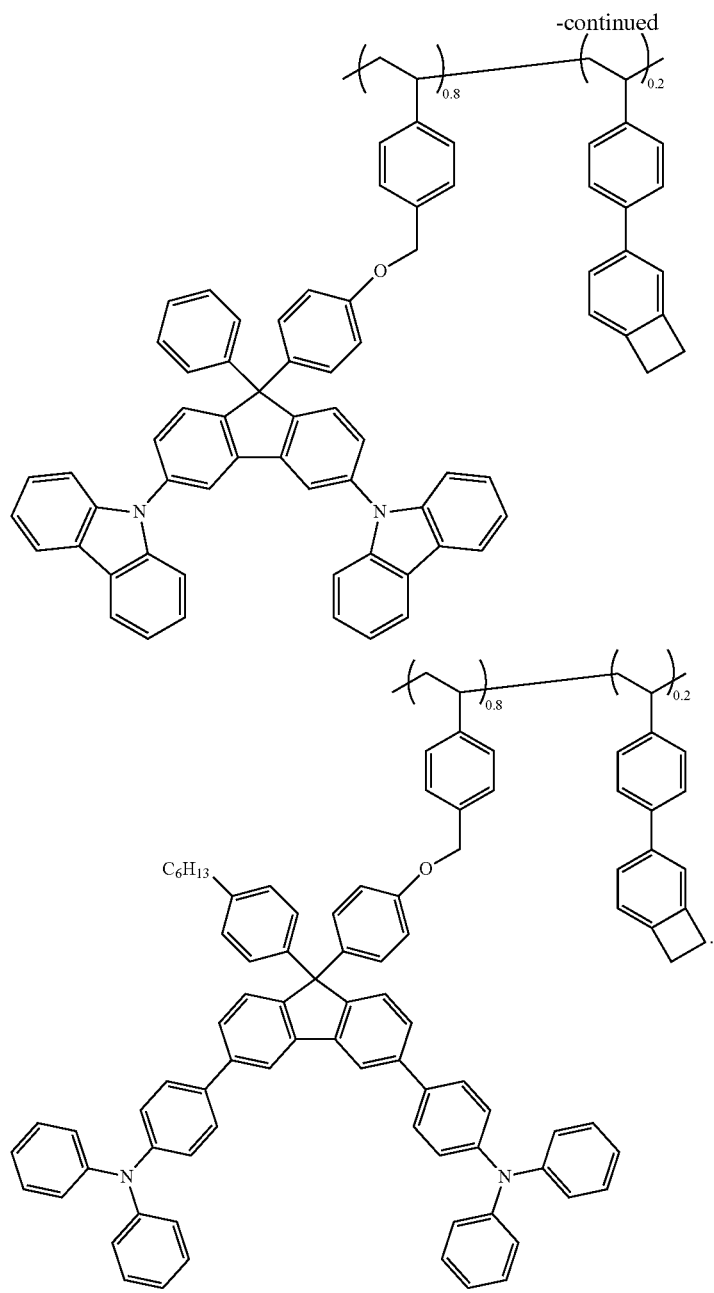

11. A coating composition comprising the polymer of claim 1.

12. The coating composition of claim 11, which is for an organic light emitting device.

13. An organic light emitting device comprising:
a first electrode;
a second electrode provided opposite to the first electrode; and
at least one organic material layers provided between the first electrode and the second electrode,
wherein the at least one organic material layer includes a cured material of the coating composition of claim 11.

14. The organic light emitting device of claim 13, wherein the cured material of the coating composition is in a cured state by heat treating or light treating the coating composition.

15. The organic light emitting device of claim 13, wherein the at least one organic material layer including the cured material of the coating composition is a hole transfer layer, a hole injection layer, or a layer carrying out hole transfer and hole injection at the same time.

16. The organic light emitting device of claim 15, wherein the coating composition further includes a p-doping material.

17. The organic light emitting device of claim 16, wherein the p-doping material includes $F_4TCNQ$; or a boron anion.

18. The polymer of claim 7, wherein R and R' are the same as or different from each other, and each independently a methylene group; an ethylene group; a propylene group; a butylene group; a pentylene group; or a hexylene group.

19. The polymer of claim 1, wherein the curing group is
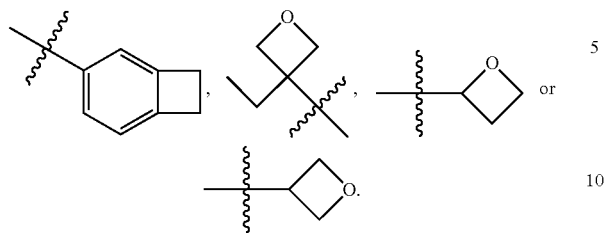
20. The coating composition of claim 11, wherein the polymer including the unit represented by Chemical Formula 1 and the unit represented by Chemical Formula 2 in the coating composition has a concentration of 0.1 wt/v % to 20 wt/v %.
* * * * *